United States Patent
Nishiguchi et al.

(10) Patent No.: US 6,611,800 B1
(45) Date of Patent: Aug. 26, 2003

(54) VECTOR QUANTIZATION METHOD AND SPEECH ENCODING METHOD AND APPARATUS

(75) Inventors: Masayuki Nishiguchi, Kanagawa (JP); Kazuyuki Iijima, Saitama (JP); Jun Matsumoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 08/927,534

(22) Filed: Sep. 11, 1997

(30) Foreign Application Priority Data

Sep. 24, 1996 (JP) .............................................. 8-251614

(51) Int. Cl.[7] .......................... G10L 19/12; G10L 19/14
(52) U.S. Cl. ...................................... 704/221; 704/222
(58) Field of Search .................................. 704/205, 206, 704/219, 221, 222, 223, 224, 230, 203, 204

(56) References Cited

U.S. PATENT DOCUMENTS

| | | | |
|---|---|---|---|
| 5,307,441 A | | 4/1994 | Tzeng .......................... 704/222 |
| 5,451,951 A | * | 9/1995 | Elliott et al. ................. 704/219 |
| 5,677,986 A | * | 10/1997 | Amada et al. ............... 704/222 |
| 5,774,838 A | * | 6/1998 | Miseki et al. ............... 704/222 |
| 5,778,335 A | * | 7/1998 | Ubale et al. ................. 704/223 |
| 5,819,213 A | * | 10/1998 | Oshikiri et al. ............. 704/222 |
| 5,890,110 A | * | 3/1999 | Gersho et al. ............... 704/222 |
| 5,926,788 A | * | 7/1999 | Nishiguchi ................... 704/220 |
| 5,950,155 A | * | 9/1999 | Nishiguchi ................... 704/230 |
| 5,960,386 A | * | 9/1999 | Janiszewski et al. ........ 704/207 |
| 6,003,001 A | * | 12/1999 | Maeda ......................... 704/219 |
| 6,018,707 A | * | 1/2000 | Nishiguchi et al. .......... 704/222 |

FOREIGN PATENT DOCUMENTS

EP          0770989         10/1996    ............. G10L/9/14

OTHER PUBLICATIONS

Trancoso et al., "High Quality Mid–Rate Speech Coding," Electrotechnical Conference, 1989. Proceedings. 'Integrated Research, Industry and Education in Energy and Communication Engineering,' MELECON '89., Mediterranean, pp. 217–220, Apr. 1989.*

Nagaratnam et al., "Spectral Magnitude Modelling for Sinusoidal Coding," 1995 IEEE Workshop on Speech Coding for Telecommunications, pp. 81–82, Sep. 1995.*

Das et al., "Variable–dimension vector quantization of speech spectra for low–rate vocoders," DCC '94 Proceedings, Data Compression Conference, Mar. 1994, pp. 420 to 429.*

Akitoshi Kataoka, et al., "An 8–kbit/s Speech Coder Based On Conjugate Structure CELP," IEEE, Apr. 27, 1993.

Masayuki Nishiguchi, et al., Harmonic and Noise Coding of LPC Residuals With Classified Vector Quantization, IEEE, May 9, 1995.

M. Elshafei, et al., "Fast Methods for Code Search in CELP," IEEE, Jul., 1993.

* cited by examiner

Primary Examiner—Marsha D. Banks-Harold
Assistant Examiner—Martin Lerner
(74) Attorney, Agent, or Firm—Jay H. Maioli

(57) ABSTRACT

The processing volume for codebook search for vector quantization is diminished by sending data representing an envelope of spectral components of the harmonics from a spectrum evaluation unit 148 of a sinusoidal analytic encoder 114 to a vector quantizer 116 for vector quantization, so that the degree of similarity between an input vector and all code vectors stored in the codebook is found by approximation for pre-selecting a smaller number of code vectors. From these pre-selected code vectors, such a code vector minimizing an error with respect to the input vector is ultimately selected. In this manner, a smaller number of candidate code vectors are pre-selected by pre-selection involving simplified processing and subsequently subjected to ultimate selection with high precision.

7 Claims, 28 Drawing Sheets

| | 2Kbps | 6Kbps |
|---|---|---|
| V/UV DECISION OUTPUT | 1bit / 20msec | 1bit / 20msec |
| LSP QUANTIZATION INDEX | 32bits / 40msec | 48bits / 40msec |
| FOR VOICED SOUND (V) | PITCH DATA 8bits / 20msec | PITCH DATA 8bits / 20msec |
| | INDEX 15bits / 20msec | INDEX 87bits / 20msec |
| | SHAPE (FIRST STAGE) 5+5bits / 20msec | SHAPE (FIRST STAGE) 5+5bits / 20msec |
| | GAIN 5bits / 20msec | GAIN 5bits / 20msec |
| | | INDEX (SECOND STAGE) 72bits / 20msec |
| FOR UNVOICED SOUND (UV) | INDEX 11bits / 10msec | INDEX 23bits / 5msec |
| | SHAPE (FIRST STAGE) 7bits / 10msec | SHAPE (FIRST STAGE) 9bits / 5msec |
| | GAIN 4bits / 10msec | GAIN 6bits / 5msec |
| | | SHAPE (SECOND STAGE) 5bits / 5msec |
| | | GAIN 3bits / 5msec |
| FOR VOICED SOUND | 40bits / 20msec | 120bits / 20msec |
| FOR UNVOICED SOUND | 39bits / 20msec | 117bits / 20msec |

FIG.5

| QUANTIZED VALUE | NUMBER OF DIMENSIONS | NUMBER OF BITS (bits) |
|---|---|---|
| $\underline{y}_0$ | 4 | 10 |
| $\underline{y}_1$ | 4 | 10 |
| $\underline{y}_2$ | 4 | 10 |
| $\underline{y}_3$ | 4 | 10 |
| $\underline{y}_4$ | 4 | 9 |
| $\underline{y}_5$ | 8 | 8 |
| $\underline{y}_6$ | 8 | 8 |
| $\underline{y}_7$ | 8 | 7 |

FIG.11

| | Hv(z) | | Huv(z) | |
|---|---|---|---|---|
| | PREVIOUS FRAME | CURRENT FRAME | PREVIOUS FRAME | CURRENT FRAME |
| V → V | TRANSMITTED LSP | TRANSMITTED LSP | EQUAL DISTANCE LSP | EQUAL DISTANCE LSP |
| V → UV | TRANSMITTED LSP | EQUAL DISTANCE LSP | EQUAL DISTANCE LSP | TRANSMITTED LSP |
| UV → V | EQUAL DISTANCE LSP | TRANSMITTED LSP | TRANSMITTED LSP | EQUAL DISTANCE LSP |
| UV → UV | EQUAL DISTANCE LSP | EQUAL DISTANCE LSP | TRANSMITTED LSP | TRANSMITTED LSP |

FIG.22

VECTOR QUANTIZATION METHOD AND SPEECH ENCODING METHOD AND APPARATUS

BACKGROUND OF THE INVENTION

1. Field of the Invention

This invention relates to a vector quantization method in which an input vector is compared to code vectors stored in a codebook for outputting an index of an optimum one of the code vectors. The present invention also relates to a speech encoding method and apparatus in which an input speech signal is divided in terms of a pre-set encoding unit, such as a block or a frame, and encoding processing including vector quantization is carried out on the encoding unit basis.

2. Description of the Related Art

There has hitherto been known vector quantization in which, for digitizing and compression-encoding audio or video signals, a plurality of input data are grouped together into a vector for representation as a sole code (index).

In such vector quantization, representative patterns of a variety of input vectors are previously determined by, for example, learning, and given codes or indices, which are then stored in a codebook. The input vector is then compared to the respective patterns (code vectors) by way of pattern matching for outputting the code of the pattern bearing the strongest similarity or correlation. This similarity or correlation is found by calculating the distortion measure or an error energy between the input vector and the respective code vectors and becomes higher as the distortion or error becomes smaller.

There have hitherto been known a variety of encoding methods exploiting statistic properties in the time domain or frequency domain and psychoacoustic properties of the human being in signal compression. This encoding method is roughly classified into encoding in the time domain, encoding in the frequency domain and analysis-by-synthesis encoding.

Among examples of high-efficiency encoding of a speech signal, there are sinusoidal wave analytic encoding, such as a harmonic encoding, a sub-band coding (SBC), linear predictive coding (LPC), discrete cosine transform (DCT), modified DCT (MDCT) or fast Fourier transform (FFT).

In high-efficiency encoding of the speech signals, the above-mentioned vector quantization is used for parameters such as spectral components of the harmonics.

Meanwhile, if the number of the patterns stored in the codebook, that is the number of the code vectors, is large, or if the vector quantizer is of a multi-stage configuration made up of plural codebooks, combined together, the number of times of code vector search operations for pattern matching is increased to increase the processing volume. In particular, if plural codebooks are combined together, processing for finding the similarity of the number of multiplications of the number of code vectors in the codebooks becomes necessary, thereby increasing the codebook search processing volume significantly.

SUMMARY OF THE INVENTION

It is therefore an object of the present invention to provide a vector quantization method, a speech encoding method and a speech encoding apparatus capable of suppressing the codebook search processing volume.

For accomplishing the above object, the present invention provides a vector quantization method including a step of finding the degree of similarity between an input vector to be vector quantized and all code vectors stored in a codebook by approximation for pre-selecting plural code vectors bearing a high degree of similarity and a step of ultimately selecting one of the plural pre-selected code vectors that minimizes an error with respect to the input vector.

By executing ultimate selection after the pre-selection, a smaller number of candidate code vectors are selected by pre-selection involving simplified processing and subjected to ultimate selection of high precision to reduce the processing volume for codebook searching.

The codebook is constituted by plural codebooks from each of which can be selected plural code vectors representing an optimum combination. The degree of similarity may be an inner product of the input vector and the code vector, optionally divided by a norm or a weighted norm of each code vector.

The present invention also provides a speech encoding method in which an input speech signal or short-term prediction residuals thereof are analyzed by sinusoidal analysis to find spectral components of the harmonics and in which parameters derived from the encoding-unit-based spectral components of the harmonics, as the input vector, are vector quantized for encoding. In the vector quantization, the degree of similarity between the input vector and all code vectors stored in a codebook is found by approximation for pre-selecting a smaller plural number of the code vectors having a high degree of similarity, and one of these pre-selected code vectors which minimizes an error with respect to the input vector is selected ultimately.

The degree of similarity may be an optionally weighted inner product between the input vector and the code vector optionally divided by a norm or a weighted norm of each code vector. For weighting the norm, a weight having a concentrated energy towards the low frequency range and a decreasing energy towards the high frequency range may be used. Thus, the degree of similarity can be found by dividing the weighted inner product of the code vector by the weighted code vector norm.

The present invention is also directed to a speech encoding device for carrying out the speech encoding method.

BRIEF DESCRIPTION OF THE DRAWINGS

FIG. 5 is a table showing bit rates of the speech signal encoding device.

FIG. 11 is a table showing the relation between the quantization values, number of dimensions and the numbers of bits.

FIG. 22 is a table showing the state of LSP switching depending on the U/UV transitions.

DETAILED DESCRIPTION OF THE PREFERRED EMBODIMENTS

Figure 1:
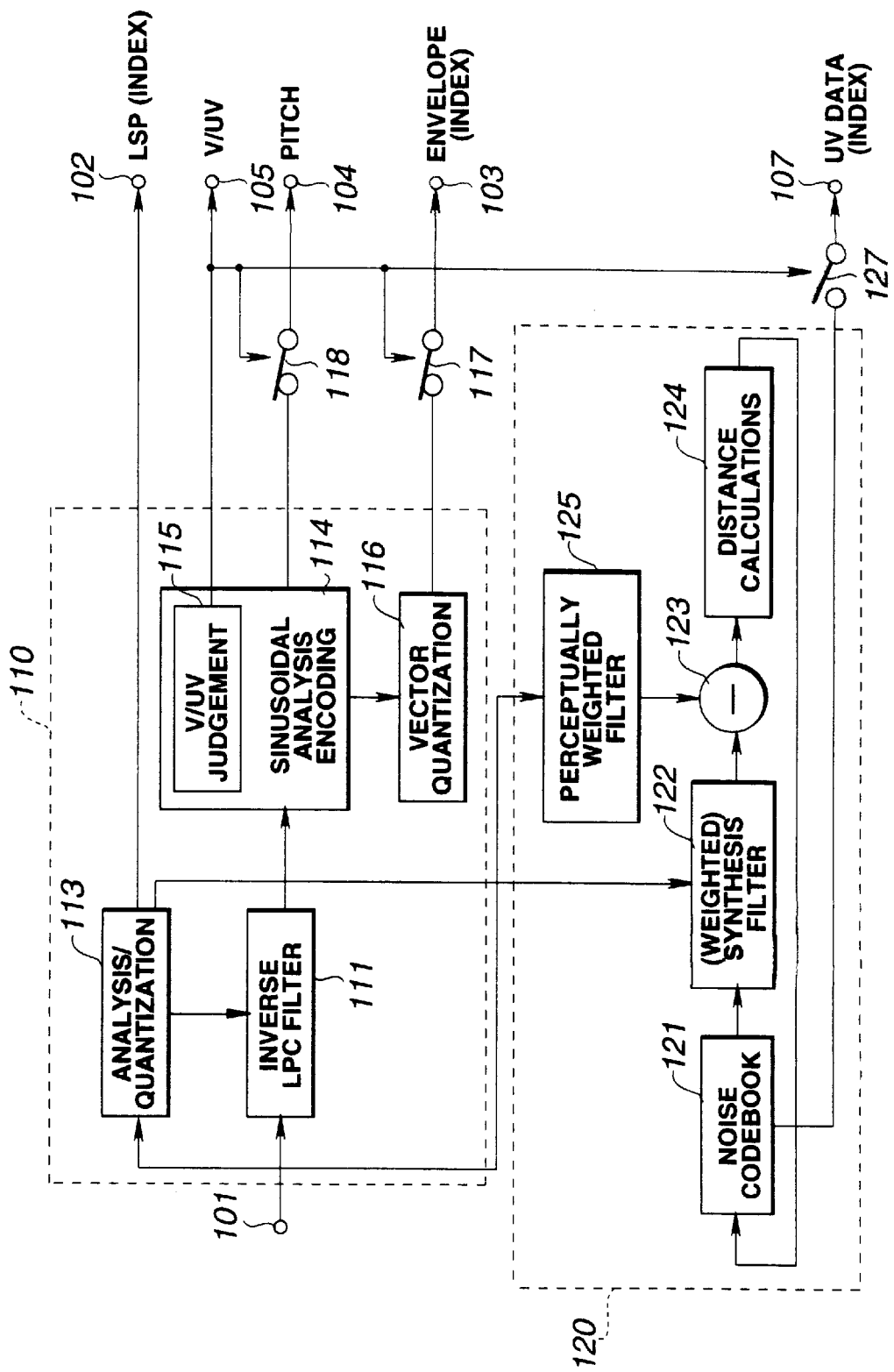
FIG. 1 is a block diagram showing a basic structure of a speech signal encoding apparatus (encoder) for carrying out the encoding method according to the present invention.

Referring to the drawings, preferred embodiments of the present invention will be explained in detail.

FIG. 1 shows the basic structure of an encoding apparatus (encoder) for carrying out a speech encoding method according to the present invention.

The basic concept underlying the speech signal encoder of FIG. 1 is that the encoder has a first encoding unit 110 for finding short-term prediction residuals, such as linear prediction encoding (LPC) residuals, of the input speech signal, in order to effect sinusoidal analysis, such as harmonic coding, and a second encoding unit 120 for encoding the input speech signal by waveform encoding having phase reproducibility, and that the first encoding unit 110 and the second encoding unit 120 are used for encoding the voiced (V) speech of the input signal and for encoding the unvoiced (UV) portion of the input signal, respectively.

The first encoding unit 110 employs a constitution of encoding, for example, the LPC residuals, with sinusoidal analytic encoding, such as harmonic encoding or multi-band excitation (MBE) encoding. The second encoding unit 120 employs a constitution of carrying out code excited linear prediction (CELP) using vector quantization by closed loop search of an optimum vector and also using, for example, an analysis by synthesis method.

In the embodiment shown in FIG. 1, the speech signal supplied to an input terminal 101 is sent to an LPC inverted filter 111 and an LPC analysis and quantization unit 113 of the first encoding unit 110. The LPC coefficients or the so-called α-parameters, obtained by an LPC analysis quantization unit 113, are sent to the LPC inverted filter 111 of the first encoding unit 110. From the LPC inverted filter 111 are taken out linear prediction residuals (LPC residuals) of the input speech signal. From the LPC analysis quantization unit 113, a quantized output of linear spectrum pairs (LSPs) are taken out and sent to an output terminal 102, as later explained. The LPC residuals from the LPC inverted filter 111 are sent to a sinusoidal analytic encoding unit 114. The sinusoidal analytic encoding unit 114 performs pitch detection and calculations of the amplitude of the spectral envelope as well as V/UV discrimination by a V/UV discrimination unit 115. The spectra envelope amplitude data from the sinusoidal analytic encoding unit 114 is sent to a vector quantization unit 116. The codebook index from the vector quantization unit 116, as a vector-quantized output of the spectral envelope, is sent via a switch 117 to an output terminal 103, while an output of the sinusoidal analytic encoding unit 114 is sent via a switch 118 to an output terminal 104. A V/UV discrimination output of the V/UV discrimination unit 115 is sent to an output terminal 105 and, as a control signal, to the switches 117, 118. If the input speech signal is a voiced (V) sound, the index and the pitch are selected and taken out at the output terminals 103, 104, respectively.

The second encoding unit 120 of FIG. 1 has, in the present embodiment, a code excited linear prediction coding (CELP coding) configuration and vector-quantizes the time-domain waveform using a closed loop search employing an analysis by synthesis method in which an output of a noise codebook 121 is synthesized by a weighted synthesis filter, the resulting weighted speech is sent to a subtractor 123, an error between the weighted speech and the speech signal supplied to the input terminal 101 and thence through a perceptually weighted filter 125 is taken out, the error thus found is sent to a distance calculation circuit 124 to effect distance calculations and a vector minimizing the error is searched by the noise codebook 121. This CELP encoding is used for encoding the unvoiced speech portion, as explained previously. The codebook index, as the UV data from the noise codebook 121, is taken out at an output terminal 107 via a switch 127 which is turned on when the result of the V/UV discrimination is unvoiced (UV).

Figure 2:
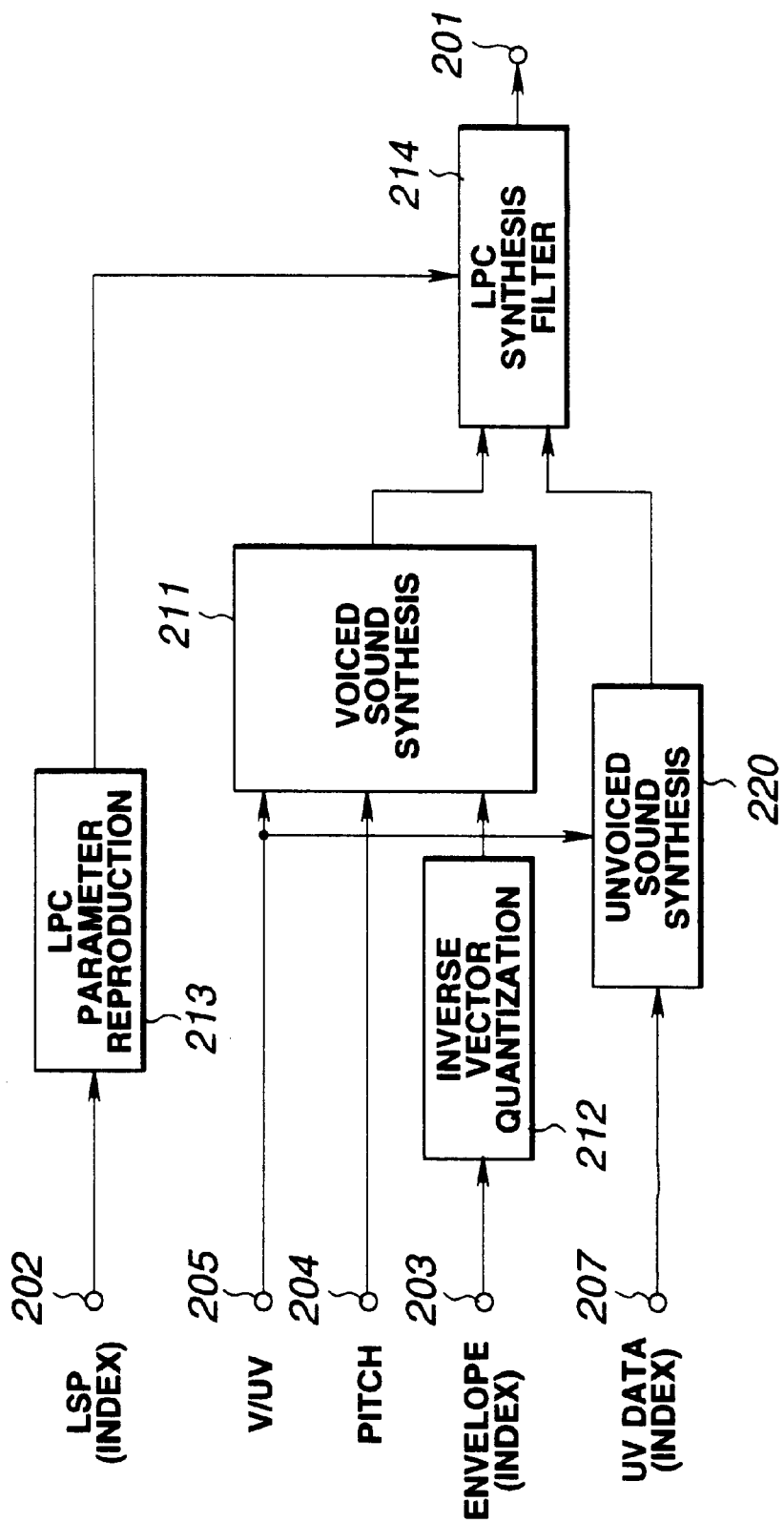
FIG. 2 is a block diagram showing a basic structure of a speech signal decoding apparatus (decoder) for carrying out the decoding method according to the present invention.

FIG. 2 is a block diagram showing the basic structure of a speech signal decoder, as a counterpart device of the speech signal encoder of FIG. 1, for carrying out the speech decoding method according to the present invention.

Referring to FIG. 2, a codebook index as a quantization output of the linear spectral pairs (LSPs) from the output terminal 102 of FIG. 1 is supplied to an input terminal 202. Outputs of the output terminals 103, 104 and 105 of FIG. 1, that is the pitch, V/UV discrimination output and the index data, as envelope quantization output data, are supplied to input terminals 203 to 205, respectively. The index data as data for the unvoiced data are supplied from the output terminal 107 of FIG. 1 to an input terminal 207.

The index as the envelope quantization output of the input terminal 203 is sent to an inverse vector quantization unit 212 for inverse vector quantization to find a spectral envelope of the LPC residues which is sent to a voiced speech synthesizer 211. The voiced speech synthesizer 211 synthesizes the linear prediction encoding (LPC) residuals of the voiced speech portion by sinusoidal synthesis. The synthesizer 211 is fed also with the pitch and the V/UV discrimination output from the input terminals 204, 205. The LPC residuals of the voiced speech from the voiced speech synthesis unit 211 are sent to an LPC synthesis filter 214. The index data of the UV data from the input terminal 207 is sent to an unvoiced sound synthesis unit 220 where reference is had to the noise codebook for taking out the LPC residuals of the unvoiced portion. These LPC residuals are also sent to the LPC synthesis filter 214. In the LPC synthesis filter 214, the LPC residuals of the voiced portion and the LPC residuals of the unvoiced, portion are processed by LPC synthesis. Alternatively, the LPC residuals of the voiced portion and the LPC residuals of the unvoiced portion summed together may be processed with LPC synthesis. The LSP index data from the input terminal 202 is sent to the LPC parameter reproducing unit 213 where α-parameters of the LPC are taken out and sent to the LPC synthesis filter 214. The speech signals synthesized by the LPC synthesis filter 214 are taken out at an output terminal 201.

Figure 3:
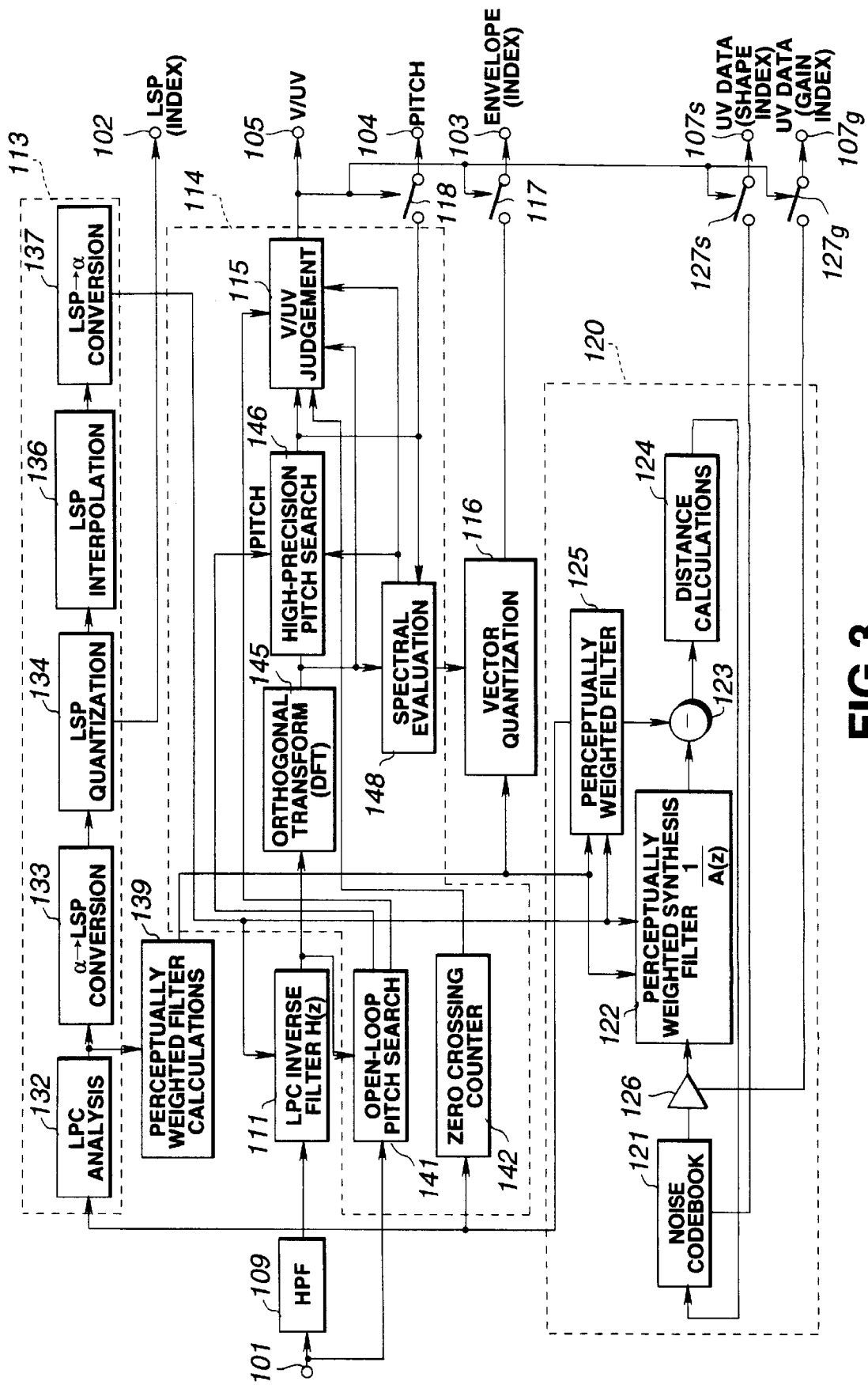
FIG. 3 is a block diagram showing a more specified structure of the speech signal encoder shown in FIG. 1.

Referring to FIG. 3, a more detailed structure of a speech signal encoder shown in FIG. 1 is now explained. In FIG. 3, the parts or components similar to those shown in FIG. 1 are denoted by the same reference numerals.

In the speech signal encoder shown in FIG. 3, the speech signals supplied to the input terminal 101 are filtered by a high-pass filter HPF 109 for removing signals of an unneeded range and thence supplied to an LPC (linear prediction encoding) analysis circuit 132 of the LPC analysis/quantization unit 113 and to the inverted LPC filter 111.

The LPC analysis circuit 132 of the LPC analysis/quantization unit 113 applies a Hamming window, with a length of the input signal waveform on the order of 256 samples as a block, and finds a linear prediction coefficient, that is a so-called α-parameter, by the autocorrelation method. The framing interval as a data outputting unit is set to approximately 160 samples. If the sampling frequency fs is 8 kHz, for example, a one-frame interval is 20 msec or 160 samples.

The α-parameter from the LPC analysis circuit 132 is sent to an α-LSP conversion circuit 133 for conversion into line spectrum pair (LSP) parameters. This converts the α-parameter, as found by direct type filter coefficient, into for example, ten, that is, five pairs of the LSP parameters. This conversion is carried out by, for example, the Newton-Rhapson method. The reason the α-parameters are converted into the LSP parameters is that the LSP parameter is superior in interpolation characteristics to the α-parameters.

The LSP parameters from the α-LSP conversion circuit 133 are matrix- or vector quantized by the LSP quantizer 134. It is possible to take a frame-to-frame difference prior to vector quantization, or to collect plural frames in order to perform matrix quantization. In the present case, two frames, each 20 msec long, of the LSP parameters, calculated every 20 msec, are handled together and processed with matrix quantization and vector quantization.

The quantized output of the quantizer 134, that is, the index data of the LSP quantization, are taken out at a terminal 102, while the quantized LSP vector is sent to an LSP interpolation circuit 136.

The LSP interpolation circuit 136 interpolates the LSP vectors, quantized every 20 msec or 40 msec, in order to provide an octatuple rate. That is, the LSP vector is updated every 2.5 msec. The reason is that, if the residual waveform is processed with the analysis/synthesis by the harmonic encoding/decoding method, the envelope of the synthetic waveform presents an extremely smooth waveform, so that, if the LPC coefficients are changed abruptly every 20 msec, a foreign noise is likely to be produced. That is, if the LPC coefficient is changed gradually every 2.5 msec, such foreign noise may be prevented from occurrence.

For inverted filtering of the input speech using the interpolated LSP vectors produced every 2.5 msec, the LSP parameters are converted by an LSP to α conversion circuit 137 into α-parameters, which are filter coefficients of e.g., ten-order direct type filter. An output of the LSP to α conversion circuit 137 is sent to the LPC inverted filter circuit 111 which then performs inverse filtering for producing a smooth output using an α-parameter updated every 2.5 msec. An output of the inverse LPC filter 111 is sent to an orthogonal transform circuit 145, such as a DCT circuit, of the sinusoidal analysis encoding unit 114, such as a harmonic encoding circuit.

The α-parameter from the LPC analysis circuit 132 of the LPC analysis/quantization unit 113 is sent to a perceptual weighting filter calculating circuit 139 where data for perceptual weighting is found. These weighting data are sent to a perceptual weighting vector quantizer 116, perceptual weighting filter 125 and the perceptual weighted synthesis filter 122 of the second encoding unit 120.

The sinusoidal analysis encoding unit 114 of the harmonic encoding circuit analyzes the output of the inverted LPC filter 111 by a method of harmonic encoding. That is, pitch detection, calculations of the amplitudes Am of the respective harmonics and voiced (V)/unvoiced (UV) discrimination, are carried out and the numbers of the amplitudes Am or the envelopes of the respective harmonics, varied with the pitch, are made constant by dimensional conversion.

In an illustrative example of the sinusoidal analysis encoding unit 114 shown in FIG. 3, commonplace harmonic encoding is used. In particular, in multi-band excitation (MBE) encoding, it is assumed in modeling that voiced portions and unvoiced portions are present in each frequency area or band at the same time point (in the same block or frame). In other harmonic encoding techniques, it is uniquely judged whether the speech in one block or in one frame is voiced or unvoiced. In the following description, a given frame is judged to be UV if the totality of the bands is UV, insofar as the MBE encoding is concerned. Specified examples of the technique of the analysis synthesis method for MBE as described above may be found in JP Patent Application No. 4-91442 filed in the name of the Assignee of the present Application.

The open-loop pitch search unit 141 and the zero-crossing counter 142 of the sinusoidal analysis encoding unit 114 of FIG. 3 is fed with the input speech signal from the input terminal 101 and with the signal from the high-pass filter (HPF) 109, respectively. The orthogonal transform circuit 145 of the sinusoidal analysis encoding unit 114 is supplied with LPC residuals or linear prediction residuals from the inverted LPC filter 111. The open loop pitch search unit 141 takes the LPC residuals of the input signals to perform relatively rough pitch search by open loop search. The extracted rough pitch data is sent to a fine pitch search unit 146 by closed loop search as later explained. From the open loop pitch search unit 141, the maximum value of the normalized self correlation r(p), obtained by normalizing the maximum value of the autocorrelation of the LPC residuals along with the rough pitch data, are taken out along with the rough pitch data so as to be sent to the V/UV discrimination unit 115.

The orthogonal transform circuit 145 performs orthogonal transform, such as discrete Fourier transform (DFT), for converting the LPC residuals on the time axis into spectral amplitude data on the frequency axis. An output of the orthogonal transform circuit 145 is sent to the fine pitch search unit 146 and a spectral evaluation unit 148 configured for evaluating the spectral amplitude or envelope.

The fine pitch search unit 146 is fed with relatively rough pitch data extracted by the open loop pitch search unit 141 and with frequency-domain data obtained by DFT by the orthogonal transform unit 145. The fine pitch search unit 146 swings the pitch data by±several samples, at a rate of 0.2 to 0.5, centered about the rough pitch value data, in order to arrive ultimately at the value of the fine pitch data having an optimum decimal point (floating point). The analysis by synthesis method is used as the fine search technique for selecting a pitch so that the power spectrum will be closest to the power spectrum of the original sound. Pitch data from the closed-loop fine pitch search unit 146 is sent to an output terminal 104 via a switch 118.

In the spectral evaluation unit 148, the amplitude of each harmonics and the spectral envelope as the sum of the harmonics are evaluated based on the spectral amplitude and the pitch as the orthogonal transform output of the LPC residuals, and sent to the fine pitch search unit 146, V/UV discrimination unit 115 and to the perceptually weighted vector quantization unit 116.

The V/UV discrimination unit 115 discriminates V/UV of a frame based on an output of the orthogonal transform circuit 145, an optimum pitch from the fine pitch search unit 146, spectral amplitude data from the spectral evaluation unit 148, maximum value of the normalized autocorrelation r(p) from the open loop pitch search unit 141 and the zero-crossing count value from the zero-crossing counter 142. In addition, the boundary position of the band-based V/UV discrimination for the MBE may also be used as a condition for V/UV discrimination. A discrimination output of the V/UV discrimination unit 115 is taken out at an output terminal 105.

An output unit of the spectrum evaluation unit 148 or an input unit of the vector quantization unit 116 is provided with a number of data conversion unit (a unit performing a sort of sampling rate conversion), not shown. The number of data conversion unit is used for setting the amplitude data |Am| of an envelope to a constant value in consideration that the number of bands split on the frequency axis and the number of data differ with the pitch. That is, if the effective band is up to 3400 kHz, the effective band can be split into 8 to 63 bands depending on the pitch. The number of mMX+1 of the amplitude data |Am|, obtained from band to band, is changed in a range from 8 to 63. Thus the data number conversion unit converts the amplitude data of the variable number mMx+1 to a pre-set number M of data, such as 44.

The amplitude data or envelope data of the pre-set number M, such as 44, from the data number conversion unit, provided at an output unit of the spectral evaluation unit 148 or at an input unit of the vector quantization unit 116, are handled together in terms of a pre-set number of data, such as 44, as a unit, by the vector quantization unit 116, by way of perfonning weighted vector quantization. This weight is supplied by an output of the perceptual weighting filter calculation circuit 139. The index of the envelope from the vector quantizer 116 is taken out by a switch 117 at an output terminal 103. Prior to weighted vector quantization, it is advisable to take inter-frame difference using a suitable leakage coefficient for a vector made up of a pre-set number of data.

The second encoding unit 120 is explained. The second encoding unit 120 has a so-called CELP encoding structure and is used in particular for encoding the unvoiced portion of the input speech signal. In the CELP encoding structure for the unvoiced portion of the input speech signal, a noise output, corresponding to the LPC residuals of the unvoiced sound, as a representative output value of the noise codebook, or a so-called stochastic codebook 121, is sent via a gain control circuit 126 to a perceptually weighted synthesis filter 122. The weighted synthesis filter 122 LPC synthesizes the input noise by LPC synthesis and sends the produced weighted unvoiced signal to the subtractor 123. The subtractor 123 is fed with a signal supplied from the input terminal 101 via a high-pass filter (HPF) 109 and perceptually weighted by a perceptual weighting filter 125. The subtractor finds the difference or error between the signal and the signal from the synthesis filter 122. Meanwhile, a zero input response of the perceptually weighted synthesis filter is previously subtracted from an output of the perceptual weighting filter 125. This error is fed to a distance calculation circuit 124 for calculating the distance. A representative vector value which will minimize the error is searched in the noise codebook 121. The above is the summary of the vector quantization of the time-domain waveform employing the closed-loop search by the analysis by synthesis method.

As data for the unvoiced (UV) portion from the second encoder 120 employing the CELP coding structure, the shape index of the codebook from the noise codebook 121 and the gain index of the codebook from the gain circuit 126 are taken out. The shape index, which is the UV data from the noise codebook 121, is sent to an output terminal 107s via a switch 127s, while the gain index, which is the UV data of the gain circuit 126, is sent to an output terminal 107g via a switch 127g.

These switches 127s, 127g and the switches 117, 118 are turned on and off depending on the results of V/UV decision from the V/UV discrimination unit 115. Specifically, the switches 117, 118 are turned on, if the results of V/UV discrimination of the speech signal of the frame currently transmitted indicates voiced (V), while the switches 127s, 127g are turned on if the speech signal of the frame currently transmitted is unvoiced (UV).

Figure 4:
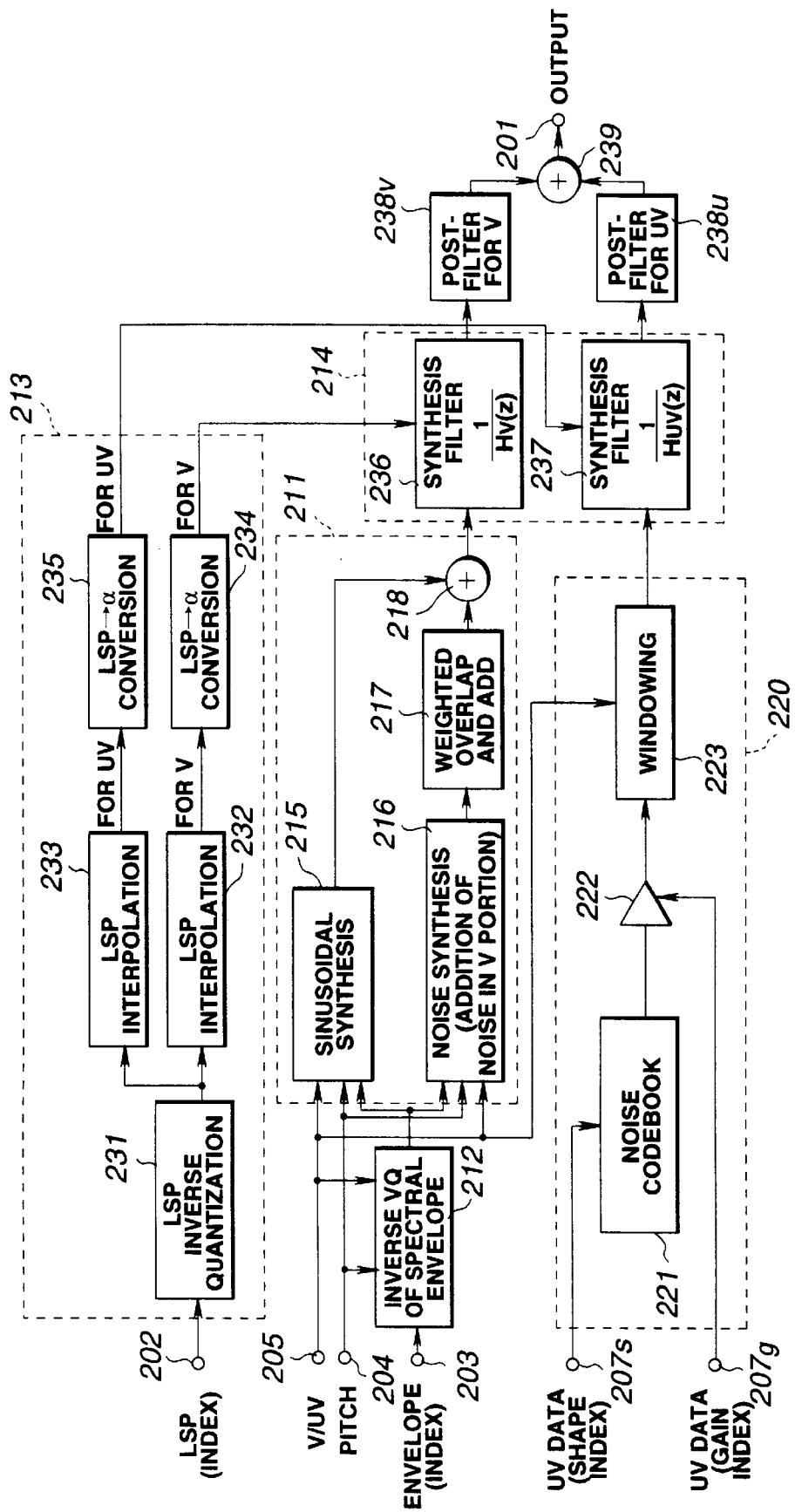
FIG. 4 is a block diagram showing a more detailed structure of the speech signal decoder shown in FIG. 2.

FIG. 4 shows a more detailed structure of a speech signal decoder shown in FIG. 2. In FIG. 4, the same numerals are used to denote the opponents shown in FIG. 2.

In FIG. 4, a vector quantization output of the LSPs corresponding to the output terminal 102 of FIGS. 1 and 3, that is the codebook index, is supplied to an input terminal 202.

The LSP index is sent to the inverted vector quantizer 231 of the LSP for the LPC parameter reproducing unit 213 so as to be inverse vector quantized to line spectral pair (LSP) data which are then supplied to LSP interpolation circuits 232, 233 for interpolation. The resulting interpolated data is converted by the LSP to α conversion circuits 234, 235 to α parameters which are sent to the LPC synthesis filter 214. The LSP interpolation circuit 232 and the LSP to α conversion circuit 234 are designed for voiced (V) sound, while the LSP interpolation circuit 233 and the LSP to α conversion circuit 235 are designed for unvoiced (UV) sound. The LPC synthesis filter 214 is made up of the LPC synthesis filter 236 of the voiced speech portion and the LPC synthesis filter 237 of the unvoiced speech portion. That is, LPC coefficient interpolation is carried out independently for the voiced speech portion and the unvoiced speech portion for prohibiting ill effects which might otherwise be produced in the transient portion from the voiced speech portion to the unvoiced speech portion or vice versa by interpolation of the LSPs of totally different properties.

To an input terminal 203 of FIG. 4 is supplied code index data corresponding to the weighted vector quantized spectral envelope Am corresponding to the output of the terminal 103 of the encoder of FIGS. 1 and 3. To an input terminal 204 is supplied pitch data from the terminal 104 of FIGS. 1 and 3 and to an input terminal 205 is supplied V/UV discrimination data from the terminal 105 of FIGS. 1 and 3.

The vector-quantized index data of the spectral envelope Am from the input terminal 203 is sent to an inverted vector quantizer 212 for inverse vector quantization where a conversion inverted from the data number conversion is carried out. The resulting spectral envelope data is sent to a sinusoidal synthesis circuit 215.

If the inter-frame difference is found prior to vector quantization of the spectrum during encoding, inter-frame difference is decoded after inverse vector quantization for producing the spectral envelope data.

The sinusoidal synthesis circuit 215 is fed with the pitch from the input terminal 204 and the V/UV discrimination data from the input terminal 205. From the sinusoidal synthesis circuit 215, LPC residual data corresponding to the output of the LPC inverse filter 111 shown in FIGS. 1 and 3 are taken out and sent to an adder 218. The specified technique of the sinusoidal synthesis is disclosed in, for example, JP Patent Application Nos. 4-91442 and 6-198451 proposed by the present Assignee.

The envelop data of the inverse vector quantizer 212 and the pitch and the V/UV discrimination data from the input terminals 204, 205 are sent to a noise synthesis circuit 216 configured for noise addition for the voiced portion (V). An output of the noise synthesis circuit 216 is sent to an adder 218 via a weighted overlap-and-add circuit 217. Specifically, the noise is added to the voiced portion of the LPC residual signals in consideration that, if the excitation as an input to the LPC synthesis filter of the voiced sound is produced by sine wave synthesis, a stuffed feeling is produced in the low-pitch sound, such as male speech, and the sound quality is abruptly changed between the voiced sound and the unvoiced sound, thus producing an unnatural hearing feeling. Such noise takes into account the parameters concerned with speech encoding data, such as pitch, amplitudes of the spectral envelope, maximum amplitude in a frame or the residual signal level, in connection with the LPC synthesis filter input of the voiced speech portion, that is excitation.

A sum output of the adder 218 is sent to a synthesis filter 236 for the voiced sound of the LPC synthesis filter 214 where LPC synthesis is carried out to form time waveform data which then is filtered by a post-filter 238v for the voiced speech and sent to the adder 239.

The shape index and the gain index, as UV data from the output terminals 107s and 107g of FIG. 3, are supplied to the input terminals 207s and 207g of FIG. 4, respectively, and thence supplied to the unvoiced speech synthesis unit 220. The shape index from the terminal 207s is sent to the noise codebook 221 of the unvoiced speech synthesis unit 220, while the gain index from the terminal 207g is sent to the gain circuit 222. The representative value output read out from the noise codebook 221 is a noise signal component corresponding to the LPC residuals of the unvoiced speech. This becomes a pre-set gain amplitude in the gain circuit 222 and is sent to a windowing circuit 223 so as to be windowed for smoothing the junction to the voiced speech portion.

An output of the windowing circuit 223 is sent to a synthesis filter 237 for the unvoiced (UV) speech of the LPC synthesis filter 214. The data sent to the synthesis filter 237 is processed with LPC synthesis to become time waveform data for the unvoiced portion. The time waveform data of the unvoiced portion is filtered by a post-filter for the unvoiced portion 238u before being sent to an adder 239.

In the adder 239, the time waveform signal from the post-filter for the voiced speech 238v and the time waveform data for the unvoiced speech portion from the post-filter 238u for the unvoiced speech are added to each other and the resulting sum data is taken out at the output terminnal 201.

The above-described speech signal encoder can output data of different bit rates depending on the demanded sound quality. That is, the output data can be outputted with variable bit rates.

Specifically, the bit rate of output data can be switched between a low bit rate and a high bit rate. For example, if the low bit rate is 2 kbps and the high bit rate is 6 kbps, the output data is data of the bit rates having the following bit rates shown in Table 1.

The pitch data from the output terminal 104 is outputted at all times at a bit rate of 8 bits/20 msec for the voiced speech, with the V/UV discrimination output from the output terminal 105 being at all times 1 bit/20 msec. The index for LSP quantization, outputted from the output terminal 102, is switched between 32 bits/40 msec and 48 bits/40 msec. On the other hand, the index during the voiced speech (V) outputted by the output terminal 103 is switched between 15 bits/20 msec and 87 bits/20 msec. The index for the unvoiced (UV) outputted from the output terminals 107s and 107g is switched between 11 bits/10 msec and 23 bits/5 msec. The output data for the voiced sound (UV) is 40 bits/20 msec for 2 kbps and 120 kbps/20 msec for 6 kbps. On the other hand, the output data for the voiced sound (UV) is 39 bits/20 msec for 2 kbps and 117 kbps/20 msec for 6 kbps.

The index for LSP quantization, the index for voiced speech (V) and the index for the unvoiced speech (UV) are explained later on in connection with the arrangement of pertinent portions.

Figure 6:
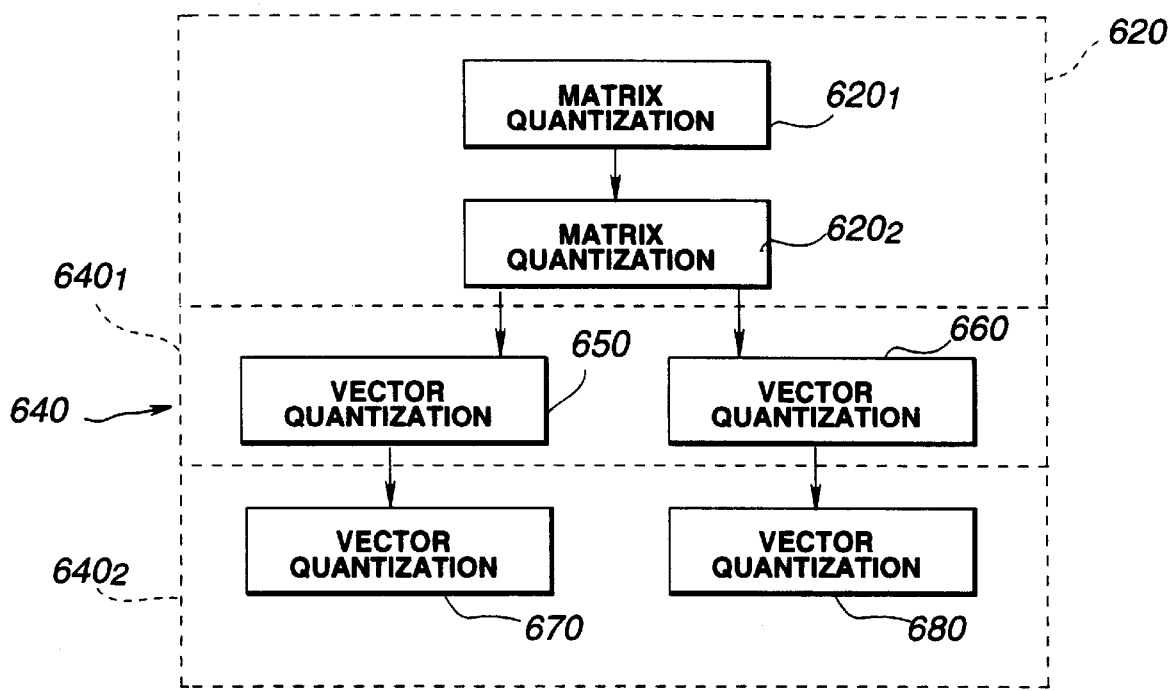
FIG. 6 is a block diagram showing a more detailed structure of the LSP quantizer.
Figure 7:
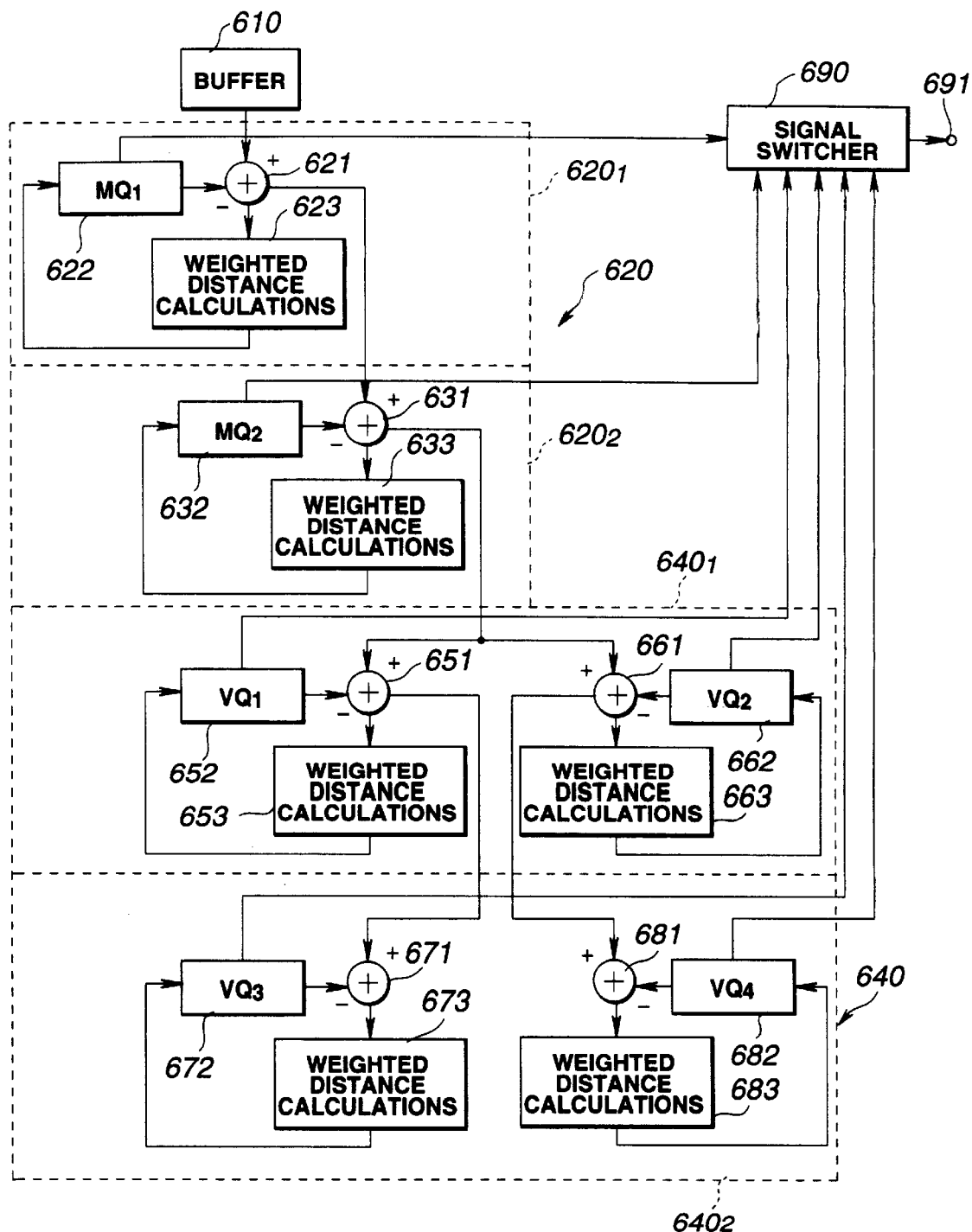
FIG. 7 is a block diagram showing a basic structure of the LSP quantizer.

Referring to FIGS. 6 and 7, matrix quantization and vector quantization in the LSP quantizer 134 are explained in detail.

The α-parameter from the LPC analysis circuit 132 is sent to an α-LSP circuit 133 for conversion to LSP parameters. If the P-order LPC analysis is performed in a LPC analysis circuit 132, P α-parameters are calculated. These P α-parameters are converted into LSP parameters which are held in a buffer 610.

The buffer 610 outputs 2 frames of LSP parameters. The two frames of the LSP parameters are matrix-quantized by a matrix quantizer 620 made up of a first matrix quantizer 620₁ and a second matrix quantizer 620₂. The two frames of the LSP parameters are matrix-quantized in the first matrix quantizer 620₁ and the resulting quantization error is further matrix-quantized in the second matrix quantizer 620₂. The matrix quantization exploits correlation in both the time axis and in the frequency axis.

The quantization error for two frames from the matrix quantizer 620₂ enters a vector quantization unit 640 made up of a first vector quantizer 640₁ and a second vector quantizer 640₂. The first vector quantizer 640₁ is made up of two vector quantization portions 650, 660, while the second vector quantizer 640₂ is made up of two vector quantization portions 670, 680. The quantization error from the matrix quantization unit 620 is quantized on the frame basis by the vector quantization portions 650, 660 of the first vector quantizer 640₁. The resulting quantization error vector is further vector-quantized by the vector quantization portions 670, 680 of the second vector quantizer 640₂. The above described vector quantization exploits correlation along the frequency axis.

The matrix quantization unit 620, executing the matrix quantization as described above, includes at least a first matrix quantizer 620₁ for performing first matrix quantization step and a second matrix quantizer 620₂ for performing second matrix quantization step for matrix quantizing the quantization error produced by the first matrix quantization. The vector quantization unit 640, executing the vector quantization as described above, includes at least a first vector quantizer 640₁ for performing a first vector quantization step and a second vector quantizer 640₂ for performing a second matrix quantization step for matrix quantizing the quantization error produced by the first vector quantization.

The matrix quantization and the vector quantization will now be explained in detail.

The LSP parameters for two frames, stored in the buffer 600, that is a 10×2 matrix, is sent to the first matrix quantizer 620₁. The first matrix quantizer 620₁ sends LSP parameters for two frames via LSP parameter adder 621 to a weighted distance calculating unit 623 for finding the weighted distance of the minimum value.

The distortion measure $d_{MQ1}$ during codebook search by the first matrix quantizer 620₁ is given by the equation (1):

$$d_{MQ1}(X_1, X_1') = \sum_{t=0}^{1}\sum_{i=1}^{P} w(t, i)(x_1(t, i) - x_1'(t, i))^2 \quad (1)$$

where $X_1$ is the LSP parameter and $X_1'$ is the quantization value, with t and i being the numbers of the P-dimension.

The weight w, in which weight limitation in the frequency axis and in the time axis is not taken into account, is given by the equation (2):

$$w(t, i) = \frac{1}{x(t, i+1) - x(t, i)} + \frac{1}{x(t, i) - x(t, i-1)} \quad (2)$$

where x(t, 0)=0, x(t, p+1)=π regardless of t.

The weight w of the equation (2) is also used for downstream side matrix quantization and vector quantization.

The calculated weighted distance is sent to a matrix quantizer MQ₁ 622 for matrix quantization. An 8-bit index outputted by this matrix quantization is sent to a signal switcher 690. The quantized value by matrix quantization is subtracted in an adder 621 from the LSP parameters for two frames from the buffer 610. A weighted distance calculating unit 623 calculates the weighted distance every two frames so that matrix quantization is carried out in the matrix quantization unit 622. Also, a quantization value minimizing the weighted distance is selected. An output of the adder 621 is sent to an adder 631 of the second matrix quantizer 620₂.

Similarly to the first matrix quantizer 620₁, the second matrix quantizer 620₂ performs matrix quantization. An output of the adder 621 is sent via adder 631 to a weighted distance calculation unit 633 where the minimum weighted distance is calculated.

The distortion measure $d_{MQ2}$ during the codebook search by the second matrix quantizer 620₂ is given by the equation (3):

$$d_{MQ2}(X_2, X_2') = \sum_{t=0}^{1}\sum_{i=1}^{P} w(t, i)(x_2(t, i) - x_2'(t, i))^2 \quad (3)$$

The weighted distance is sent to a matrix quantization unit (MQ₂) 632 for matrix quantization. An 8-bit index, outputted by matrix quantization, is sent to a signal switcher 690. The weighted distance calculation unit 633 sequentially calculates the weighted distance using the output of the adder 631. The quantization value minimizing the weighted distance is selected. An output of the adder 631 is sent to the adders 651, 661 of the first vector quantizer 640₁ frame by frame.

The first vector quantizer 640₁, performs vector quantization frame by frame. An output of the adder 631 is sent frame by frame to each of weighted distance calculating units 653, 663 via adders 651, 661 for calculating the minimum weighted distance.

The difference between the quantization error $X_2$ and the quantization error $X_2'$ is a matrix of (10×2). If the difference is represented as $X_2-X_2'=[\underline{x}_{3-1}, \underline{x}_{3-2}]$, the distortion measures $d_{VQ1}$, $d_{VQ2}$ during codebook search by the vector quantization units 652, 662 of the first vector quantizer 640₁, are given by the equations (4) and (5):

$$d_{VQ1}(x_{3-1}, x_{3-1}') = \sum_{i=1}^{P} w(0, i)(x_{3-1}(0, i) - x_{3-1}'(0, i))^2 \quad (4)$$

$$d_{VQ2}(x_{3-2}, x_{3-2}') = \sum_{i=1}^{P} w(1, i)(x_{3-2}(1, i) - x_{3-2}'(1, i))^2 \quad (5)$$

The weighted distance is sent to a vector quantization VQ₁ 652 and a vector quantization unit VQ₂ 662 for vector quantization. Each 8-bit index outputted by this vector quantization is sent to the signal switcher 690. The quantization value is subtracted by the adders 651, 661 from the input two-frame quantization error vector. The weighted distance calculating units 653, 663 sequentially calculate the weighted distance, using the outputs of the adders 651, 661, for selecting the quantization value minimizing the weighted distance. The outputs of the adders 651, 661 are sent to adders 671, 681 of the second vector quantizer 640₂.

The distortion measure $d_{VQ3}$, $d_{VQ4}$ during codebook searching by the vector quantizers 672, 682 of the second vector quantizer 640₂, for $$\underline{x}_{4-1} = x_{3-1} - \underline{x}_{3-1}'$$

$$\underline{x}_{4-2} = x_{3-2} - \underline{x}_{3-2}'$$

are given by the equations (6) and (7):

$$d_{VQ3}(\underline{x}_{4-1}, \underline{x}'_{4-1}) = \sum_{i=1}^{P} w(0, i)(x_{4-1}(0, i) - x'_{4-1}(0, i))^2 \quad (6)$$

$$d_{VQ4}(\underline{x}_{4-2}, \underline{x}'_{4-2}) = \sum_{i=1}^{P} w(1, i)(x_{4-2}(1, i) - x'_{4-2}(1, i))^2 \quad (7)$$

These weighted distances are sent to the vector quantizer (VQ₃) 672 and to the vector quantizer (VQ₄) 682 for vector quantization. The 8-bit output index data from vector quantization are subtracted by the adders 671, 681 from the input quantization error vector for two frames. The weighted distance calculating units 673, 683 sequentially calculate the weighted distances using the outputs of the adders 671, 681 for selecting the quantized value minimizing the weighted distances.

During codebook learning, learning is performed by the general Lloyd algorithm based on the respective distortion measures.

The distortion measures during codebook searching and during learning may be of different values.

The 8-bit index data from the matrix quantization units 622, 632 and the vector quantization units 652, 662, 672 and 682 are switched by the signal switcher 690 and outputted at an output terminal 691.

Specifically, for a low-bit rate, outputs of the first matrix quantizer 620₁ carrying out the first matrix quantization step, second matrix quantizer 620₂ carrying out the second matrix quantization step and the first vector quantizer 640₁, carrying out the first vector quantization step are taken out, whereas, for a high bit rate, the output for the low bit rate is summed to an output of the second vector quantizer 640₂ carrying out the second vector quantization step and the resulting sum is taken out.

This outputs an index of 32 bits/40 msec and an index of 48 bits/40 msec for 2 kbps and 6 kbps, respectively.

The matrix quantization unit 620 and the vector quantization unit 640 perform weighting limited in the frequency axis and/or the time axis in conformity to characteristics of the parameters representing the LPC coefficients.

The weighting limited in the frequency axis in conformity to characteristics of the LSP parameters is first explained. If the number of orders P=10, the LSP parameters X(i) are grouped into $$L_1 = \{X(i) | 1 \leq i \leq 2\}$$

$$L_2 = \{X(i) | 3 \leq i \leq 6\}$$

$$L_3 = \{X(i) | 7 \leq i \leq 10\}$$

for three ranges of low, mid and high ranges. If the weighting of the groups $L_1$, $L_2$ and $L_3$ is 1/4, 1/2 and 1/4, respectively, the weighting limited only in the frequency axis is given by the equations (8), (9) and (10)

$$w'(i) = \frac{w(i)}{\sum_{j=1}^{2} w(j)} \times \frac{1}{4} \quad (8)$$

$$w'(i) = \frac{w(i)}{\sum_{j=3}^{6} w(j)} \times \frac{1}{2} \quad (9)$$

$$w'(i) = \frac{w(i)}{\sum_{j=7}^{10} w(j)} \times \frac{1}{4} \quad (10)$$

The weighting of the respective LSP parameters is performed in each group only and such weight is limited by the weighting for each group.

Looking in the time axis direction, the sum total of the respective frames is necessarily 1, so that limitation in the time axis direction is frame-based. The weight limited only in the time axis direction is given by the equation (11):

$$w'(i, t) = \frac{w(i, t)}{\sum_{j=1}^{10} \sum_{s=0}^{1} w(j, s)} \quad (11)$$

where $1 \leq i \leq 10$ and $0 \leq t \leq 1$.

By this equation (11), weighting not limited in the frequency axis direction is carried out between two frames having the frame numbers of t=0 and t=1. This weighting limited only in the time axis direction is carried out between two frames processed with matrix quantization.

During learning, the totality of frames used as learning data, having the total number T, is weighted in accordance with the equation (12):

$$w'(i, t) = \frac{w(i, t)}{\sum_{j=1}^{10} \sum_{s=0}^{T} w(j, s)} \quad (12)$$

where $1 \leq i \leq 10$ and $0 \leq t \leq T$.

The weighting limited in the frequency axis direction and in the time axis direction is explained. If the number of orders P=10, the LSP parameters x(i, t) are grouped into $$L_1 = \{x(i, t) | 1 \leq i \leq 2, 0 \leq t \leq 1\}$$

$$L_2 = \{x(i, t) | 3 \leq i \leq 6, 0 \leq t \leq 1\}$$

$$L_3 = \{x(i, t) | 7 \leq i \leq 10, 0 \leq t \leq 1\}$$

for three ranges of low, mid and high ranges. If the weights for the groups $L_1$, $L_2$ and $L_3$ ares 1/4, 1/2 and 1/4, the weighting limited only in the frequency axis is given by the equations (13), (14) and (15):

$$w'(i, t) = \frac{w(i, t)}{\sum_{j=1}^{2} \sum_{s=0}^{1} w(j, s)} \times \frac{1}{4} \quad (13)$$

$$w'(i, t) = \frac{w(i, t)}{\sum_{j=3}^{6} \sum_{s=0}^{1} w(j, s)} \times \frac{1}{2} \quad (14)$$

$$w'(i, t) = \frac{w(i, t)}{\sum_{j=7}^{10}\sum_{s=0}^{1} w(j, s)} \times \frac{1}{4} \quad (15)$$

By these equations (13) to (15), weighting limitation is carried out every three frames in the frequency axis direction and across two frames processed with matrix quantization in the time axis direction. This is effective both during codebook search and during learning.

During learning, weighting is for the totality of frames of the entire data. The LSP parameters x(i, t) are grouped into $$L_1 = \{x(i, t) | 1 \leq i \leq 2, 0 \leq t \leq T\}$$
$$L_2 = \{x(i, t) | 3 \leq i \leq 6, 0 \leq t \leq T\}$$
$$L_3 = \{x(i, t) | 7 \leq i \leq 10, 0 \leq t \leq T\}$$

for low, mid and high ranges. If the weighting of the groups $L_1$, $L_2$ and $L_3$ is 1/4, 1/2 and 1/4, respectively, the weighting for the groups $L_1$, $L_2$ and $L_3$, limited in the frequency axis and in the frequency direction, is given by the equations (16), (17) and (18):

$$w'(i, t) = \frac{w(i, t)}{\sum_{j=1}^{2}\sum_{s=0}^{T} w(j, s)} \times \frac{1}{4} \quad (16)$$

$$w'(i, t) = \frac{w(i, t)}{\sum_{j=3}^{6}\sum_{s=0}^{T} w(j, s)} \times \frac{1}{2} \quad (17)$$

$$w'(i, t) = \frac{w(i, t)}{\sum_{j=7}^{10}\sum_{s=0}^{T} w(j, s)} \times \frac{1}{4} \quad (18)$$

By these equations (16) to (18), weighting can be performed for three ranges in the frequency axis direction and across the totality of frames in the time axis direction.

In addition, the matrix quantization unit 620 and the vector quantization unit 640 perform weighting depending on the magnitude of changes in the LSP parameters. In V to UV or UV to V transient regions, which represent minority frames among the totality of speech frames, the LSP parameters are changed significantly due to difference in the frequency response between consonants and vowels. Therefore, the weighting shown by the equation (19) may be multiplied by the weighting W'(i, t) for carrying out the weighting placing emphasis on the transition regions.

$$wd(t) = \sum_{i=1}^{10} |x_1(i, t) - x_1(i, t-1)|^2 \quad (19)$$

The following equation (20):

$$wd(t) = \sum_{i=1}^{10} \sqrt{|x_1(i, t) - x_1(i, t-1)|} \quad (20)$$

may be used in place of the equation (19).

Thus the LSP quantization unit 134 executes two-stage matrix quantization and two-stage vector quantization to render the number of bits of the output index variable.

Figure 8:
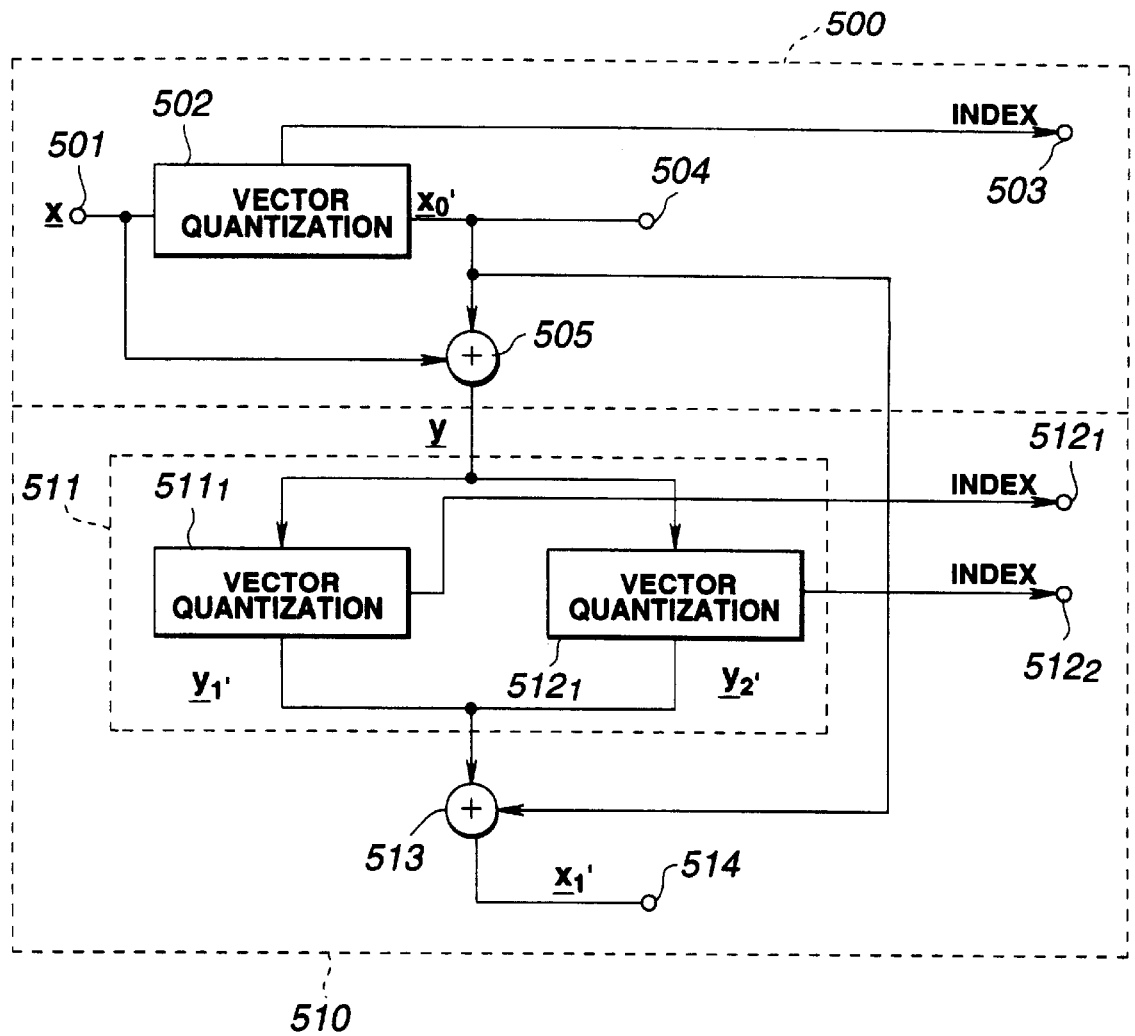
FIG. 8 is a block diagram showing a more detailed structure of the vector quantizer.
Figure 9:
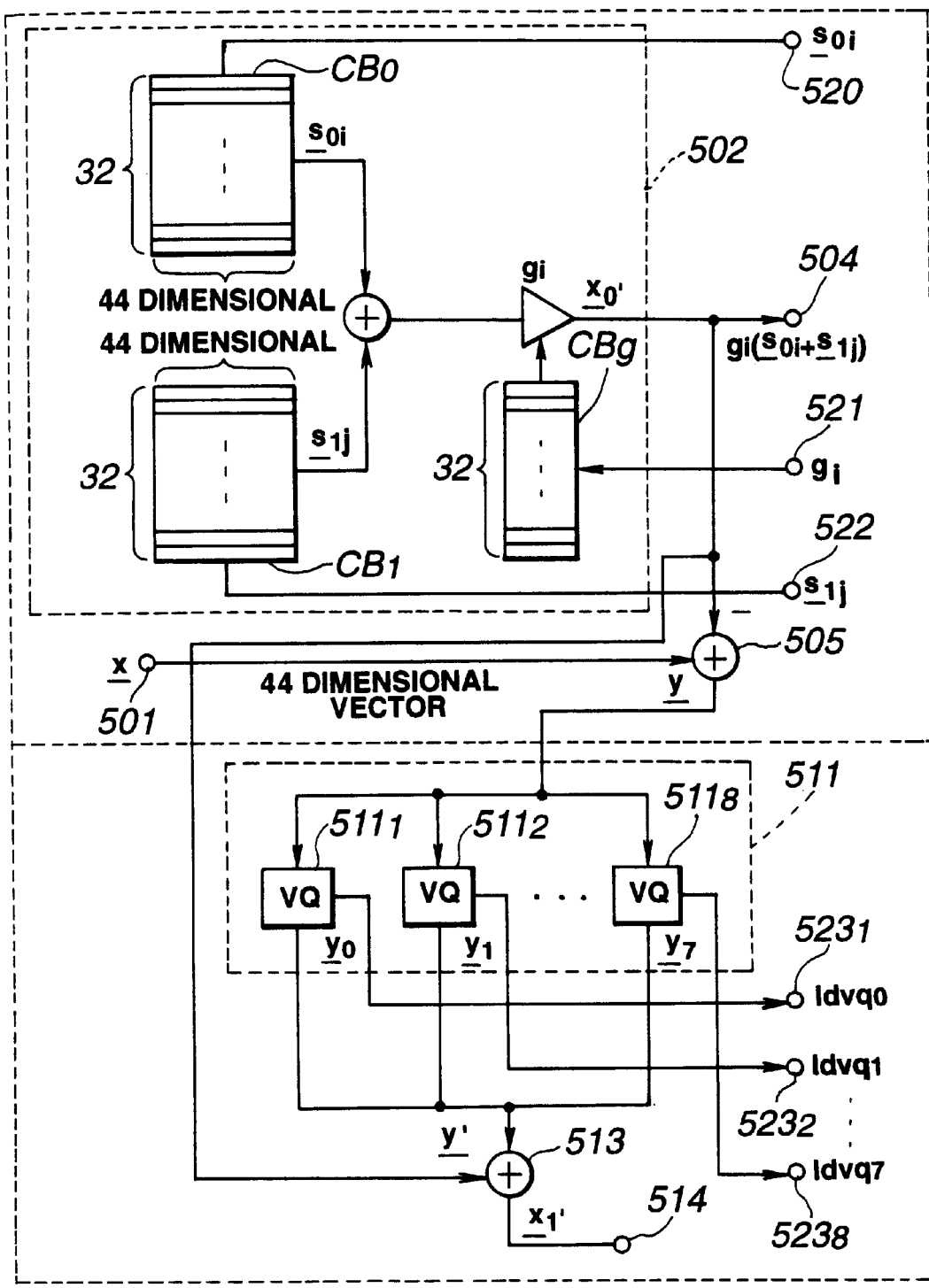
FIG. 9 is a block diagram showing a more detailed structure of the vector quantizer.

The basic structure of the vector quantization unit 116 is shown in FIG. 8, while a more detailed structure of the vector quantization unit 116 shown in FIG. 8 is shown in FIG. 9. An illustrative structure of weighted vector quantization for the spectral envelope Am in the vector quantization unit 116 is now explained.

First, in the speech signal encoding device shown in FIG. 3, an illustrative arrangement for data number conversion for providing a constant number of data of the amplitude of the spectral envelope on an output side of the spectral evaluating unit 148 or on an input side of the vector quantization unit 116 is explained.

A variety of methods may be conceived for such data number conversion. In the present embodiment, dummy data interpolating the values from the last data in a block to the first data in the block, or pre-set data such as data repeating the last data or the first data in a block, are appended to the amplitude data of one block of an effective band on the frequency axis for enhancing the number of data to $N_F$, amplitude data equal in number to Os times, such as eight times, are found by Os-tuple, such as octatuple, oversampling of the limited bandwidth type. The ((mMx+1)×Os) amplitude data are linearly interpolated for expansion to a larger $N_M$ number, such as 2048. This $N_M$ data is sub-sampled for conversion to the above-mentioned pres-set number M of data, such as 44 data. In effect, only data necessary for formulating M data ultimately required is calculated by oversampling and linear interpolation without finding all of the above-mentioned $N_M$ data.

The vector quantization unit 116 for carrying out weighted vector quantization of FIG. 8 at least includes a first vector quantization unit 500 for performing the first vector quantization step and a second vector quantization unit 510 for carrying out the second vector quantization step for quantizing the quantization error vector produced during the first vector quantization by the first vector quantization unit 500. This first vector quantization unit 500 is a so-called first-stage vector quantization unit, while the second vector quantization unit 510 is a so-called second-stage vector quantization unit.

An output vector $\underline{x}$ of the spectral evaluation unit 148, that is, envelope data having a pre-set number M, enters an input terminal 501 of the first vector quantization unit 500. This output vector $\underline{x}$ is quantized with weighted vector quantization by the vector quantization unit 502. Thus a shape index outputted by the vector quantization unit 502 is outputted at an output terminal 503, while a quantized value $\underline{x}_0'$ is outputted at an output terminal 504 and sent to adders 505, 513. The adder 505 subtracts the quantized value $\underline{x}_0'$ from the source vector $\underline{x}$ to give a multi-order quantization error vector y.

The quantization error vector y is sent to a vector quantization unit 511 in the second vector quantization unit 510. This second vector quantization unit 511 is made up of plural vector quantizers, or two vector quantizers $511_1$, $511_2$ in FIG. 8. The quantization error vector y is dimensionally split so as to be quantized by weighted vector quantization in the two vector quantizers $511_1$, $511_2$. The shape index outputted by these vector quantizers $511_1$, $511_2$ is outputted at output terminals $512_1$, $512_2$, while the quantized values $y_1'$, $y_2'$ are connected in the dimensional direction and sent to an adder 513. The adder 513 adds the quantized values $y_1'$, $y_2'$ to the quantized value $\underline{x}_0'$ to generate a quantized value $\underline{x}_1'$ which is outputted at an output terminal 514.

Thus, for the low bit rate, an output of the first vector quantization step by the first vector quantization unit 500 is taken out, whereas, for the high bit rate, an output of the first vector quantization step and an output of the second quantization step by the second quantization unit 510 are outputted.

Specifically, the vector quantizer 502 in the first vector quantization unit 500 in the vector quantization section 116 is of an L-order, such as 44-dimensional two-stage structure, as shown in FIG. 9.

That is, the sum of the output vectors of the 44-dimensional vector quantization codebook with the codebook size of 32, multiplied with a gain $g_i$, is used as a quantized value $\underline{x}_0'$ of the 44-dimensional spectral envelope vector $\underline{x}$. Thus, as shown in FIG. 8, the two codebooks are CB0 and CB1, while the output vectors are $s_{1i}$, $s_{1j}$, where $0 \leq i$ and $j \leq 31$. On the other hand, an output of the gain codebook $CB_g$ is $g_1$, where $0 \leq 1 \leq 31$, where $g_1$ is a scalar. An ultimate output $\underline{x}_0'$ is $g_1 (s_{1i} + s_{1j})$ The spectral envelope Am obtained by the above MBE analysis of the LPC residuals and converted into a pre-set dimension is $\underline{x}$. It is crucial how efficiently $\underline{x}$ is to be quantized.

The quantization error energy E is defined by $$E = \|W\{H\underline{x} - Hg_1((\underline{s}_{0i} + \underline{s}_{1j}))\}\|^2 \qquad (21)$$
$$= \|WH\{\underline{x} - g_1(\underline{s}_{0i} + \underline{s}_{1j})\}\|^2$$

where H denotes characteristics on the frequency axis of the LPC synthesis filter and W a matrix for weighting for representing characteristics for perceptual weighting on the frequency axis.

If the α-parameter by the results of LPC analysis of the current frame is denoted as $\alpha_i$ ($1 \leq i \leq P$), the values of the L-dimension, for example, 44-dimension corresponding points, are sampled from the frequency response of the equation (22):

$$H(z) = \frac{1}{1 + \sum_{i=1}^{P} \alpha_i z^{-i}} \qquad (22)$$

For calculations, 0s are stuffed next to a string of 1, $\alpha_1$, $\alpha_2$, ... $\alpha_P$ to give a string of 1, $\alpha_1$, $\alpha_2$, ... $\alpha_P$, 0, 0, ..., 0 to give e.g., 256-point data. Then, by 256-point FFT, $(r_e^2 + im^2)^{1/2}$ are calculated for points associated with a range from 0 to π and the reciprocals of the results are found. These reciprocals are sub-sampled to L points, such as 44 points, and a matrix is formed having these L points as diagonal elements:

$$H = \begin{bmatrix} h(1) & & & 0 \\ & h(2) & & \\ & & \ddots & \\ 0 & & & h(L) \end{bmatrix}$$

A perceptually weighted matrix W is given by the equation (23):

$$W(z) = \frac{1 + \sum_{i=1}^{P} \alpha_i \lambda_b^i z^{-i}}{1 + \sum_{i=1}^{P} \alpha_i \lambda_a^i z^{-i}} \qquad (23)$$

where $\alpha_i$ is the result of the LPC analysis, and $\lambda a$, $\lambda b$ are constants, such that $\lambda a = 0.4$ and $\lambda b = 0.9$.

The matrix W may be calculated from the frequency response of the above equation (23). For example, FFT is executed on 256-point data of 1, $\alpha 1 \lambda b$, $\alpha 2 \lambda 1 b^2$, ... $\alpha p \lambda b^P$, 0, 0, ..., 0 to find $(r_e^2[i] + Im^2[i])^{1/2}$ for a domain from 0 to π, where $0 \leq i \leq 128$. The frequency response of the denominator is found by 256-point FFT for a domain from 0 to π for 1, $\alpha 1 \lambda a$, $\alpha 2 \lambda a^2$, ..., $\alpha p \lambda a^P$, 0, 0, ..., 0 at 128 points to find $(re'^2[i] + im'^2[i])^{1/2}$, where $0 \leq i \leq 128$. The frequency response of the equation 23 may be found by $$w_0[i] = \frac{\sqrt{re^2[i] + im^2[i]}}{\sqrt{re'^2[i] + im'^2[i]}}$$

where $0 \leq i \leq 128$.

This is found for each associated point of, for example, the 44-dimensional vector, by the following method. More precisely, linear interpolation should be used. However, in the following example, the closest point is used instead.

That is, $$\omega[i] = \omega 0[\text{nint}\{128i/L\}], \text{ where } 1 \leq i \leq L.$$

In the equation nint(X) is a function which returns a value closest to X.

As for H, h(1), h(2), ... h(L) are found by a similar method. That is, $$H = \begin{bmatrix} h(1) & & & 0 \\ & h(2) & & \\ & & \ddots & \\ 0 & & & h(L) \end{bmatrix} \qquad (24)$$

$$W = \begin{bmatrix} w(1) & & & 0 \\ & w(2) & & \\ & & \ddots & \\ 0 & & & w(L) \end{bmatrix}$$

$$WH = \begin{bmatrix} h(1)w(1) & & & 0 \\ & h(2)w(2) & & \\ & & \ddots & \\ 0 & & & h(L)w(L) \end{bmatrix}$$

As another example, H(z)W(z) is first found and the frequency response is then found for decreasing the number of times of FFT. That is, the denominator of the equation (25):

$$H(z)W(z) = \frac{1}{1 + \sum_{i=1}^{P} \alpha_i z^{-i}} \cdot \frac{1 + \sum_{i=1}^{P} \alpha_i \lambda_b^i z^{-i}}{1 + \sum_{i=1}^{P} \alpha_i \lambda_a^i z^{-i}} \qquad (25)$$

is expanded to $$\left(1 + \sum_{i=1}^{P} \alpha_i z^{-i}\right)\left(1 + \sum_{i=1}^{P} \alpha_a^i \lambda_a^i z^{-i}\right) = 1 + \sum_{i=1}^{2P} \beta_1 z^{-i}$$

256-point data, for example, is produced by using a string of 1, $\beta_1$, $\beta_2$, ..., $\beta_{2P}$, 0, 0, ..., 0. Then, 256-point FFT is executed, with the frequency response of the amplitude being $$rms[i] = \sqrt{re''^2[i] + im''^2[i]}$$

where $0 \leq i \leq 128$. From this, $$wh_0[i] = \frac{\sqrt{re^2[i] + im^2[i]}}{\sqrt{re''^2[i] + im''^2[i]}}$$

where $0 \leq i \leq 128$. This is found for each of corresponding points of the L-dimensional vector. If the number of points of the FFT is small, linear interpolation should be used. However, the closest value is herein is found by:

$$wh[i] = wh_0\left[n \; int\left(\frac{128}{L} \cdot i\right)\right]$$

where $1 \leq i \leq L$. If a matrix having these as diagonal elements is W', $$W' = \begin{bmatrix} wh(1) & & & 0 \\ & wh(2) & & \\ & & \ddots & \\ 0 & & & wh(L) \end{bmatrix} \quad (26)$$

The equation (26) is the same matrix as the above equation (24). Alternatively, $|H(\exp(j\omega))W(\exp(j\omega))|$ may be directly calculated from the equation (25) with respect to $\omega = i\pi$, where $1 \leq i \leq L$, so as to be used for $wh[i]$.

Alternatively, a suitable length, such as 40 points, of an impulse response of the equation (25) may be found and FFTed to find the amplitude frequency response which can be used for matrix W'.

Rewriting the equation (21) using this matrix, that is frequency characteristics of the weighted synthesis filter, we obtain $$E = \|W'(\underline{x}_k - g_1(\underline{s}_{0i} + \underline{s}_{1j}))\| \quad (27)$$

The method for learning the shape codebook and the gain codebook is explained.

The expected value of the distortion is minimized for all frames k for which a code vector $s_{0c}$ is selected for CB0. If there are M such frames, it suffices if $$J = \frac{1}{M}\sum_{k=1}^{M}\|W'_k(\underline{x}_k - g_k(\underline{s}_{0c} + \underline{s}_{ik}))\|^2 \quad (28)$$

is minimized. In the equation (28), $W_k'$, $\underline{x}_k$, $g_k$ and $s_{ik}$ denote the weighting for the k'th frame, an input to the k'th frame, the gain of the k'th frame and an output of the codebook CB1 for the k'th frame, respectively.

For minimizing the equation (28), $$J = \frac{1}{M}\sum_{k=1}^{M}\{(\underline{x}_k^T - g_k(\underline{s}_{0c}^T + \underline{s}_{1k}^T))W_k'^T W_k'(\underline{x}_k - g_k(\underline{s}_{0c} + \underline{s}_{1k}))\} \quad (29)$$

$$= \frac{1}{M}\sum_{k=1}^{M}\{\underline{x}_k^T W_k'^T W_k'\underline{x}_k - 2g_k(\underline{s}_{0c}^T + \underline{s}_{1k}^T)W_k'^T W_k'\underline{x}_k +$$

$$g_k^2(\underline{s}_{0c}^T + \underline{s}_{1k}^T)W_k'^T W_k'(\underline{s}_{0c} + \underline{s}_{1k})\}$$

$$= \frac{1}{M}\sum_{k=1}^{M}\{\underline{x}_k^T W_k'^T W_k'\underline{x}_k - 2g_k(\underline{s}_{0c}^T + \underline{s}_{1k}^T)W_k'^T W_k'\underline{x}_k +$$

$$g_k^2 \underline{s}_{0c}^T W_k'^T W_k' \underline{s}_{0c} + 2g_k^2 \underline{s}_{0c}^T W_k'^T W_k' \underline{s}_{1k} + g_k^2 \underline{s}_{1k}^T W_k'^T W_k' \underline{s}_{1k}\}$$

$$\frac{\partial J}{\partial \underline{s}_{0c}} = \frac{1}{M}\sum_{k=1}^{M}\{-2g_k W_k'^T W_k' \underline{x}_k + 2g_k^2 W_k'^T W_k' \underline{s}_{0c} + \quad (30)$$

$$2g_k^2 W_k'^T W_k' \underline{s}_{1k}\} = 0$$

Hence, $$\sum_{k=1}^{M}(g_k W_k'^T W_k'\underline{x}_k - g_k^2 W_k'^T W_k'\underline{S}_{lk}) = \sum_{k=1}^{M}g_k^2 W_k'^T W_k'\underline{s}_{0c}$$

so that $$s_{0c} = \left\{\sum_{k=1}^{M}g_k^2 W_k'^T W_k'\right\}^{-1} \cdot \left\{\sum_{k=1}^{M}g_k W_k'^T W_k'(\underline{x} - g_k \underline{s}_{lk})\right\} \quad (31)$$

where $$(\;)$$

denotes an inverse matrix and $W_k'^T$ denotes a transposed matrix of $W_k'$.

Next, gain optimization is considered.

The expected value of the distortion concerning the k'th frame selecting the code word gc of the gain is given by:

$$J_g = \frac{1}{M}\sum_{k=1}^{N}\|W_k'(\underline{x}_k - g_c(\underline{s}_{0k} + \underline{s}_{1k}))\|^2$$

$$= \frac{1}{M}\sum_{k=1}^{M}\{\underline{x}_k^T W_k'^T W_k' \underline{x}_k - 2g_c \underline{x}_k^T W_k'^T W_k'(\underline{s}_{0k} + \underline{s}_{1k}) +$$

$$g_c^2(\underline{s}_{0k}^T + \underline{s}_{1k}^T)W_k'^T W_k'(\underline{s}_{0k} + \underline{s}_{1k})\}$$

Solving $$\frac{\partial J_g}{\partial g_c} = \frac{1}{M}\sum_{k=1}^{M}\{-2\underline{x}_k^T W_k'^T W_k'(\underline{s}_{0k} + \underline{s}_{1k}) -$$

$$2g_c(\underline{s}_{0k}^T + \underline{s}_{1k}^T)W_k'^T W_k'(\underline{s}_{0k} + \underline{s}_{1k})\} = 0$$

we obtain $$\sum_{k=1}^{M}\underline{x}_k^T W_k'^T W_k'(\underline{s}_{0k} + \underline{s}_{1k}) = \sum_{k=1}^{M}g_c(\underline{s}_{0k}^T + \underline{s}_{1k}^T)W_k'^T W'(\underline{s}_{0k} + \underline{s}_{1k})$$

and $$g_c = \frac{\sum_{k=1}^{M} x_k^T W_k'^T W_k'(s_{0k} + s_{1k})}{\sum_{k=1}^{M} (s_{0k}^T + s_{1k}^T) W_k'^T W_k'(s_{0k} + s_{1k})} \quad (32)$$

The above equations (31) and (32) give optimum centroid conditions for the shape $s_{0i}$, $s_{1j}$, and the gain $g_l$ for $0 \leq i \leq 31$, $0 \leq j \leq 31$ and $0 \leq l \leq 31$, that is an optimum decoder output. Meanwhile, $s_{1i}$ may be found in the same way as for $s_{0i}$.

Next, the optimum encoding condition, that is, the nearest neighbor condition, is considered.

The above equation (27) for finding the distortion measure, that is, $s_{0i}$ and $s_{1i}$ minimizing the equation $E = \|W'(\underline{x} - g_1(s_{1i} + s_{1j}))\|^2$, are found each time the input $\underline{x}$ and the weight matrix $W'$ are given, that is, on the frame-by-frame basis.

Intrinsically, E is found on the round robin fashion for all combinations of g1 ($0 \leq l \leq 31$), $s_{0i}$ ($0 \leq i \leq 31$) and $s_{0j}$ ($0 \leq j \leq 31$), that is 32×32×32=32768, in order to find the set of $s_{0i}$, $s_{1i}$ which will give the minimum value of E. However, since this requires voluminous calculations, the shape and the gain are sequentially searched in the present embodiment. Meanwhile, round robin search is used for the combination of $s_{0i}$ and $s_{1i}$. There are 32×32=1024 combinations for $s_{0i}$ and $s_{1i}$. In the following description, $s_{1i} + s_{1j}$ are indicated as $s_m$ for simplicity.

The above equation (27) becomes $E = \|W'(\underline{x} - g_1 s_m)\|^2$. If, for further simplicity, $\underline{x}_w = W'\underline{x}$ and $s_w = W's_m$, we obtain $$E = \|\underline{x}_w - g_1 s_w\|^2 \quad (33)$$

$$E = \|x_w\|^2 + \|s_w\|^2 \left(g_l - \frac{x_w^T \cdot s_w}{\|s_w\|^2}\right)^2 - \frac{(x_w^T \cdot s_w)^2}{\|s_w\|^2} \quad (34)$$

Therefore, if g1 can be made sufficiently accurate, search can be performed in two steps of (1) searching for $s_w$ which will maximize $$\frac{(x_w^T \cdot s_w)^2}{\|s_w\|^2}$$

and (1) searching for $g_1$ which is closest to $$\frac{x_w^T \cdot s_w}{\|s_w\|^2}$$

If the above is rewritten using the original notation, (1)' searching is made for a set of $s_{0i}$ and $s_{1j}$ which will maximize $$\frac{(x^T W'^T W'(s_{0i} + s_{1j}))^2}{\|W'(s_{0i} + s_{1j})\|^2}$$

and (2)' searching is made for $g_1$ which is closest to $$\frac{(x^T W'^T W'(s_{0i} + s_{1j}))}{\|W'(s_{0i} + s_{1j})\|^2} \quad (35)$$

The above equation (35) represents an optimum encoding condition (nearest neighbor condition).

The processing volume in case of executing codebook search for vector quantization is now considered.

With the dimension of $s_{0i}$ and $s_{1i}$ of K, and with the sizes of the codebooks CB0, CB1 of $L_0$ and $L_1$, that is, $$0 \leq i \leq L_0,\ 0 \leq j \leq L_1,$$

with the processing volume for addition, sum-of-products and squaring of the numerator each being 1 and with the processing volume of the product and sum-of-products of the denominator each being 1, the processing volume of (1)' of the equation (35) is approximately such that numerator: $L_0 \cdot L_1 \cdot (K \cdot (1+1)+1)$
denominator: $L_0 \cdot L_1 \cdot (K \cdot (1+1))$
Magnitude comparison: $L_0 \cdot L_1$ to give a sum of $L_0 \cdot L_1 \cdot (4K+2)$. If $L_0 = L_1 = 32$ and K=44, the processing volume is on the order of 182272.

Thus, all of the processing of (i)' of the equation (35) is not executed, but the P number each of the vectors $s_{0i}$ and $s_{1i}$ are pre-selected. Since the negative gain entry is not supposed (or allowed), (1)' of the equation (35) is searched so that the value of the numerator of (2)' of the equation (35) will always be of a positive value. That is, (1)' of the equation (35) is maximized inclusive of the polarity of $\underline{x}^T W'^T W'(s_{0i} + s_{1i})$.

As an illustrative example of the pre-selection method, there may be stated a method of (sequence 1) selecting the $P_0$ number of $s_{0i}$, counting from the upper order side, which maximize $\underline{x}^T W'^T W' s_{0i}$;

(sequence 2) selecting the $P_1$ number of $s_{1i}$, counting from the upper order side, which maximize $\underline{x}^T W'^T W' s_{1i}$; and (sequence 3) evaluating the equation of (1)' of the equation (35) for all combinations of the $P_0$ number of $s_{0i}$ and the $P_1$ number of $s_{1i}$.

This is effective if, in the evaluation of $$\frac{x^T W'^T W'(s_{0i} + s_{1j})}{\|W'(s_{0i} + s_{1j})\|^2} \quad (a1)$$

which is the square root of the equation (1)' of the equation (35), the supposition that the denominator, that is, the weighted norm of $s_{0i} + s_{1i}$, is substantially constant without regard to i or j. In actuality, the magnitude of the denominator of the equation (a1) is not constant. The pre-selection method which takes this into account will be explained subsequently.

Here, the effect of diminishing the processing volume in case the denominator of the equation (a1) is supposed to be constant is explained. Since the processing volume of $L_0 \cdot K$ is required for searching of the (sequence 1), while the processing volume of $$(L0-1)+(L0-2)+\ldots+(L0-P0)=P0 \cdot L0-P0(1+P0)/2$$

is required for magnitude comparison, the sum of the processing volumes is $L0(K+P0)-P0(1+P0)/2$. The sequence 2 also is in need of the similar processing volume. Summing these together, the processing volume for pre-selection is $$L0(K+P0)+L1(K+P1)-P0(1+P0)/2-P1(1+P1)/2$$

Turning to processing of ultimate selection of the sequence 3, numerator: $P0 \cdot P1 \cdot (1+K+1)$
denominator: $P0 \cdot P1 \cdot K \cdot (1+1)$
magnitude comparison: $P0 \cdot P1$ as concerns the processing of (1)' of the equation (35), to give a total of $P0 \cdot P1(3K+3)$.

For example, if $P0=P1+6$, $L0=L1=32$ and $K=44$, the processing volume for the ultimate selection and that for the pre-selection are 4860 and 3158, respectively, to give a total of the order of 8018. If the numbers for pre-selection are increased to 10, such that $P0=P1=10$, the processing volume for ultimate selection is 13500, while that for pre-selection is 3346, to give a total of the order of 16846.

If the numbers of the pre-selected vectors are set to 10 for respective codebooks, the processing volume as compared to that for non-omitted computing of 182272 is

16846/182272 which is about one/tenth of the former volume.

Meanwhile, the magnitude of the denominator of the equation (1)' of the equation (35) is not constant but is changed in dependence upon the selected code vector. The pre-selection method which takes into account the approximate magnitude of this norm to some extent is now explained.

For finding the maximum value of the equation (a1), which is the square root of the equation (1)' of the equation (35), since $$\frac{x^t W'^t W'(s_{0i}+s_{1j})}{\|W's_{0i}\|+\|W's_{1j}\|} \le \frac{x^t W'^t W'(s_{0i}+s_{1j})}{\|W'(s_{0i}+s_{1j})\|} \quad (a2)$$

it suffices to maximize the left side of the equation (a2). Thus, this left side is expanded to $$\frac{x^t W'^t W'(s_{0i}+s_{1j})}{\|W's_{0i}\|+\|W's_{1j}\|} = \frac{x^t W'^t W' s_{0i}}{\|W's_{0i}\|+\|W's_{1j}\|} + \frac{x^t W'^t W' s_{1j}}{\|W's_{0i}\|+\|W's_{1j}\|} \quad (a3)$$

the first and second terms of which are then maximized.

Since the numerator of the first term of the equation (a3) is the function only of $s_{0i}$, the first term is maximized with respect to $s_{0i}$. On the other hand, since the numerator of the second term of the equation (a3) is the function only of $s_{1j}$, the second term is maximized with respect to $s_{1j}$. That is, there is specified such a method in $$\frac{x^t W'^t W' s_{0i}}{\|W's_{0i}\|} \quad (a4)$$

$$\frac{x^t W'^t W' s_{1j}}{\|W's_{1j}\|} \quad (a5)$$

including (sequence 1): selecting the Q0 number of $s_{0i}$ from the upper order ones of the vectors which maximize the equation (a4);

(sequence 2): selecting the Q1 number of $s_{1j}$ from the upper order ones of the vectors which maximize the equation (a5); and (sequence 3): evaluating the equation (1)' of the equation (35) for all combinations of the selected Q0 number of $s_{0i}$ and the selected Q1 number of $s_{1j}$.

Meanwhile, $W'=WH/\|x\|$, with both W and H being the functions of the input vector $\underline{x}$, and W being naturally the functions of the input vector $\underline{x}$.

Therefore, W should inherently be computed from one input vector $\underline{x}$ to another to compute the denominators of the equations (a4) and (a5). However, it is not desirable to consume the processing volume excessively for pre-selection. Therefore, these denominators are previously calculated for each of $s_{0i}$ and $s_{1j}$, using typical or representative values of W', and stored in the table along with the values of $s_{0i}$ and $s_{1j}$. Meanwhile, since division in actual search processing means a load in processing, the values of the equations (a6) and (a7):

$$\frac{1}{\|W^* s_{0i}\|} \quad 0 \le i \le L_0 \quad (a6)$$

$$\frac{1}{\|W^* s_{1j}\|} \quad 0 \le j \le L_1 \quad (a7)$$

are stored. In the above equations, $W^*$ is given by the following equation (a8):

$$W^* = \frac{1}{N}\sum_{k=1}^{N} W'_k \quad (a8)$$

where $W_k'$ is W' of a frame for which U/UV has been found to be voiced such that $$W' = \frac{WH}{\|x\|} \quad (a9)$$

Figure 10:
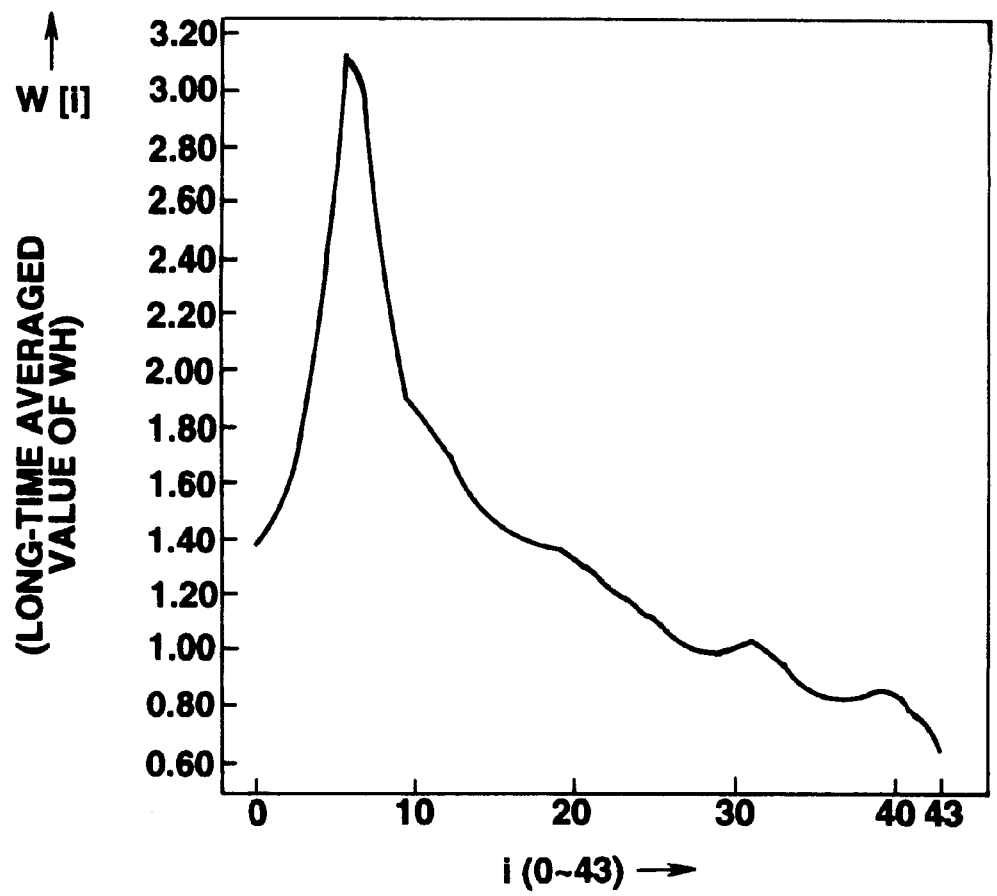
FIG. 10 is a graph illustrating a specified example of the weight value of W[i] for weighting.

FIG. 10 shows a specified example of each of W[0] to W[43] in case $W^*$ is described by the following equation (a10):

$$W^* = \begin{pmatrix} W[0] & & & & 0 \\ & W[1] & & & \\ & & W[2] & & \\ & & & \ddots & \\ 0 & & & & W[43] \end{pmatrix} \quad (a10)$$

As for the numerators of the equations (a4) and (a5), W' is found and used from one input vector $\underline{x}$ to another. The reason is that, since at any rate an inner product of $s_{0i}$ and $s_{1j}$ with $\underline{x}$ needs to be calculated, the processing volume is increased only slightly if $\underline{x}^t W'^t W'$ is once calculated.

On approximate estimation of the processing volume required in the pre-selecting method, the processing volume of $L0(K+1)$ is required for the search of the sequence 1, while the processing volume of $$Q0 \cdot L0 - Q0(1+Q0)/2$$

is required for magnitude comparison. The above sequence 2 is also in need of similar processing. Summing these processing volumes together, the processing volume for pre-selection is $$L0(K+Q0+1)+L1(K+Q1+1)-Q0(1+Q0)/2-Q1(1+Q1)/2$$

As for processing of ultimate selection of the sequence 3,
numerator: Q0·Q1·(1+K+1)
denominator: Q0·Q1·K·(1+1)
magnitude comparison: Q0·Q1
totaling at Q0·Q1(3K+3).

For example, if Q0=Q1=6, L0=L1=32 and K=44, the processing volume of the ultimate selection and that of pre-selection are 4860 and 3222, respectively, totaling at 8082 (of the eighth order of magnitude). If the number of vectors for pre-selection are increased to 10, such that Q0=Q1=10, the processing volume of the ultimate selection, and that of pre-selection are 13500 and 3410, respectively, totaling at 16910 (of the eighth order of magnitude).

These computed results are of the same order of magnitude as the processing volume of approximately 8018 for P0=P1=6 or approximately 16846 for P0=P1=10 in the absence of normalization (that is in the absence of division by the weighted norm). For example, if the numbers of vectors for the respective codebooks are set to 10, the processing volume is decreased by

16910/182272 where 182272 is the processing volume without omission. Thus the processing volume is decreased to not more than one/tenth of the original processing volume.

By way of a specified example of the SNR (S/N ratio) in case pre-selection is made, and the segmental SNR for 20 msec segment, with use of the speech analyzed and synthesized in the absence of the above-described pre-selection as the reference, the SNR is 16.8 dB and the segmental SNR is 18.7 dB in the presence of normalization and in the absence of weighting, while the SNR is 17.8 dB and the segmental SNR is 19.6 dB in the presence of weighting and normalization, with the same number of vectors for pre-selection, as compared to the SNR of 14.8 dB and the segmental SNR of 17.5 dB, in the absence of normalization and with P0=P1=6. That is, the SNR and segmental SNR are improved by 2 to 3 dB by using the operation in the presence of weighting and normalization instead of the operation in the absence of normalization.

Using the conditions (centroid conditions) of the equations (31) and (32) and the condition of the equation (35), codebooks (CB0, CB1 and CBg) can be trained simultaneously with the use of the so-called generalized Lloyd algorithm (GLA).

In the present embodiment, W' divided by a norm of an input $\underline{x}$ is used as W'. That is, W'/$\|\underline{x}\|$ is substituted for W' in the equations (31), (32) and (35).

Alternatively, the weighting W', used for perceptual weighting at the time of vector quantization by the vector quantizer 116, is defined by the above equation (26). However, the weighting W' taking into account the temporal masking can also be found by finding the current weighting W' in which past W' has been taken into account.

The values of wh(1), wh(2), . . . , wh(L) in the above equation (26), as found at the time n, that is at the n'th frame, are indicated as whn(1), whn(2), . . . , whn(L), respectively.

If the weights at time n, taking past values into account, are defined as An(i), where $1 \leq i \leq L$, $$An(i)=\lambda A_{n-1}(i)+(1-\lambda)whn(i), (whn(i) \leq A_{n-1}(i))=whn(i), (whn(i) > A_{n-1}(i))$$

where $\lambda$ may be set to, for example, $\lambda=0.2$. In An(i), with $1 \leq i \leq L$, thus found, a matrix having such An(i) as diagonal elements may be used as the above weighting.

The shape index values $s_{0i}$, $s_{1j}$, obtained by the weighted vector quantization in this manner, are outputted at output terminals 520, 522, respectively, while the gain index g1 is outputted at an output terminal 521. Also, the quantized value $\underline{x}_0$' is outputted at the output terminal 504, while being sent to the adder 505.

The adder 505 subtracts the quantized value from the spectral envelope vector $\underline{x}$ to generate a quantization error vector y. Specifically, this quantization error vector y is sent to the vector quantization unit 511 so as to be dimensionally split and quantized by vector quantizers $511_1$ to $511_8$ with weighted vector quantization. The second vector quantization unit 510 uses a larger number of bits than the first vector quantization unit 500. Consequently, the memory capacity of the codebook and the processing volume (complexity) for codebook searching are increased significantly. Thus it becomes impossible to carry out vector quantization with the 44-dimension which is the same as that of the first vector quantization unit 500. Therefore, the vector quantization unit 511 in the second vector quantization unit 510 is made up of plural vector quantizers and the input quantized values are dimensionally split into plural low-dimensional vectors for performing weighted vector quantization.

The relation between the quantized values $y_0$ to $y_7$, used in the vector quantizers $511_1$ to $511_8$, the number of dimensions and the number of bits are shown in FIG. 11.

The index values $Id_{vq0}$ to $Id_{vq7}$ outputted from the vector quantizers $511_1$ to $511_8$ are outputted at output terminals $523_1$ to $523_8$. The sum of bits of these index data is 72.

If a value obtained by connecting the output quantized values $y_0$' to $y_7$' of the vector quantizers $511_1$ to $511_8$ in the dimensional direction is y', the quantized values y' and $\underline{x}_0$' are summed by the adder 513 to give a quantized value $\underline{x}_1$'. Therefore, the quantized value $\underline{x}_1$' is represented by $$x_1' = x_0' + y'$$
$$= x - y + y'$$

That is, the ultimate quantization error vector is y'−y.

If the quantized value $\underline{x}_1$' from the second vector quantizer 510 is to be decoded, the speech signal decoding apparatus is not in need of the quantized value $\underline{x}_1$' from the first quantization unit 500. However, it is in need of index data from the first quantization unit 500 and the second quantization unit 510.

The learning method and code book search in the vector quantization section 511 will be hereinafter explained.

As for the learning method, the quantization error vector y is divided into eight low-dimension vectors $y_0$ to $y_7$, using the weight W', as shown in FIG. 11. If the weight W' is a matrix having 44-point sub-sampled values as diagonal elements:

$$W' = \begin{pmatrix} wh(1) & & & 0 \\ & wh(2) & & \\ & & \ddots & \\ 0 & & & wh(44) \end{pmatrix} \quad (36)$$

the weight W' is split into the following eight matrices:

$$W_1' = \begin{bmatrix} wh(1) & & 0 \\ & \ddots & \\ 0 & & wh(4) \end{bmatrix}$$

$$W'_2 = \begin{bmatrix} wh(5) & & 0 \\ & \ddots & \\ 0 & & wh(8) \end{bmatrix}$$

$$W'_3 = \begin{bmatrix} wh(9) & & 0 \\ & \ddots & \\ 0 & & wh(12) \end{bmatrix}$$

$$W'_4 = \begin{bmatrix} wh(13) & & 0 \\ & \ddots & \\ 0 & & wh(16) \end{bmatrix}$$

$$W'_5 = \begin{bmatrix} wh(17) & & 0 \\ & \ddots & \\ 0 & & wh(20) \end{bmatrix}$$

$$W'_6 = \begin{bmatrix} wh(21) & 0 & \\ & \ddots & \\ 0 & & wh(28) \end{bmatrix}$$

$$W'_7 = \begin{bmatrix} wh(29) & & 0 \\ & \ddots & \\ 0 & & wh(36) \end{bmatrix}$$

$$W'_8 = \begin{bmatrix} wh(37) & & 0 \\ & \ddots & \\ 0 & & wh(44) \end{bmatrix}$$

y and W', thus split in low dimensions, are termed $Y_i$ and $W'_i$, where $1 \leq i \leq 8$, respectively.

The distortion measure E is defined as $$E = \|W'_i(y_i - s)\|^2 \quad (37)$$

The codebook vector s is the result of quantization of $y_i$. Such code vector of the codebook minimizing the distortion measure E is searched.

In the codebook learning, further weighting is performed using the general Lloyd algorithm (GLA). The optimum centroid condition for learning is first explained. If there are M input vectors y which have selected the code vector s as optimum quantization results, and the training data is $y_k$, the expected value of distortion J is given by the equation (38) minimizing the center of distortion on weighting with respect to all frames k:

$$J = \frac{1}{M} \sum_{k=1}^{M} \|W'_k(\underline{y}_k - \underline{s})\|^2 \quad (38)$$

$$= \frac{1}{M} \sum_{k=1}^{M} (\underline{y}_k - \underline{s})^T W'^T_k W'_k (\underline{y}_k - \underline{s})$$

$$= \frac{1}{M} \sum_{k=1}^{M} \underline{y}_k^T W'^T_k W'_k \underline{y}_k - 2\underline{y}_k^T W'^T_k W'_k \underline{s} + \underline{s}^T W'^T_k W'_k \underline{s}$$

Solving $$\frac{\partial J}{\partial \underline{s}} = \frac{1}{M} \sum_{k=1}^{M} (-2\underline{y}_k^T W'^T_k W'_k + 2\underline{s}^T W'^T_k W'_k) = 0$$

we obtain $$\sum_{k=1}^{M} \underline{y}_k^T W'^T_k W'_k = \sum_{k=1}^{M} \underline{s}^T W'^T_k W'_k$$

Taking transposed values of both sides, we obtain $$\sum_{k=1}^{M} W'^T_k W'_k \underline{y}_k = \sum_{k=1}^{M} W'^T_k W'_k \underline{s}$$

Therefore, $$\underline{s} = \left( \sum_{k=1}^{M} W'^T_k W'_k \right)^{-1} \sum_{k=1}^{M} W'^T_k W'_k \underline{y}_k$$

In the above equation (39), s is an optimum representative vector and represents an optimum centroid condition.

As for the optimum encoding condition, it suffices to search for s minimizing the value of $\|W_i'(y_i-s)\|^2$. $W_i'$ during searching need not be the same as $W_i'$ during learning and may be non-weighted matrix:

$$\begin{bmatrix} 1 & & & 0 \\ & 1 & & \\ & & \ddots & \\ 0 & & & 1 \end{bmatrix}$$

By constituting the vector quantization unit 116 in the speech signal encoder by two-stage vector quantization units, it becomes possible to render the number of output index bits variable.

Meanwhile, the number of data of spectral components of the harmonics, obtained at a spectral envelope evaluation unit 148, is changed with the pitch, such that, if, for example, the effective frequency band is 3400 kHz, the number of data ranges from 8 to 63. The vector v, comprised of these data, blocked together, is the variable dimensional vector. In the above specified example, vector quantization is preceded by dimensional conversion into a pre-set number of data, such as 44-dimensional input vector x. This variable/fixed dimensional conversion means the above-mentioned data number conversion and may be implemented specifically using the above-mentioned oversampling and linear interpolation.

If error processing is performed on the vector x, thus converted into the fixed dimension, for codebook searching for niizing the error, the code vector is not necessarily selected which minimizes the error with respect to the original variable dimensional vector v.

Thus, with the present embodiment, plural code vectors are selected temporarily in selecting the code vectors of the fixed dimension, and ultimate optimum variable-dimension code vectors are finally selected from these temporarily selected plural code vectors. Meanwhile, only variable dimension selective processing may be executed without executing fixed dimension transient selection.

Figure 12:
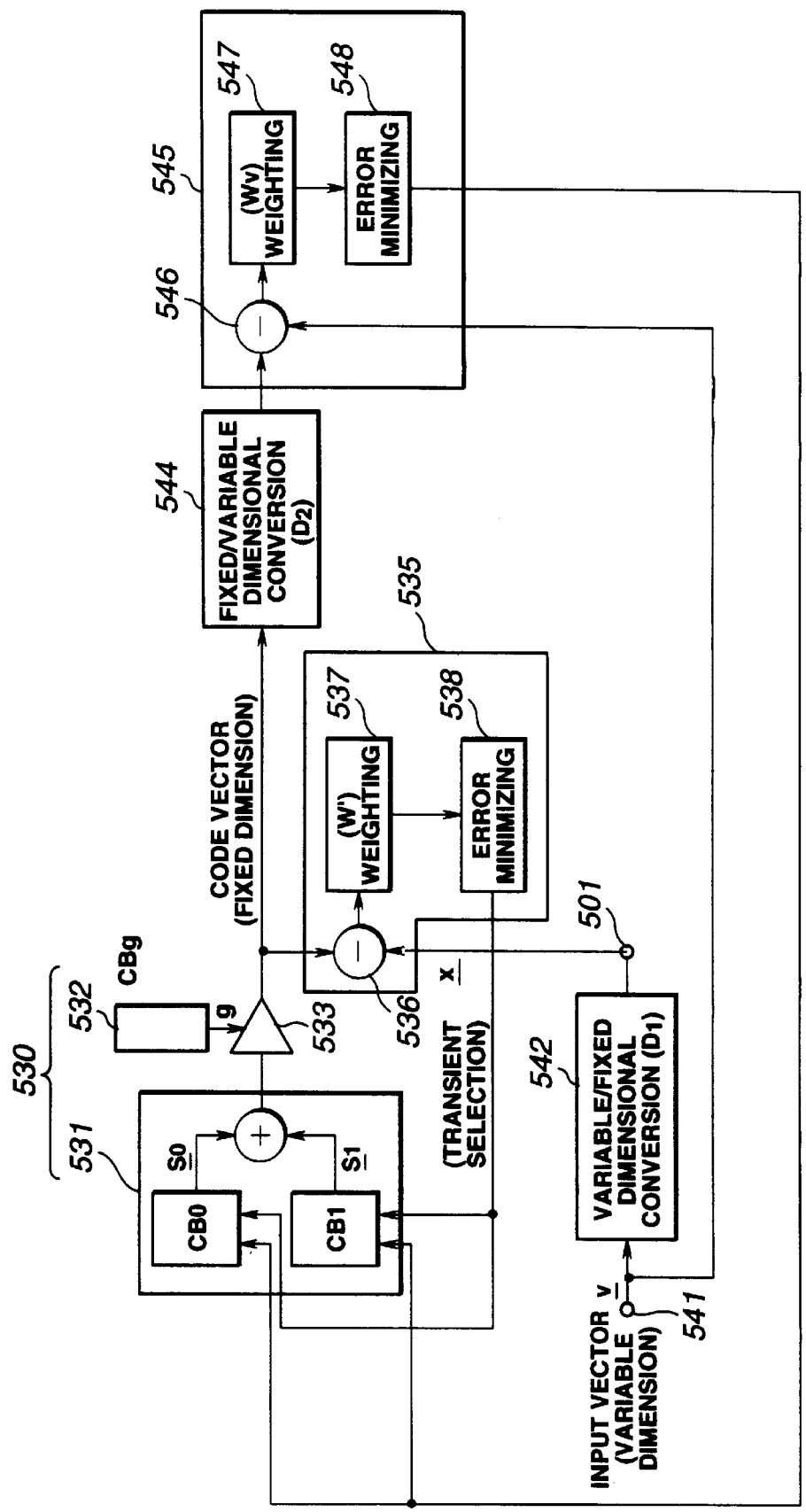
FIG. 12 is a block circuit diagram showing an illustrative structure of a vector quantizer for variable-dimension codebook retrieval.

FIG. 12 shows an illustrative structure for original variable-dimension optimum vector selection. To an input terminal 541 is entered data of a variable number of data of the spectral envelope obtained by the spectral envelope evaluation unit 148, that is the variable dimensional vector v. This variable dimensional input vector v is converted by a variable/fixed dimension converting circuit 542, as the above-mentioned data number converting circuit, into fixed-dimensional vector x (such as 44-dimensional vector made up of 44 data), which is sent to a terminal 501. The fixed dimensional input vector x and the fixed-dimensional code vector read out from a fixed-dimensional codebook 530 are sent to a fixed-dimension selection circuit 535 where a selective operation or codebook searching which selects from the codebook 530 such code vector which will reduce the weighted error or distortion therebetween to a minium is carried out.

In the embodiment of FIG. 12, the fixed two-dimensional code vector, obtained from the fixed-dimensional codebook 530, is converted by a fixed/variable dimension conversion circuit 544 which is of the same variable dimension as the original dimension. The converted dimensional code vectors are sent to a variable-dimensional conversion circuit 545 for calculating the weighed distortion between the code vector and the input vector v and selective processing or codebook searching is then carried out for selecting from the codebook 530 the code vector which will reduce the distortion to a minimum.

That is, the fixed-dimensional selection circuit 535 selects, by way of transient selection, several code vectors as candidate code vectors which will minimize the weighted distortion and executes weighted distortion calculations in the variable-dimension conversion circuit 545 on these candidate code vectors for ultimately selecting the code vector which will reduce the distortion to a minimum.

The range of application of the vector quantization employing the transient selection and ultimate selection is now briefly explained. This vector quantization can be applied not only to weighted vector quantization of the variable-dimension harmonics using the dimension conversion on spectral components of the harmonics in harmonic coding, harmonic coding of LPC residuals, multi-band excitation (MBE) encoding as disclosed by the present Assignee in the Japanese laid-Open Patent4-91422 or to MBE encoding of LPC residuals, but to vector quantization of the variable dimension input vector using the fixed dimension codebook.

For transient selection, it is possible to select part of the multi-stage quantizer configuration or to search only a shape codebook for transient selection if a codebook is comprised of the shape codebook and a gain codebook and to determine the gain by variable dimension distortion calculations. Alternatively, the above-mentioned pre-selection may be used for the transient selection. Specifically, the similarity between the vector x of the fixed dimension and all code vectors stored in this codebook may be found by approximations (approximation of the weighted distortion) for selecting plural code vectors bearing high degree of similarity. In this case, it is possible to execute the transient fixed-dimension selection by the above-mentioned pre-selection and to execute ultimate selection on the pre-selected candidate code vectors which will minimize the weighted distortion for the variable dimension. It is alternatively possible to execute not only the pre-selection but also the high-precision distortion calculations for precise selection prior to performing the ultimate selection.

Referring to the drawings, specified examples of vector quantization employing the transient selection and ultimate selection will be explained in detail.

In FIG. 12, the codebook 530 is made up of a shape codebook 531 and a gain codebook 532. The shape codebook 531 is made up of two codebooks CB0, CB1. The output code vectors of these shape codebooks CB0 and CB1 are denoted as $s_0$, $s_1$, while the gain g of a gain circuit 533 as determined by the gain codebook 532 is denoted as g. The variable-dimension input vector v from an input terminal 541 is processed with dimensional conversion (referred to herein as D1) by a variable/fixed dimension conversion circuit 542 and thence supplied via terminal 501 as a fixed dimensional vector x to a subtractor 536 of a selection circuit 535 where the difference of the vector x from the fixed-dimension code vector read out from the codebook 530 is found and weighted by a weighting circuit 537 so as to be supplied to an error minimizing circuit 538. The weighting circuit 537 applies a weight W'. The fixed-dimension code vector, read out from the codebook 530, is processed with dimensional conversion (referred to herein as D2) by the variable/fixed dimension conversion circuit 544 and thence supplied to a selector 546 of a variable-dimension selection circuit 545 where the difference of the code vector from the variable dimension input vector v is taken and weighted by a weighting circuit 547 so as to be thence supplied to an error minimizing circuit 548. The weighting circuit 537 applies a weight $W_v$.

The error of the error minimizing circuits 538, 548 means the above-mentioned distortion or distortion measure. The fact that the error or distortion becomes small is equivalent to increased similarity or correlation.

The selection circuit 535 executing the fixed-dimension transient selection searches for $s_0$, $s_1$, g which will minimize the distortion measure $E_1$ represented by the equation (b1):

$$E_1 = \|W'(\underline{x} - g(s_0 + s_1))\|^2 \tag{b1}$$

substantially as explained with reference to the equation (27).

It is noted that the weight W in the weighting circuit 537 is given by $$W' = WH/\|\underline{x}\| \tag{b2}$$

where H denotes a matrix having frequency response characteristics of an LPC synthesis filter as a diagonal element and W denotes a matrix having frequency response characteristics of a perceptual weighting filter as a diagonal element.

First, $s_0$, $s_1$, g which will minimize the distortion measure $E_1$ of the equation (b1) are searched. It is noted that L sets of $s_0$, $s_1$, g are taken, beginning from upper order sides, in the order of reducing the distortion measure $E_1$, by way of transient selection in the fixed dimension. Then, ultimate selection is carried out on the set of L sets of $s_0$, $s_1$, g which minimizes $$E2 = \|W_v(v - D_2 g(s_0 + s_1))\|^2 \tag{b3}$$

as an optimum code vector.

The searching and learning for the equation (b1) is as explained with reference to the equation (27) and the following equations.

The centroid condition for codebook learning based on the equation (b3) is now explained.

For the codebook CB0, as one of the shape codebooks 531 in the codebook 530, an expected value of the distortion concerning all frames k, from which to select the code vector $s_0$, is minimized. If there M such frames, it suffices to minimize $$J = \frac{1}{M} \sum_{k=1}^{M} \|W_{vk}(v_k - g_k D_{2k}(s_{0c} + s_{1k}))\|^2 \tag{b4}$$

For minimizing the equation (b4), the equation (b5):

$$\frac{\partial J}{\partial s_{0c}} = \frac{1}{M}\sum_{k=1}^{M}\{-2g_k D_{2k}^T W_{vk}^T W_{vk} \underline{v}_k + \qquad (b5)$$
$$2g_k^2 D_{2k}^T W_{vk}^T W_{vk} D_{2k} s_{0c} + 2g_k^2 D_{2k}^T W_{vk}^T W_{vk} D_{2k} s_{1k}\} = 0$$

is solved to give $$s_{0c} = \qquad (b6)$$
$$\left\{\sum_{k=1}^{M} g_k^2 D_{2k}^T W_{vk}^T W_{vk} D_{2k}\right\}^{-1} \times \sum_{k=1}^{M}\{g_k D_{2k}^T W_{vk}^T W_{vk}(\underline{v}_k - g_k D_{2k} s_{1k})\}$$

In this equation (b6), $(\ )^{-1}$ denotes an inverse matrix and $W_{vk}^T$ denotes a transposed matrix of $W_{vk}$. This equation (b6) represents an optimum centroid condition for the shape vector $s_0$.

The selection of the code vector $s_1$ for the codebook CB1 of another shape codebook 531 in the codebook 530 is carried out in the same manner as described above and hence the description is omitted for simplicity.

Then, the centroid condition for the gain g from the gain codebook 532 in the codebook 530 is now considered.

An expected value of the distortion for the k'th frame from which to select the code word $g_c$ is given by the equation (b7):

$$J_g = \frac{1}{M}\sum_{k=1}^{M}\|W_{vk}(\underline{v}_k - g_c D_{2k}(s_{0k} + s_{1k}))\|^2 \qquad (b7)$$

For minimizing the equation (b7), the following equation (b8):

$$\frac{\partial J_g}{\partial g_c} = \frac{1}{M}\sum_{k=1}^{M}\{-2\underline{v}_k^T W_{vk}^T W_{vk} D_{2k}(s_{0k} + s_{1k}) + \qquad (b8)$$
$$2g_c(D_{2k}(s_{0k} + s_{1k}))^T W_{vk}^T W_{vk} D_{2k}(s_{0k} + s_{1k})\}$$
$$= 0$$

is solved to give $$g_c = \frac{\sum_{k=1}^{M}\underline{v}_{vk}^T W_{vk}^T W_{vk} D_{2k}(s_{0k} + s_{1k})}{\sum_{k=1}^{M}(D_{2k}(s_{0k} + s_{1k}))^T W_{vk}^T W_{vk} D_{2k}(s_{0k} + s_{1k})} \qquad (b9)$$

This equation (b9) represents the centroid condition for the gain.

Next, the nearest neighbor condition based on the equation (b3) is considered.

Since the number of sets of $s_0$, $s_1$, g to be searched by the equation (b3) is limited to L by the transient selection of the fixed dimension, the equation (b3) is directly calculated with respect to the L sets of $s_0$, $s_1$, g in order to select the set of $s_0$, $s_1$, g which minimizes the distortion $E_2$ as an optimum code vector.

The method of sequentially searching for the shape and the gain which are accepted as being effective when L for transient selection is very large or if $s_0$, $s_1$, g are directly selected in the variable dimension without executing the transient selection, is now explained.

If indices i, j and 1 are added to $s_0$, $s_1$, g of the equation (b3) and the equation (b3) in this form is rewritten, we obtain:

$$E2 = \|W_v(v - D_2 g_1(s_{0i} + s_{1j}))\|^2 \qquad (b10)$$

Although g, $s_{0i}$, $s_{1j}$ which minimize the equation (b10) can be searched on the round robin fashion, if $0 \leq 1 < 32, 0 \leq i \leq 32$ and $0 \leq j \leq 32$, the above equation (b10) needs to be calculated for $32^3 = 32768$ patterns, thus leading to voluminous processing. The method of sequentially searching the shape and the gain is now explained.

The gain $g_1$ is determined after deciding the shape code vectors $s_{0i}$, $s_{1j}$. Setting $s_{0i} + s_{1j} = s_m$, the equation (b10) can be represented by $$E_2 = \|W_v(v - D_2 g_1 s_m)\|^2 \qquad (b11)$$

If we set $v_w = W_v v$, $s_w = W_v D_2 s_m$, the equation (b11) becomes $$E_2 = \|\underline{v}_w - g_l s_w\|^2 = \|\underline{v}_w\|^2 + \|s_w\|^2\left(g_l - \frac{v_w^T s_w}{\|s_w\|^2}\right)^2 - \left(\frac{v_w^T s_w}{\|s_w\|^2}\right)^2 \qquad (b12)$$

Therefore, if $g_1$ can be of sufficient precision, $s_w$ which maximizes $$\frac{(v_w^T s_w)^2}{\|s_w\|^2} \qquad (b13)$$

and $g_1$ closest to $$\frac{v_w^T s_w}{\|s_w\|^2} \qquad (b14)$$

are searched.

Rewriting the equations (b13) and (b14) by substituting the original variables, we obtain the following equations (b15) and (b16).

The sets of $s_{0i}$, $s_{1j}$ which maximizes $$\frac{(v^T W_v^T W_v D_2(s_{0i} + s_{1j}))^2}{\|W_v D_2(s_{0i} + s_{1j})\|^2} \qquad (b15)$$

and $g_1$ closest to $$\frac{v^T W_v^T W_v D_2(s_{0i} + s_{1j})}{\|W_v D_2(s_{0i} + s_{1j})\|^2} \qquad (b16)$$

are searched.

Using the centroid conditions for the shape and the gain of the equations (b6) and (b9) and the optimum encoding conditions (nearest neighbor condition) of the equations ((b15) and (b16), the codebooks (CB0, CB1, CBg)can be learned simultaneously by the generalized LLoyd algorithm (GLA).

As compared to the method employing the equation (27) and so forth, in particular the equations (31), (32) and (35), as described previously, the learning methods employing the above equations (b6), (b9), b(15) and b(16) are excellent in minimizing the distortion after conversion of the original input vector v into variable-dimension vector.

However, since the processing by the equations (b6) and (b9), in particular the equation (b6), is complex, the centroid condition derived from optimizing the equation (b27), that is b(1), using only the nearest neighbor condition of the equations (b15) and (b16) may be used.

It is also advisable to use the method as explained with reference to the Equation (27) and so forth during codebook learning and to use the method employing the equations (b15), (b16) only during searching. It is also possible to execute transient selection in the fixed dimension by the method explained with reference to the equation (27) and so forth and to directly evaluate the equation (b3) only for the set of selected plural (L) vectors for searching.

In any case, by using the search by distortion evaluation by the equation (b3) after the transient selection or in the round robin fashion, it becomes ultimately possible to carry out learning or code vector search with less distortion.

The reason why it is desirable to carry out distortion calculations in the same variable dimension as that of the original input vector v is briefly explained.

If the miniization of the distortion on the fixed dimension is coincident with that on the variable dimension, the distortion minimization in the variable dimension is unnecessary. However, since the dimensional conversion D2 by the fixed/variable dimension conversion circuit 544 is not an orthogonal matrix, the two minimizations are not coincident with each other. Thus, if the distortion is minimized in the fixed dimension, such minimization is not necessarily distortion minimization in the variable dimension, such that, if the vector of the resulting variable dimension vector is to be optimized, it becomes necessary to optimize the distortion in the variable dimension.

Figure 13:
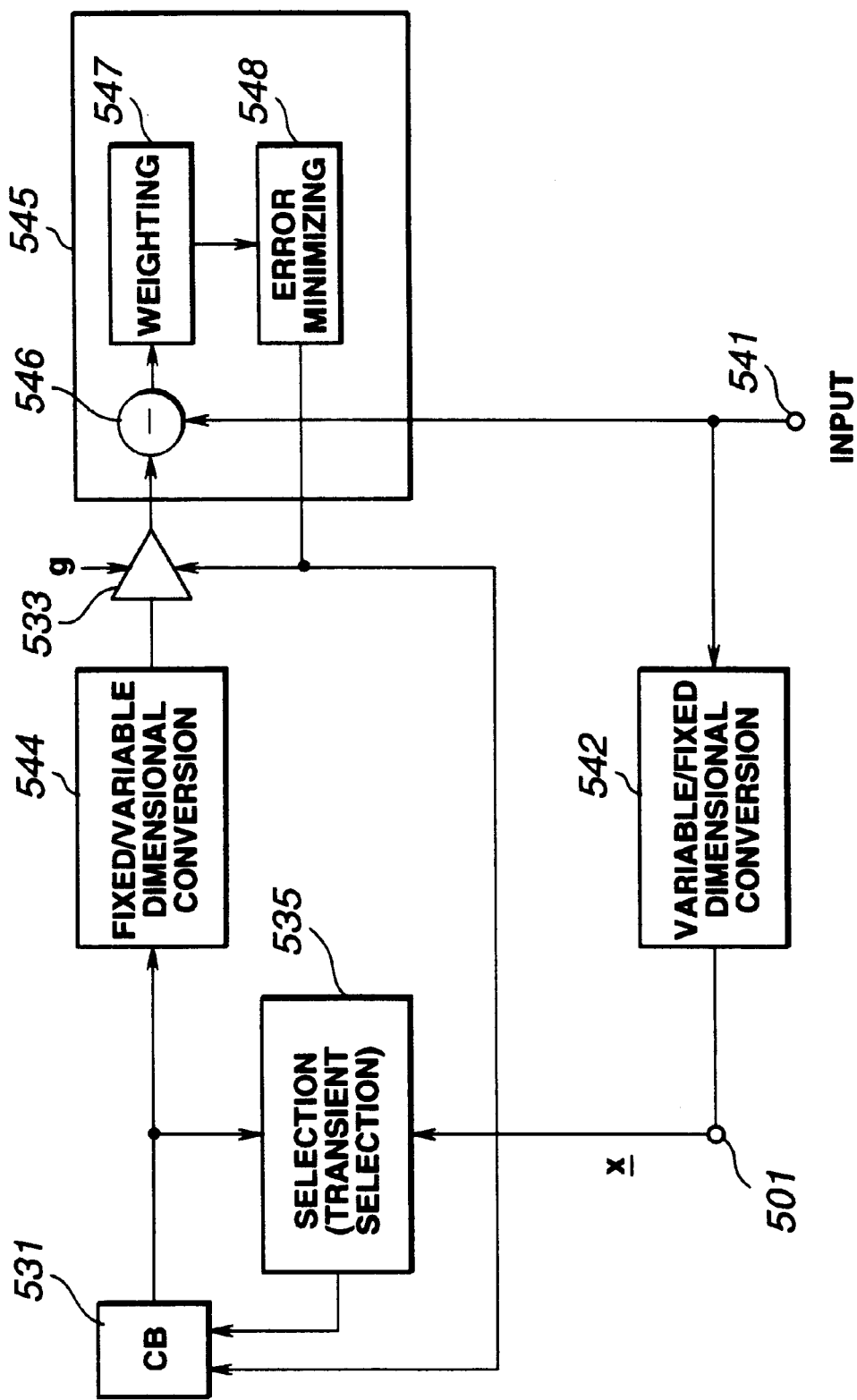
FIG. 13 is a block circuit diagram showing another illustrative structure of a vector quantizer for variable-dimension codebook retrieval.

FIG. 13 shows an instance in which the gain when dividing the codebook into a shape codebook and a gain codebook is the gain in the variable dimension and the distortion is optimized in the variable dimension.

Specifically, the code vector of the fixed dimension read out from the shape codebook 531 is sent to the fixed/variable dimension conversion circuit 544 for conversion into the vector in the variable dimension which is then sent to the gain control circuit 533. It is sufficient if the selection circuit 545 selects the optimum gain in the gain circuit 533 for the code vector processed with the fixed/variable dimension conversion based on the code vector of the variable dimension from the gain control circuit 533 and on the input vector v. Alternatively, the optimum gain may be selected based on the inner product of the input vector to the gain circuit 533 and the input vector v. The structure and the operation are otherwise the same as those of the embodiment shown in FIG. 12.

Turning to the shape codebook 531, the sole code vector may be selected during selection in the variable dimension in the selection circuit 535, while selection in the variable dimension may be made only of the gain.

By multiplying the code vector converted by the fixed/variable dimension conversion circuit 544 with the gain, an optimum gain can be selected with the effect by the fixed/variable dimension conversion taken into account in contrast to the method of fixed/variable dimension conversion of the code vector multiplied by the gain, as shown in FIG. 12.

A further example of vector quantization combining transient selection in the fixed dimension and ultimate selection in the variable dimension is now explained.

In the following example, the first code vector of the fixed dimension, read out from the first codebook, is converted into a variable dimension of the input vector and the second code vector in the fixed dimension read out from the second codebook is summed to the first code vector of the variable dimension processed by the fixed/variable dimension conversion as described above. From the resulting sum code vectors, resulting from the addition, an optimum code vector minimizing the error in the input vector is selected from at least the second codebook.

Figure 14:
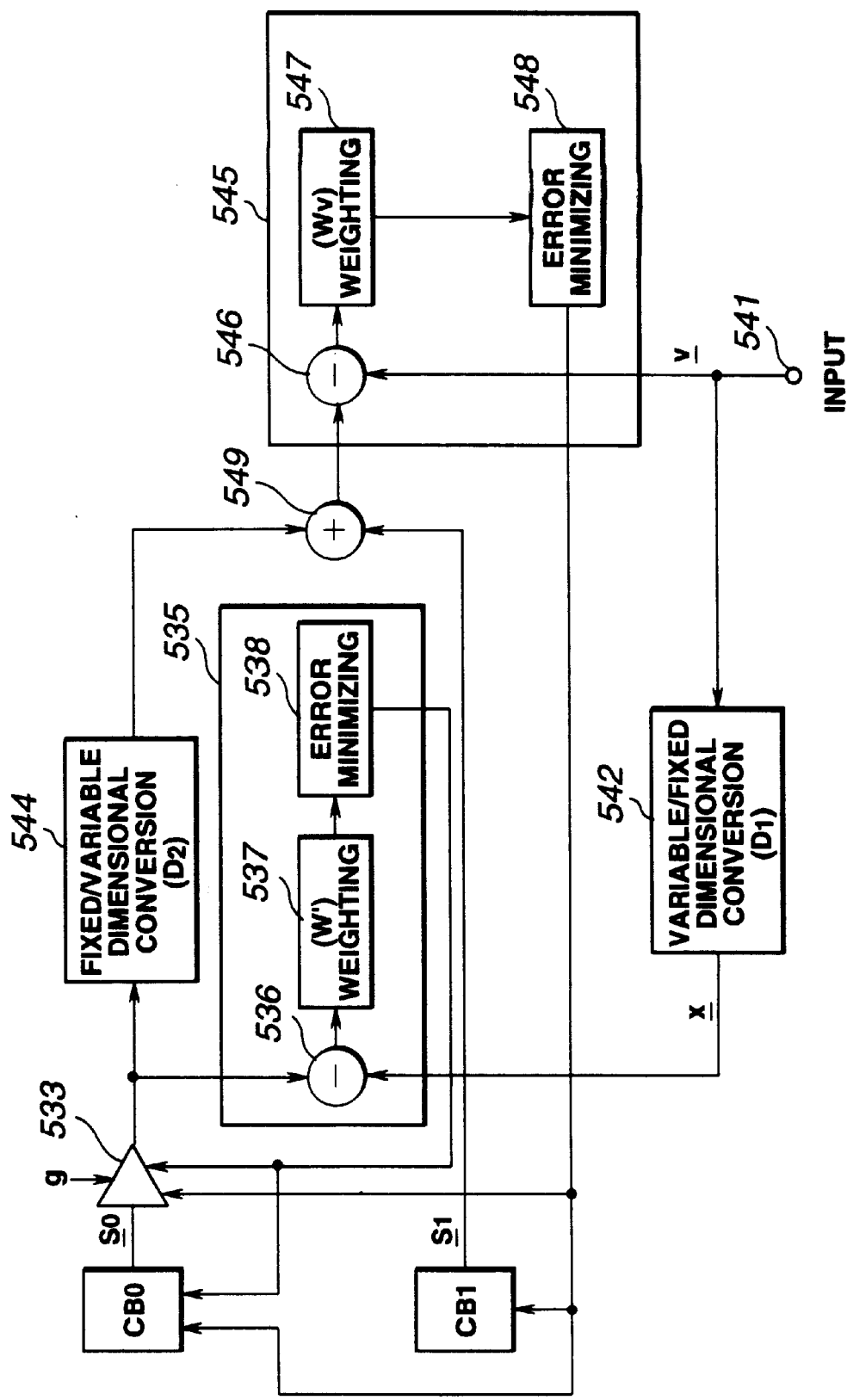
FIG. 14 is a block circuit diagram showing a first illustrative structure of a vector quantizer employing a codebook for variable dimension and a codebook for fixed dimension.

In the example of FIG. 14, the first code vector a in the fixed dimension, read out from the first codebook CB0, is sent to the fixed/variable dimension conversion circuit 544 so as to be converted into the variable dimension equal to that of the input vector v at terminal 541. The second code vector of the fixed dimension, read out from the second codebook CB1, is sent to an adder 549 so as to be summed to the code vector of the variable dimension from the fixed/variable dimension conversion circuit 544. The resulting code vector sum of the adder 549 is sent to the selection circuit 545 where the sum vector from the adder 549 or the optimum code vector minimizing the error from the input vector v is selected. The code vector of the second codebook CB1 is applied to a range from the low side of the harmonics of the input vector to the dimension of the codebook CB1. The gain circuit 533 of the gain g is provided only between the first codebook CB0 and the fixed/variable dimension conversion circuit 544. Since the structure is otherwise the same as that of FIG. 12, similar portions are depicted by the same reference numerals and the corresponding description is omitted for simplicity.

Thus, by adding the code vector remaining in the fixed dimension from the codebook CB1 and the codebook read out from the codebook CB0 and converted into the variable dimension are summed together for subtracting the distortion produced by fixed/variable dimension conversion by the code vector of the fixed dimension from the codebook CB1.

A distortion $E_3$ calculated by the selection circuit 545 of FIG. 14 is given by:

$$E_3 = \|W_v(v - (D_2 g s_0 + s_1))\|^2 \quad \text{(b17)}$$

Figure 15:
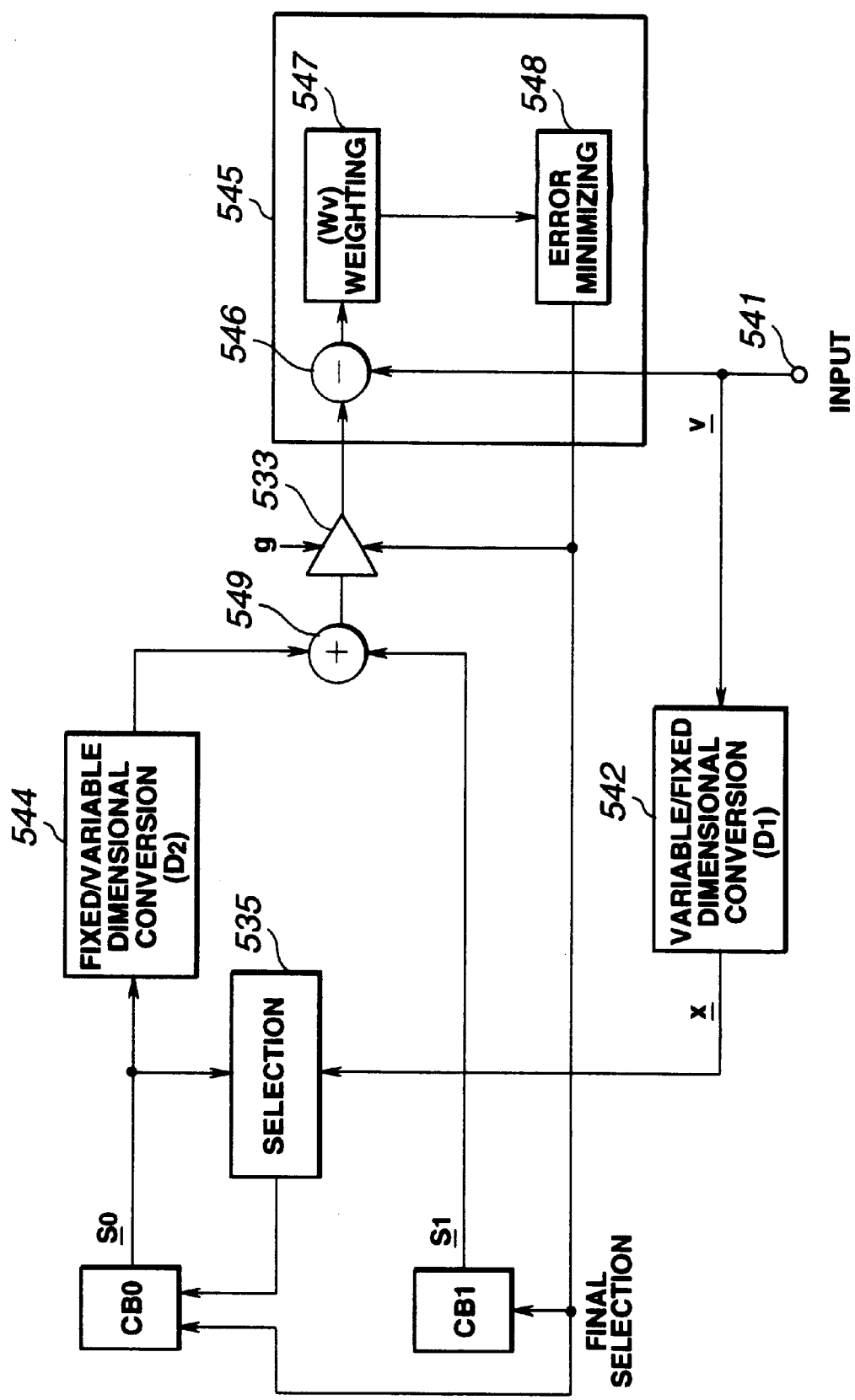
FIG. 15 is a block circuit diagram showing a second illustrative structure of a vector quantizer employing a codebook for variable dimension and a codebook for fixed dimension.

In the example of FIG. 15, the gain circuit 533 is arranged on an output side of the adder 549. Thus, the result of addition of the code vector read out from the first codebook CB0 and converted by the fixed/variable dimension conversion circuit 544 and the code vector read out from the second codebook CB1 is multiplied with the gain g. The common gain is used because the gain to be multiplied with the code vector from the CB0 exhibits strong similarity to the gain multiplied with the code vector from the codebook CB1 for the correcting portion (quantization of the quantization error). The distortion $E_4$ calculated by the selection circuit 545 of FIG. 15 is given by:

$$E_4 = \|W_v(v - g(D_2 g s_0 + s_1))\|^2 \quad \text{(b18)}$$

This example is otherwise the same as that of the example of FIG. 14 and hence the explanation is omitted for simplicity.

Figure 16:
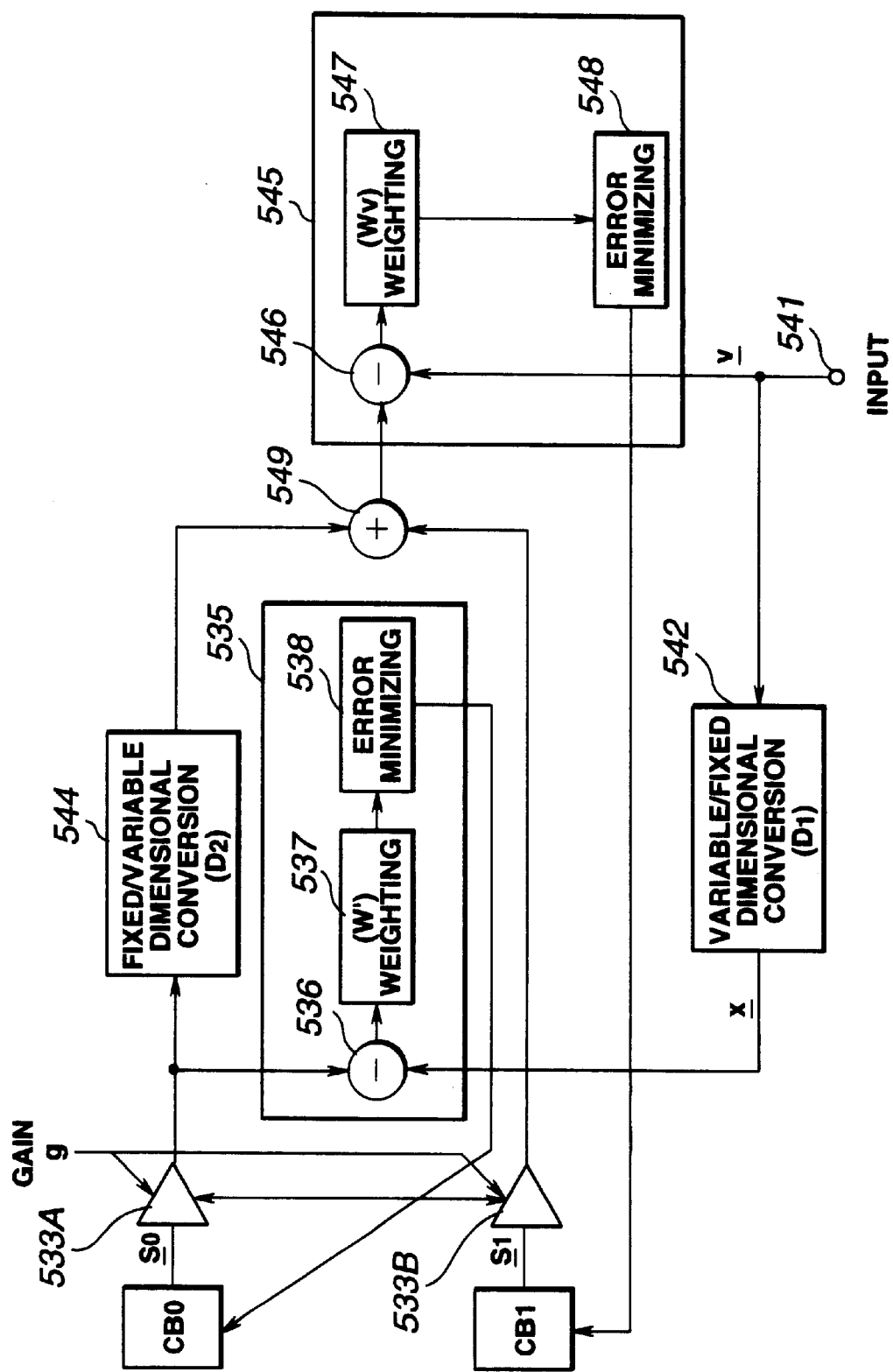
FIG. 16 is a block circuit diagram showing a third illustrative structure of a vector quantizer employing a codebook for variable dimension and a codebook for fixed dimension.

In the example of FIG. 16, not only a gain circuit 535A having a gain g is provided on an output side of the first codebook CB0 in the example of FIG. 14, but a gain circuit 533B having a gain g is provided on the output side of the second codebook CB1. The distortion calculated by the selection circuit 545 of FIG. 16 is equal to the distortion $E_4$ shown in the equation (b18). The configuration of the example of FIG. 16 is otherwise the same as that of the example of FIG. 14, so that the corresponding description is omitted for simplicity.

Figure 17:
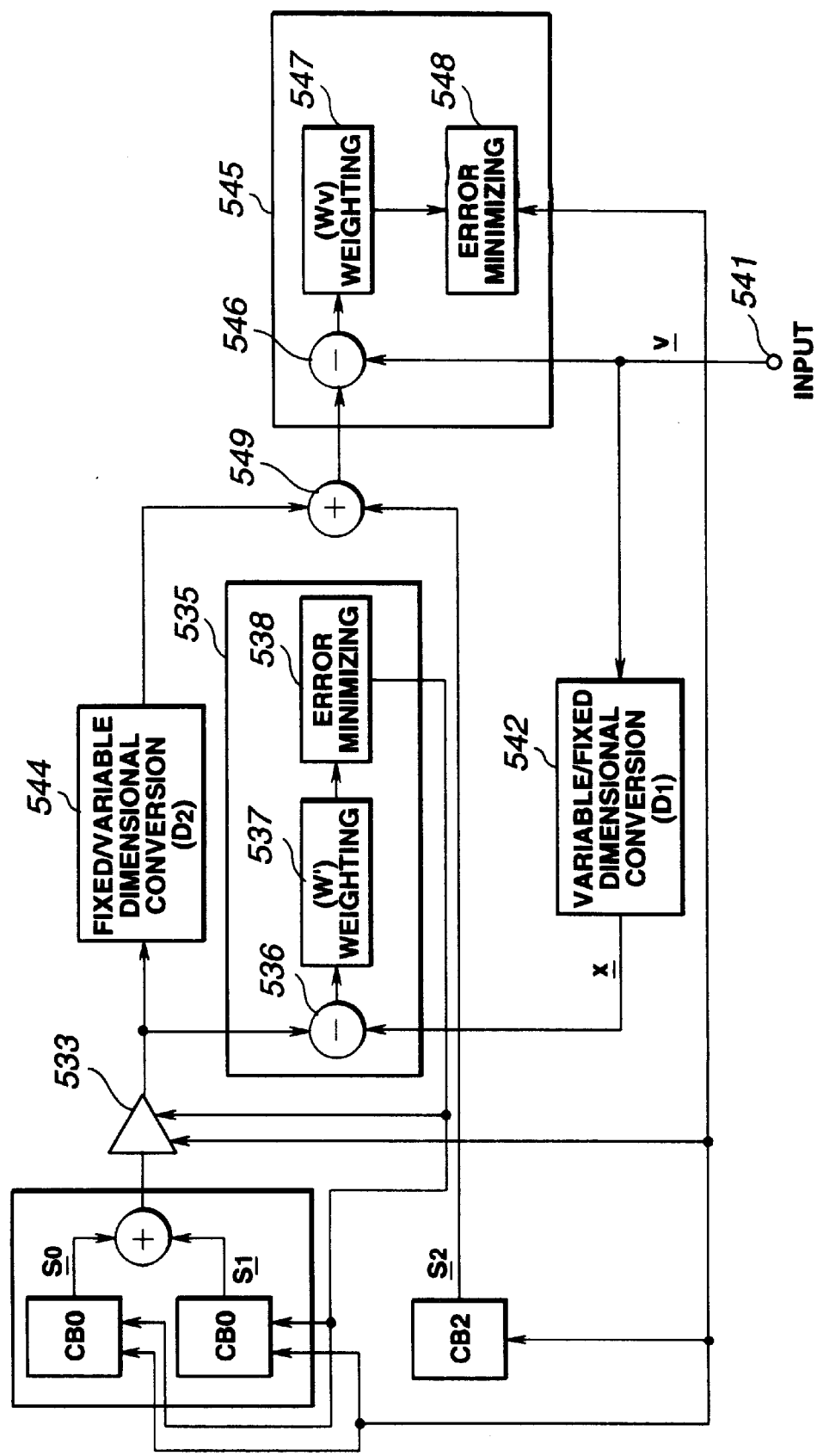
FIG. 17 is a block circuit diagram showing a fourth illustrative structure of a vector quantizer employing a codebook for variable dimension and a codebook for fixed dimension.

FIG. 17 shows an example n which the first codebook of FIG. 14 is constructed by two shape codebooks CB0, CB1. The code vectors $s_0$, $s_1$ from these shape codebooks are summed together and the resulting sum is multiplied by the gain g by the gain circuit 533 before being sent to the fixed/variable dimension conversion circuit 544. The variable dimension code vector from the fixed/variable dimension conversion circuit 544 and the code vector $s_2$ from the second cdebook CB2 are summed together by the adder 549 before being sent to the selection circuit 545. The distortion $E_5$ as found by the selection circuit 545 of FIG. 17 is given by:

$$E_5=\|W_v(v-(gD_2(s_0+s_1)+s_2))\|^2 \quad (b19)$$

The configuration of the example of FIG. 16 is otherwise the same as that of the example of FIG. 14, so that the corresponding description is omitted for simplicity.

The searching method in the equation (b18) is now explained.

As an example, the first searching method includes searching $s_{0i}$, $g_1$ which minimizes $$E_4'=\|W(\underline{x}-g_1 s_{0i})\|^2 \quad (b20)$$

and then searching s which minimizes $$E_4=\|W_v(v-g_1(D_2 s_{0i}+s_{0i}))\|^2 \quad (b21)$$

As another example, such $s_{0i}$ that maximizes $$\frac{(s_{0i}^T W'^T W' \underline{x})^2}{\|W' s_{0i}\|^2} \quad (b22)$$

is searched, such $s_{1j}$ that maximizes $$\frac{(\underline{v}^T W_v^T W_v(D_2 s_{0i}+\underline{s}_{1j}))^2}{\|W_v(D_2 s_{0i}+\underline{s}_{1j})\|^2} \quad (b23)$$

is searched and such gain $g_1$ that is closest to $$\frac{\underline{v}^T W_v^T W_v(D_2 s_{0i}+\underline{s}_{1j})}{\|W_v^T(D_2 s_{0i}+\underline{s}_{1j})\|^2} \quad (b24)$$

is searched.

As a third searching method, such $s_{0i}$ and $g_1$ as minimizes $$E_4'=\|W(\underline{x}-g_1 s_{0i})\|^2 \quad (b25)$$

are searched, then such $s_{1j}$ as maximizes $$\frac{(\underline{v}^T W_v^T W_v(D_2 s_{0i}+\underline{s}_{1j}))^2}{\|W_v(D_2 s_{0i}+\underline{s}_{1j})\|^2} \quad (b26)$$

is searched, and the gain $g_1$ closest to $$\frac{\underline{v}^T W_v^T W_v(D_2 s_{0i}+\underline{s}_{1j})}{\|W_v^T(D_2 s_{0i}+\underline{s}_{1j})\|^2} \quad (b27)$$

is ultimately selected.

Next, the centroid condition of the equation (b20) of the first searching method is explained. With the centroid $s_{0c}$ of the code vector $s_{0i}$, $$J=\frac{1}{M}\sum_{k=1}^{M}\|W_k'(\underline{x}_k - g_k s_{0c})\|^2 \quad (b28)$$

is minimized. For this minimization, $$\frac{\partial J}{\partial \underline{s}_{0C}}=\frac{1}{M}\sum_{k=1}^{M}(-2g_k W_k'^T W_k' \underline{x}_k + 2g_k^2 W_k'^T W_k' s_{0c})=0 \quad (b29)$$

is solved to give $$s_{0C}=\left\{\sum_{k=1}^{M} g_k^2 W_k'^T W_k'\right\}^{-1}\sum_{k=1}^{M} g_k W_k'^T W_k' \underline{x}_k \quad (b30)$$

Similarly, for the centroid $g_c$ of the gain g, $$J=\frac{1}{M}\sum_{k=1}^{M}\|W_k'(\underline{x}_k - g_c s_{0k})\|^2 \quad (b31)$$

and $$\frac{\partial J}{\partial g_c}=\frac{1}{M}\sum_{k=1}^{M}(-2 s_{0k} W_k'^T W_k' \underline{x}_k + 2g_c s_{0k}^T W_k'^T W_k' s_{0k})=0 \quad (b32)$$

from the above equation (b20) are solved to give $$g_c=\frac{\sum_{k=1}^{M} s_{0k}^T W_k'^T W_k' \underline{x}_k}{\sum_{k=1}^{M} s_{0k}^T W_k'^T W_k' s_{0k}} \quad (b33)$$

On the other hand, as the centroid condition of the equation (b21) of the first search method, $$J=\frac{1}{M}\sum_{k=1}^{M}\|W_{vk}(\underline{v}_k - g_k(D_{2k} s_{0k}+s_{1C}))\|^2 \quad (b34)$$

and $$\frac{\partial J}{\partial \underline{s}_{1C}}= \quad (b35)$$

$$\frac{1}{M}\sum_{k=1}^{M}\{-2g_k W_{vk}^T W_{vk} \underline{v}_k + 2g_k^2 W_{vk}^T W_{vk} D_{2k} s_{0k} + 2g_k^2 W_{vk}^T W_{vk} s_{1C}\}=0$$

are solved for the centroid $s_{1c}$ of the vector $s_{1j}$ to give $$s_{1C}=\left\{\sum_{k=1}^{M} g_k^2 W_{vk}^T W_{vk}\right\}^{-1}\sum_{k=1}^{M} g_k W_{vk}^T W_{vk}(\underline{v}_k - g_k D_{2k} s_{0k}) \quad (b36)$$

From the equation (b21), the centroid $s_{0c}$ of the vector $s_{0i}$ is found to give $$J=\frac{1}{M}\sum_{k=1}^{M}\|W_{vk}(\underline{v}_k - g_k(D_{2k} s_{0c}+s_{1k}))\|^2 \quad (b37)$$

$$\frac{\partial J}{\partial \underline{s}_{0C}}=\frac{1}{M}\sum_{k=1}^{M}\{-2g_k D_{2k}^T W_{vk}^T W_{vk} \underline{v}_k + 2g_k^2 D_{2k}^T W_{vk}^T W_{vk} D_{2k} s_{0c} + 2g_k^2 D_{2k}^T W_{vk}^T W_{vk} \underline{s}_{1k}\}=0 \quad (b38)$$

and $$s_{0C} = \left\{\sum_{k=1}^{M} g_k^2 D_{2k}^T W_{vk}^T W_{vk} D_{2k}\right\}^{-1} \sum_{k=1}^{M} g_k D_{2k}^T W_{vk}^T W_{vk} (\underline{v}_k - g_k \underline{s}_{1k}) \quad (b39)$$

Similarly, the centroid $g_c$ of te gain g can be found by $$g_c = \frac{\sum_{k=1}^{M} \underline{v}_k^T W_{vk}^T W_{vk} (D_{2k} \underline{s}_{0k} + \underline{s}_{1k})}{\sum_{k=1}^{M} (D_{2k} \underline{s}_{0k} + \underline{s}_{1k})^T W_{vk}^T W_{vk} (D_{2k} \underline{s}_{0k} + \underline{s}_{1k})} \quad (b40)$$

The method of calculating the centroid of the code vector $s_{0i}$ by the above equation (b20) and the method of calculating the centroid $g_c$ of the of the gain g are shown by the equation (b33). As the methods of calculating the centroid by the equation (b21), the centroid $s_{1c}$ of the vector $s_{1j}$, the centroid $s_{1c}$ of the vector $s_{1j}$ and the centroid $g_c$ of the gain g are shown by the equations (b36), (b39) and (b)40), respectively.

In the learning of the codebook by the actual GLA, a method of simultaneously learning $s_0$, $s_1$, g using the equations (b30), (b36) and (b40) may be cited. It is noted that the above equations (b22), (b23) and (b24) may be used for the searching method (nearest neighbor condition). In addition, various combinations of the centroid conditions, shown by the equations (b30), (b33), (b36), (b39), (b36) or (b40) may optionally be employed.

The search method for the distortion measure of the equation (b17) corresponding to FIG. 14 is explained. In this case, it suffices to search $s_{0i}$, $g_1$ which will minimize $$E_3' = \|W(\underline{x} - g_1 \underline{s}_{0i}))\|^2 \quad (b41)$$

and subsequently to search $s_{1j}$ which minimizes $$E_3 = \|W_v(\underline{x} - g_1(D_2 \underline{s}_{0i} + \underline{s}_{1j}))\|^2 \quad (b42)$$

In the above equation (b41), it is not practical to poll all sets of $g_1$ and $s_{0i}$, so an upper L number of the vectors $s_{0i}$ which maximize $$\frac{(\underline{x}^T W'^T W' \underline{s}_{0i})^2}{\|W' \underline{s}_{0i}\|^2} \quad (b43)$$

an L number of the gain closest to $$\frac{\underline{x}^T W'^T W' \underline{s}_{0i}}{\|W' \underline{s}_{0i}\|^2} \quad (b44)$$

in association with the above equation (b43) and $s_{1j}$ which minimzes $$E_3 = \|W_v(v - (D_2 \, gs_{0i} + s_{1j}))\|^2 \quad (b45)$$

are searched.

Next the centroid conditions are derived from the equations (b41) and (b42). In this case, the procedure is varied depending on which equation is used.

First, if the equation (b41) is used, and the centroid of the code vectors $s_{0i}$ is $s_{0i}$, then $$J = \frac{1}{M} \sum_{k=1}^{M} \|W_k'(\underline{x}_k - g_k \underline{s}_{0c})\|^2 \quad (b46)$$

is minimized to obtain $$s_{0c} = \left\{\sum_{k=1}^{M} g_k^2 W_k'^T W_k'\right\}^{-1} \sum_{k=1}^{M} \{g_k W_k'^T W_k' \underline{x}_k\} \quad (b47)$$

Similarly, as for the centroid $g_c$, the following equation:

$$g_c = \frac{\sum_{k=1}^{M} \underline{s}_{0k}^T W_k'^T W_k' \underline{x}_k}{\sum_{k=1}^{M} \underline{s}_{0k}^T W_k'^T W_k \underline{s}_{0k}} \quad (b48)$$

is obtained by the above equation (b41), as in the case of the equation (b43).

If the centroid $s_{1c}$ of the vector $s_{1j}$ is to be found using the equation (b42), $$J = \frac{1}{M} \sum_{k=1}^{M} \|W_{vk}(\underline{v}_k - D_{2k} g_k \underline{s}_{0k} - \underline{s}_{1c})\|^2 \quad (b49)$$

and $$\frac{\partial J}{\partial \underline{s}_{1C}} = \frac{1}{M} \sum_{k=1}^{M} \{2 W_{vk}^T W_{vk} \underline{s}_{1c} - 2 W_{vk}^T W_{vk} \underline{v}_k + 2 g_k W_{vk}^T W_{vk} D_{2k} \underline{s}_{0k}\} = 0 \quad (b50)$$

are solved to give $$s_{1C} = \left\{\sum_{k=1}^{M} W_{vk}^T W_{vk}\right\}^{-1} \sum_{k=1}^{M} W_{vk}^T W_{vk} (\underline{v}_k - g_k D_{2k} \underline{s}_{0k}) \quad (b51)$$

Similarly, the centroid $s_{0c}$ of the code vector $s_{0i}$ and the centroid $g_c$ of the gain g can be found from the equation (b42).

$$s_{0C} = \left\{\sum_{k=1}^{M} g_k^2 D_{2k}^T W_{vk}^T W_{vk} D_{2k}\right\}^{-1} \sum_{k=1}^{M} g_k D_{2k}^T W_{vk}^T W_{vk} (\underline{v}_k - g_k \underline{s}_{1k}) \quad (b52)$$

$$J = \frac{1}{M} \sum_{k=1}^{M} \{\underline{v}_k^T W_{vk}^T W_{vk} \underline{v}_k + g_c^2 (D_{2k} \underline{s}_{0k})^T W_{vk}^T W_{vk} D_{2k} \underline{s}_{0k} + \quad (b53)$$
$$\underline{s}_{1k}^T W_{vk}^T W_{vk} \underline{s}_{1k} - 2 g_c (D_{2k} \underline{s}_{0k})^T W_{vk}^T W_{vk} \underline{v}_k -$$
$$2 \underline{s}_{1k}^T W_{vk}^T W_{vk} \underline{v}_k + 2 \underline{s}_{1k}^T W_{vk}^T W_{vk} D_{2k} \underline{s}_{0k} g_c\}$$

$$\frac{\partial J}{\partial g_c} = \frac{1}{M} \sum_{k=1}^{M} \{2 g_c (D_{2K} \underline{s}_{0k})^T W_{vk}^T W_{vk} D_{2K} \underline{s}_{0k} - \quad (b54)$$
$$2 (D_{2K} \underline{s}_{0k})^T W_{vk}^T W_{vk} \underline{v}_k + 2 \underline{s}_{1k}^T W_{vk}^T W_{vk} D_{2K} \underline{s}_{0k}\} = 0$$

-continued $$g_c = \frac{\sum_{k=1}^{M} \{(D_{2K}s_{0k})^T W_{vk}^T W_{vk}(\underline{v}_k - \underline{s}_{1k})\}}{\sum_{k=1}^{M} \{(D_{2K}s_{0k})^T W_{vk}^T W_{vk} D_{2K}s_{0k}\}} \quad (b55)$$

Meanwhile, the codebook learning by GLA may be carried out using the above equations (b47), (b48) or (b51) or using the above equations (b51), (b52) or (b55).

Figure 18:
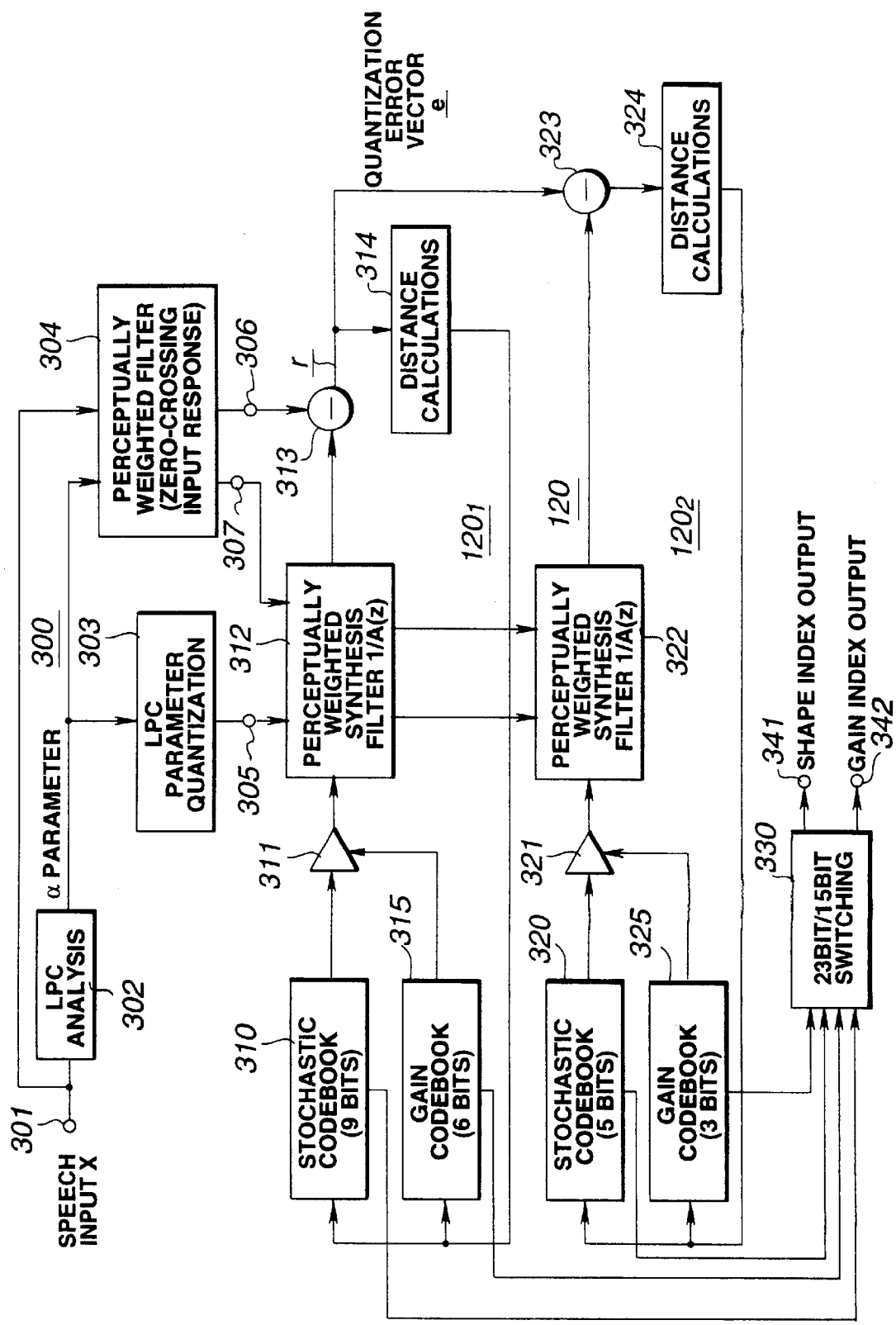
FIG. 18 is a block circuit diagram showing a specified structure of a CULP encoding portion (second encoder) of the speech encoding device according to the present invention.

The second encoding unit 120 employing the CELP encoding configuration of the present invention has a multi-stage vector quantization processing portions (a two-stage encoding portions $120_1$ and $120_2$ in the embodiment of FIG. 18). The configuration of FIG. 18 is designed to cope with the transmission bit rate of 6 kbps in case the transmission bit rate can be switched between e.g., 2 kbps and 6 kbps, and to switch the shape and gain index output between 23 bits/5 msec and 15 bits/5msec. The processing flow in the configuration of FIG. 18 is as shown in FIG. 19.

Referring to FIG. 18, a first encoding unit 300 of FIG. 18 is equivalent to the first encoding unit 113 of FIG. 3, an LPC analysis circuit 302 of FIG. 18 corresponds to the LPC analysis circuit 132 shown in FIG. 3, while an LSP parameter quantization circuit 303 corresponds to the constitution from the α to LSP conversion circuit 133 to the LSP to α conversion circuit 137 of FIG. 3 and a perceptually weighted filter 304 of FIG. 18 corresponds to the perceptual weighting filter calculation circuit 139 and the perceptually weighted filter 125 of FIG. 3. Therefore, in FIG. 18, an output which is the same as that of the LSP to α conversion circuit 137 of the first encoding unit 113 of FIG. 3 is supplied to a terminal 305, while an output which is the same as the output of the perceptually weighted filter calculation circuit 139 of FIG. 3 is supplied to a terminal 307 and an output which is the same as the output of the perceptually weighted filter 125 of FIG. 3 is supplied to a terminal 306. However, in distinction from the perceptually weighted filter 125, the perceptually weighted filter 304 of FIG. 18 generates the perceptually weighted signal, that is the same signal as the output of the perceptually weighted filter 125 of FIG. 3, using the input speech data and pre-quantization α-parameter, instead of using an output of the LSP-α conversion circuit 137.

In the two-stage second encoding units $120_1$ and $120_2$, shown in FIG. 18, subtractors 313 and 323 correspond to the subtractor 123 of FIG. 3, while the distance calculation circuits 314, 324 correspond to the distance calculation circuit 124 of FIG. 3. In addition, the gain circuits 311, 321 correspond to the gain circuit 126 of FIG. 3, while stochastic codebooks 310, 320 and gain codebooks 315, 325 correspond to the noise codebook 121 of FIG. 3.

Figure 19:
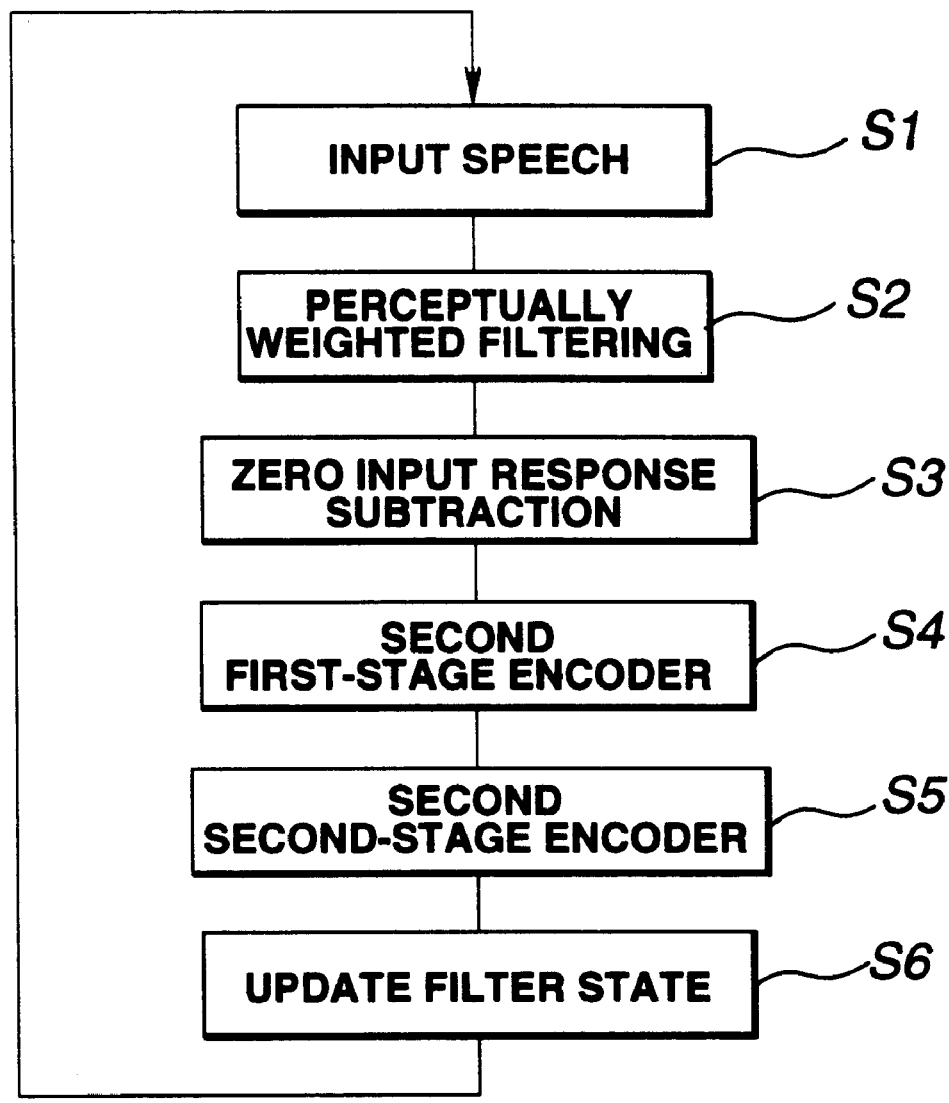
FIG. 19 is a flowchart showing processing flow in the arrangement shown in FIG. 16.

In the constitution of FIG. 18, the LPC analysis circuit 302 at step S1 of FIG. 19 splits input speech data $\underline{x}$ supplied from a terminal 301 into frames as described above to perform LPC analysis in order to find an α-parameter. The LSP parameter quantization circuit 303 converts the α-parameter from the LPC analysis circuit 302 into LSP parameters to quantize the LSP parameters. The quantized LSP parameters are interpolated and converted into α-parameters. The LSP parameter quantization circuit 303 generates an LPC synthesis filter function 1/H (z) from the α-parameters converted from the quantized LSP parameters, that is, the quantized LSP parameters, and sends the generated LPC synthesis filter function 1/H (z) to a perceptually weighted synthesis filter 312 of the first-stage second encoding unit $120_1$ via terminal 305.

The perceptual weighting filter 304 finds data for perceptual weighting, which is the same as that produced by the perceptually weighting filter calculation circuit 139 of FIG. 3, from the α-parameter from the LPC analysis circuit 302, that is, pre-quantization α-parameter. These weighting data are supplied via terminal 307 to the perceptually weighting synthesis filter 312 of the first-stage second encoding unit $120_1$. The perceptual weighting filter 304 generates the perceptually weighted signal, which is the same signal as that outputted by the perceptually weighted filter 125 of FIG. 3, from the input speech data and the pre-quantization α-parameter, as shown at step S2 in FIG. 19. That is, the LPC synthesis filter function W(z) is first generated from the pre-quantization α-parameter. The filter function W(z) thus generated is applied to the input speech data $\underline{x}$ to generate $\underline{x}_w$, which is supplied as the perceptually weighted signal via terminal 306 to the subtractor 313 of the first-stage second encoding unit $120_1$.

In the first-stage second encoding unit $120_1$, a representative value output of the stochastic codebook 310 of the 9-bit shape index output is sent to the gain circuit 311 which then multiplies the representative output from the stochastic codebook 310 with the gain (scalar) from the gain codebook 315 of the 6-bit gain index output. The representative value output, multiplied with the gain by the gain circuit 311, is sent to the perceptually weighted synthesis filter 312 with 1/A(z)=(1/H(z))*W(z). The weighting synthesis filter 312 sends the 1/A(z) zero-input response output to the subtractor 313, as indicated at step S3 of FIG. 19. The subtractor 313 performs subtraction on the zero-input response output of the perceptually weighting synthesis filter 312 and the perceptually weighted signal $\underline{x}_w$ from the perceptual weighting filter 304 and the resulting difference or error is taken out as a reference vector r. During searching at the first-stage second encoding unit $120_1$, this reference vector r is sent to the distance calculating circuit 314 where the distance is calculated and the shape vector s and the gain g minimizing the quantization error energy E are searched, as shown at step S4 in FIG. 19. Here, 1/A(z) is in the zero state. That is, if the shape vector s in the codebook synthesized with 1/A(z) in the zero state is $s_{syn}$, the shape vector s and the gain g minimizing the equation (40):

$$E = \sum_{n=0}^{N-1} (r(n) - gs_{syn}(n))^2 \quad (40)$$

are searched.

Although s and g minimzg the quantization error energy E may be full-searched, the following method may be used for reducing the amount of calculations.

The first method is to search the shape vector s minimizing $E_s$ defined by the following equation (41):

$$E_s = \frac{\sum_{n=0}^{N-1} r(n)s_{syn}(n)}{\sqrt{\sum_{n=0}^{N-1} s_{syn}(n)^2}} \quad (41)$$

From s obtained by the first method, the ideal gain is as shown by the equation (42):

$$g_{ref} = \frac{\sum_{n=0}^{N-1} r(n) s_{syn}(n)}{\sum_{n=0}^{N-1} s_{syn}(n)^2} \qquad (42)$$

Therefore, as the second method, such g minimizing the equation (43):

$$Eg = (g_{ref} - g)^2 \qquad (43)$$

is searched.

Since E is a quadratic function of g, such g miriinzing Eg minimizes E.

From s and g obtained by the first and second methods, the quantization error vector e can be calculated by the following equation (44):

$$e = r - g s_{syn} \qquad (44)$$

This is quantized as a reference of the second-stage second encoding unit $120_2$ as in the first stage.

That is, the signal supplied to the terminals 305 and 307 are directly supplied from the perceptually weighted synthesis filter 312 of the first-stage second encoding unit $120_1$ to a perceptually weighted synthesis filter 322 of the second stage second encoding unit $120_2$. The quantization error vector e found by the first-stage second encoding unit $120_1$ is supplied to a subtractor 323 of the second-stage second encoding unit $120_2$.

At step S5 of FIG. 19, processing similar to that performed in the first stage occurs in the second-stage second encoding unit $120_2$ is performed. That is, a representative value output from the stochastic codebook 320 of the 5-bit shape index output is sent to the gain circuit 321 where the representative value output of the codebook 320 is multiplied with the gain from the gain codebook 325 of the 3-bit gain index output. An output of the weighted synthesis filter 322 is sent to the subtractor 323 where a difference between the output of the perceptually weighted synthesis filter 322 and the first-stage quantization error vector e is found. This difference is sent to a distance calculation circuit 324 for distance calculation in order to search the shape vector s and the gain g minimizing the quantization error energy E.

The shape index output of the stochastic codebook 310 and the gain index output of the gain codebook 315 of the first-stage second encoding unit $120_1$ and the index output of the stochastic codebook 320 and the index output of the gain codebook 325 of the second-stage second encoding unit $120_2$ are sent to an index output switching circuit 330. If 23 bits are outputted from the second encoding unit 120, the index data of the stochastic codebooks 310, 320 and the gain codebooks 315, 325 of the first-stage and second-stage second encoding units $120_1$, $120_2$ are summed and outputted. If 15 bits are outputted, the index data of the stochastic codebook 310 and the gain codebook 315 of the first-stage second encoding unit $120_1$ are outputted.

The filter state is then updated for calculating zero-input response output as shown at step S6.

In the present embodiment, the number of index bits of the second-stage second encoding unit $120_2$ is as small as 5 for the shape vector, while that for the gain is as small as 3. If suitable shape and gain are not present in this case in the codebook, the quantization error is likely to be increased, instead of being decreased.

Although 0 may be provided in the gain for preventing this problem from occurring, there are only three bits for the gain. If one of these is set to 0, the quantizer performance is significantly deteriorated. In this consideration, an all-0 vector is provided for the shape vector to which a larger number of bits have been allocated. The above-mentioned search is performed, with the exclusion of the all-zero vector, and the all-zero vector is selected if the quantization error has ultimately been increased. The gain is arbitrary. This makes it possible to prevent the quantization error from being increased in the second-stage second encoding unit $120_2$.

Although the two-stage arrangement has been described above with reference to FIG. 18, the number of stages may be larger than 2. In such case, if the vector quantization by the first-stage closed-loop search has come to a close, quantization of the N'th stage, where $2 \leq N$, is carried out with the quantization error of the (N−1)st stage as a reference input, and the quantization error of the of the N'th stage is used as a reference input to the (N+1)st stage.

It is seen from FIGS. 18 and 19 that, by employing multi-stage vector quantizers for the second encoding unit, the amount of calculations is decreased as compared to that with the use of straight vector quantization with the same number of bits or with the use of a conjugate codebook. In particular, in CELP encoding in which vector quantization of the time-axis waveform employing the closed-loop search by the analysis by synthesis method is performed, a smaller number of search operations is crucial. In addition, the number of bits can be easily switched by switching between employing both index outputs of the two-stage second encoding units $120_1$, $120_2$ and employing only the output of the first-stage second encoding unit 120, without employing the output of the second-stage second encoding unit $120_1$. If the index outputs of the first-stage and second-stage second encoding units $120_1$, $120_2$ are combined and outputted, the decoder can easily cope with the configuration by selecting one of the index outputs. That is, the decoder can easily cope with the configuration by decoding the parameter encoded with e.g., 6 kbps using a decoder operating at 2 kbps. In addition, if zero-vector is contained in the shape codebook of the second-stage second encoding unit $120_2$, it becomes possible to prevent the quantization error from being increased with lesser deterioration in performance than if 0 is added to the gain.

The code vector of the stochastic codebook (shape vector) can be generated by, for example, the following method.

The code vector of the stochastic codebook, for example, can be generated by clipping the so-called Gaussian noise. Specifically, the codebook may be generated by generating the Gaussian noise, clipping the Gaussian noise with a suitable threshold value and normalizing the clipped Gaussian noise.

However, there are a variety of types of sounds in speech. For example, the Gaussian noise can cope with speech of consonant sounds close to noise, such as "sa, shi, su, se and so", while the Gaussian noise cannot cope with the speech of acutely rising consonants, such as "pa, pi, pu, pe and po".

Figure 20A:
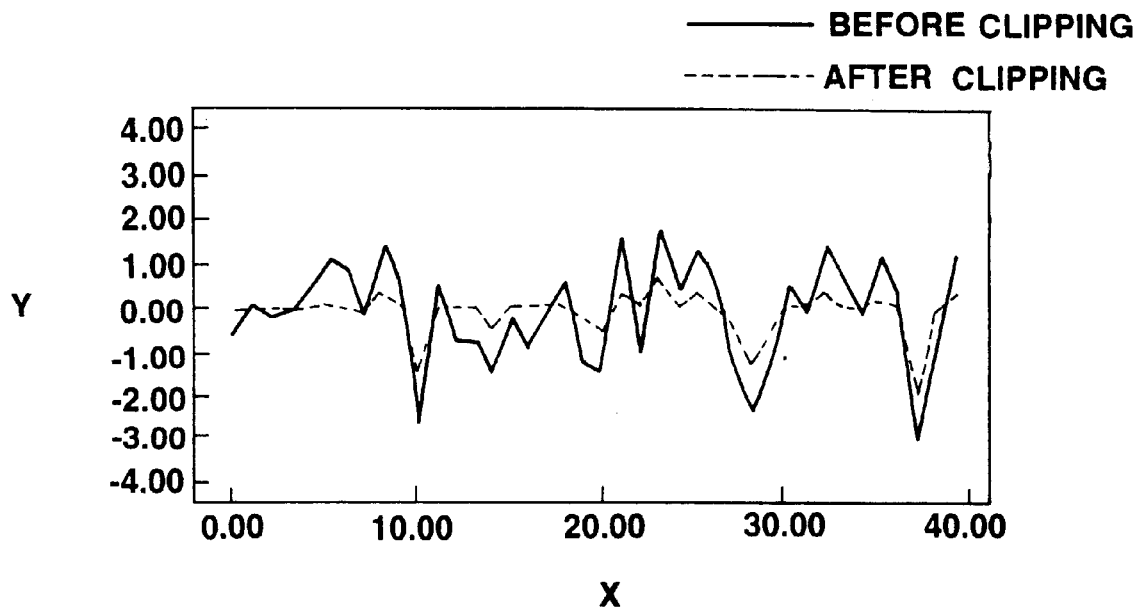
FIGS. 20A and 20B show the state of the Gaussian noise and the noise after clipping at different threshold values.
Figure 20B:
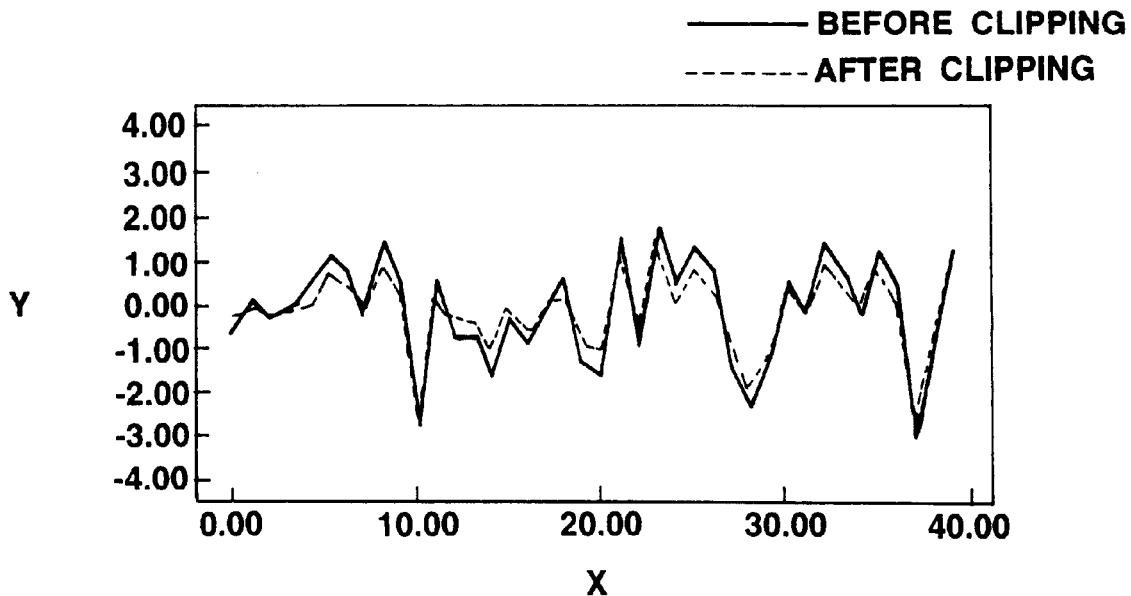

According to the present invention, the Gaussian noise is applied to some of the code vectors, while the remaining portion of the code vectors is dealt with by learning, so that both the consonants having sharply rising consonant sounds and the consonant sounds close to the noise can be coped with. If, for example, the threshold value is increased, such vector is obtained which has several larger peaks, whereas, if the threshold value is decreased, the code vector is approximate to the Gaussian noise. Thus, by increasing the variation in the clipping threshold value, it becomes possible to cope with consonants having sharp rising portions, such as "pa, pi, pu, pe and po" or consonants close to noise, such as "sa, shi, su, se and so", thereby increasing clarity. FIG. 20 shows the appearance of the Gaussian noise and the clipped noise by a solid line and by a broken line, respectively. FIGS. 20A and 20B show the noise with the clipping threshold value equal to 1.0, that is with a larger threshold value, and the noise with the clipping threshold value equal to 0.4, that is with a smaller threshold value. It is seen from FIGS. 20A and 20B that, if the threshold value is selected to be larger, there is obtained a vector having several larger peaks, whereas, if the threshold value is selected to a smaller value, the noise approaches to the Gaussian noise itself.

For realizing this, an initial codebook is prepared by clipping the Gaussian noise and a suitable number of non-learning code vectors are set. The non-learning code vectors are selected in the order of the increasing variance value for coping with consonants close to the noise, such as "sa, shi, su, se and so". The vectors found by learning use the LBG algorithm for learning. The encoding under the nearest neighbor condition uses both the fixed code vector and the code vector obtained on learning. In the centroid condition, only the code vector to be learned is updated. Thus the code vector to be learned can cope with sharply rising consonants, such as "pa, pi, pu, pe and po".

An optimum gain may be learned for these code vectors by usual learning.

Figure 21:
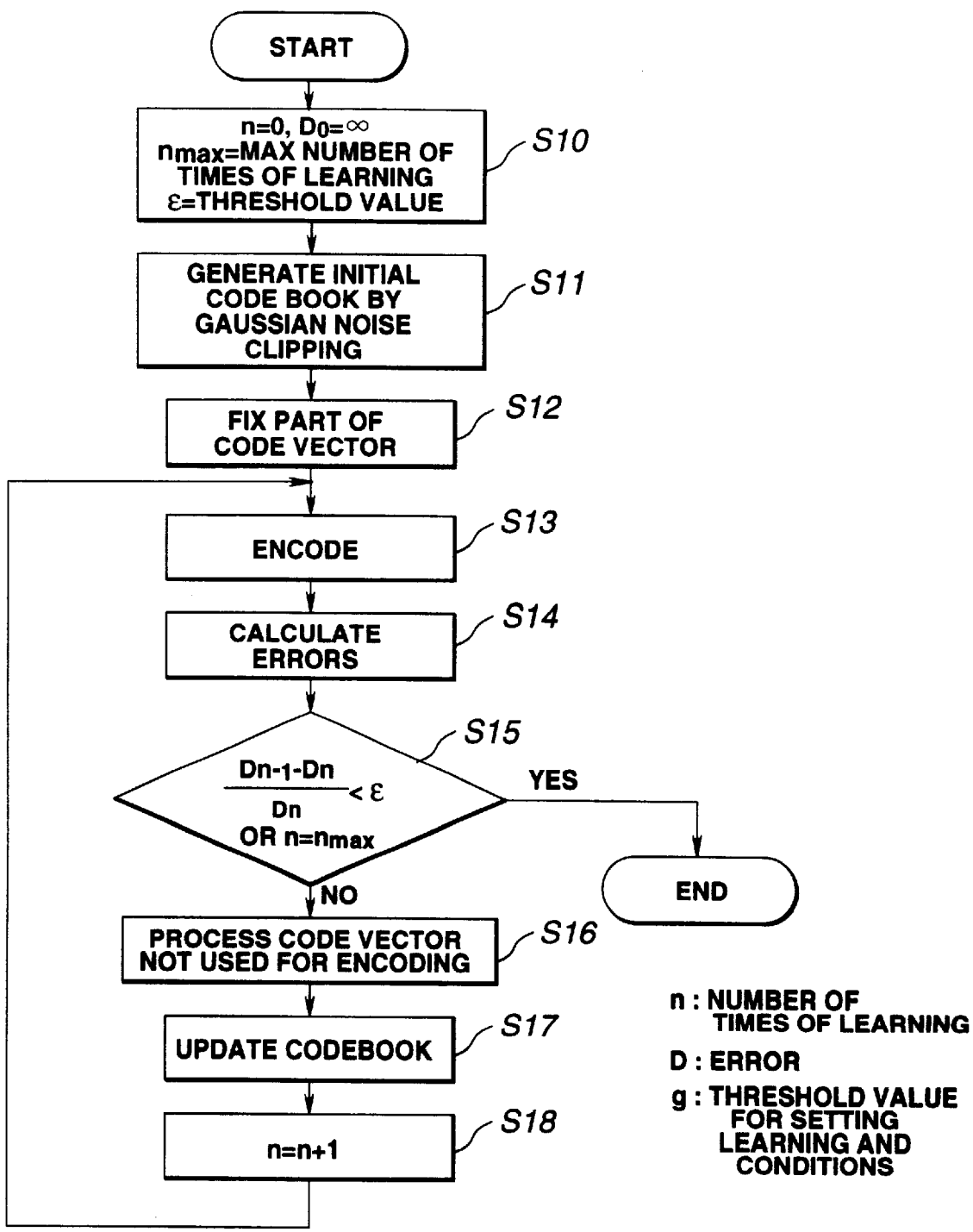
FIG. 21 is a flowchart showing processing flow at the time o generating a shape codebook by learning.

FIG. 21 shows the processing flow for the constitution of the codebook by clipping the Gaussian noise.

In FIG. 21, the number of times of learning n is set to n=0 at step S10 for initialization. With an error $D_0=\infty$, the maximum number of times of learning $n_{max}$ is set and a threshold value $\epsilon$ setting the learning end condition is set.

At the next step S11, the initial codebook by clipping the Gaussian noise is generated. At step S12, part of the code vectors is fixed as non-learning code vectors.

At the next step S13, encoding is done using the above codebook. At step S14, the error is calculated. At step S15, it is judged if $(D_{n-1}-D_n/D_n<\epsilon$, or $n=n_{max}$. If the result is YES, processing is terminated. If the result is NO, processing transfers to step S16.

At step S16, the code vectors not used for encoding are processed. At the next step S17, the code books are updated. At step S18, the number of times of learning n is incremented before retuniing to step S13.

In the speech encoder of FIG. 3, a specified example of a voiced/unvoiced (V/UV) discrimination unit 115 is now explained.

The V/UV discrimination unit 115 performs V/UV discrimination of a frame in subject based on an output of the orthogonal transform circuit 145, an optimum pitch from the high precision pitch search unit 146, spectral amplitude data from the spectral evaluation unit 148, a maximum normalized autocorrelation value r(p) from the open-loop pitch search unit 141 and a zero-crossing count value from the zero-crossing counter 412. The boundary position of the band-based results of V/UV decision, similar to that used for MBE, is also used as one of the conditions for the frame in subject.

The condition for V/UV discrimination for the MBE, employing the results of band-based V/UV discrimination, is now explained.

The parameter or amplitude $|A_m|$ representing the magnitude of the m'th harmonics in the case of MBE may be represented by $$\therefore |A_m| = \sum_{j=a_m}^{b_m} |S(j)||E(j)| \Big/ \sum_{j=a_m}^{b_m} |E(j)|^2$$

In this equation, $|S(j)|$ is a spectrum obtained on DFTing LPC residuals, and $|E(j)|$ is the spectrum of the basic signal, specifically, a 256-point Hamming window, while $a_m, b_m$ are lower and upper limit values, represented by an index j, of the frequency corresponding to the m'th band corresponding in turn to the m'th harmonics. For band-based V/UV discrimination, a noise to signal ratio (NSR) is used. The NSR of the m'th band is represented by $$NSR = \frac{\sum_{j=a_m}^{b_m} (|S(j)| - |A_m||E(j)|)^2}{\sum_{j=a_m}^{b_m} |S(j)|^2}$$

If the NSR value is larger than a re-set threshold, such as 0.3, that is, if an error is larger, it may be judged that approximation of $|S(j)|-|A_m| |E(j)|$ in the band in subject is not good, that is, that the excitation signal $|E(j)|$ is not appropriate as the base. Thus the band in subject is determined to be unvoiced (UV). If otherwise, it may be judged that approximation has been done fairly well and hence is determined to be voiced (V).

It is noted that the NSR of the respective bands (harmonics) represent similarity of the harmonics from one harmonics to another. The sum of gain-weighted harmonics of the NSR is defined as $NSR_{all}$ by:

$$NSR_{all}=(\Sigma_m|A_m|NSR_m)/(\Sigma_m|A_m|)$$

The rule base used for V/UV discrimination is determined depending on whether this spectral siniiarity $NSR_{all}$ is larger or smaller than a certain threshold value. This threshold is herein set to $Th_{NSR}=0.3$. This rule base is concerned with the maximum value of the autocorrelation of the LPC residuals, frame power and the zero-crossing. In the case of the rule base used for $NSR_{all}<Th_{NSR}$, the frame in subject becomes V and UV if the rule is applied and if there is no applicable rule, respectively.

A specified rule is as follows:

For $NSR_{all}<TH_{NSR}$,
if numZero XP<24, frmPow>340 and r0>0.32, then the frame in subject is V;

For $NSR_{all} \geq TH_{NSR}$,
If numZero XP>30, frmpow<900 and r0>0.23, then the frame in subject is UV;
wherein respective variables are defined as follows:
numZeroXP: number of zero-crossings per frame
frmPow: frame power
r0: maximum value of auto-correlation The rule representing a set of specified rules such as those given above are consulted for doing V/UV discrirnination.

The constitution of essential portions and the operation of the speech signal decoder of FIG. 4 will be explained in more detail.

In the inverse vector quantizer 212 of the spectral envelope, an inverse vector quantizer configuration corresponding to the vector quantizer of the speech encoder is used.

For example, if the vector quantization is applied by the configuration shown in FIG. 12, the decoder side reads out the code vectors $s_0$, $s_1$, and the gain g are read from the shape codebooks CB0 and CB1 and the gain codebook $DB_g$ and taken out as the vectors of a fixed dimension of $g(s_0+s_1)$, such as 44-dimension, so as to be converted to variable-dimension vectors corresponding to the number of dimensions of the vector of the original harmonics spectrum (fixed/variable dimension conversion).

If the encoder has the configuration of a vector quantizer of summing the fixed-dimension code vector to the variable-dimension code vector, as shown in FIGS. 14 to 17, the code vector read out from the codebook for variable dimension (codebook CB0 of FIG. 14) is fixed/variable dimension converted and summed to a number of the code vectors for fixed dimension read out from the codebook for fixed dimension (codebook CB1 in FIG. 14) corresponding to the number of dimensions from the low range of the harmonics. The resulting sum is taken out.

The LPC synthesis filter 214 of FIG. 4 is separated into the synthesis filter 236 for the voiced speech (V) and into the synthesis filter 237 for the voiced speech (UV), as previously explained. If LSPs are continuously interpolated every 20 samples, that is every 2.5 msec, without separating the synthesis filter without making V/UV distinction, LSPs of totally different properties are interpolated at V to UV or UV to V transient portions. The result is that LPC of UV and V are used as residuals of V and UV, respectively, such that strange sound tends to be produced. For preventing such ill effects from occurring, the LPC synthesis filter is separated into V and UV and LPC coefficient interpolation is independently performed for V and UV.

The method for coefficient interpolation of the LPC filters 236, 237 in this case is now explained. Specifically, LSP interpolation is switched depending on the V/UV state, as shown in FIG. 22.

Taking an example of the 10-order LPC analysis, the equal interval LSP in FIG. 22 is such LSP corresponding to α-parameters for flat filter characteristics and the gain equal to unity, that is $\alpha_0=1$, $\alpha_1=\alpha_2=\ldots=\alpha_{10}=0$, with $0 \leq \alpha \leq 10$.

Figure 23:
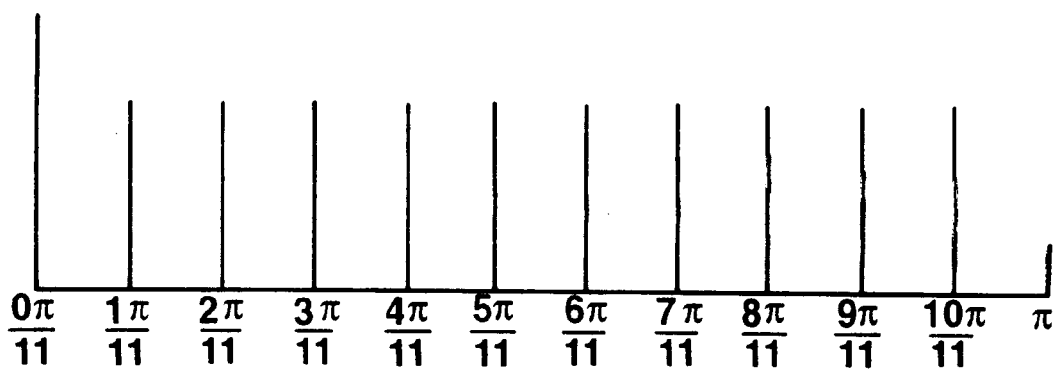
FIG. 23 shows 10-order linear spectral pairs (LSPs) based on the α-parameters obtained by the 10-order LPC analysis.

Such 10-order LPC analysis, that is, 10-order LSP, is the LSP corresponding to a completely flat spectrum, with LSPs being arrayed at equal intervals at 11 equally spaced apart positions between 0 and π, as shown in FIG. 23. In such case, the entire band gain of the synthesis filter has minimum through-characteristics at this time.

Figure 24:
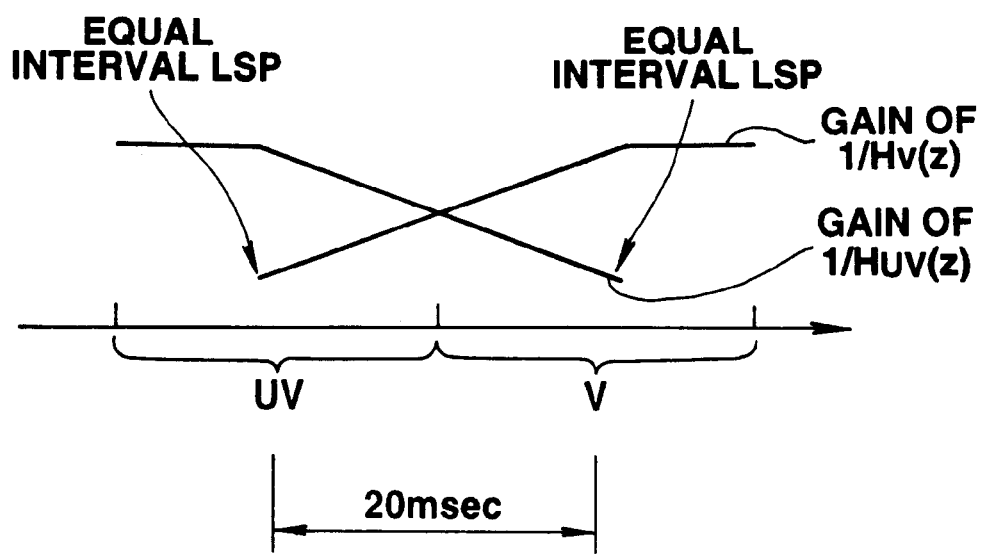
FIG. 24 illustrates the state of gain change from un unvoiced (UV) frame to a voiced (V) frame.

FIG. 24 schematically shows the manner of gain change. Specifically, FIG. 15 shows how the gain of $1/H_{uv(z)}$ and the gain of $1/H_{v(z)}$ are changed during transition from the unvoiced (UV) portion to the voiced (V) portion.

As for the unit of interpolation, it is 2.5 msec (20 samples) for the coefficient of $1/H_{v(z)}$, while it is 10 msec (80 samples) for the bit rates of 2 kbps and 5 msec (40 samples) for the bit rate of 6 kbps, respectively, for the coefficient of $1/H_{uv(z)}$. For UV, since the second encoding unit 120 performs waveform matching employing an analysis by synthesis method, interpolation with the LSPs of the neighboring V portions may be performed without performing interpolation with the equal interval LSPs. It is noted that, in the encoding of the UV portion in the second encoding portion 120, the zero-input response is set to zero by clearing the inner state of the 1/A(z) weighted synthesis filter 122 at the transient portion from V to UV.

Outputs of these LPC synthesis filters 236, 237 are sent to the respective independently provided post-filters 238*u*, 238*v*. The intensity and the frequency response of the post-filters are set to values different for V and UV for setting the intensity and the frequency response of the post-filters to different values for V and UV.

The windowing of junction portions between the V and the UV portions of the LPC residual signals, that is, the excitation as an LPC synthesis filter input, is now explained. This windowing is carried out by the sinusoidal synthesis circuit 215 of the voiced speech synthesis unit 211 and by the windowing circuit 223 of the unvoiced speech synthesis unit 220 shown in FIG. 4. The method for synthesis of the V-portion of the excitation is explained in detail in JP Patent Application No.4-91422, proposed by the present Assignee, while the method for fast synthesis of the V-portion of the excitation is explained in detail in JP Patent Application No.6-198451, similarly proposed by the present Assignee. In the present illustrative embodiment, this method of fast synthesis is used for generating the excitation of the V-portion using this fast synthesis method.

Figure 25:
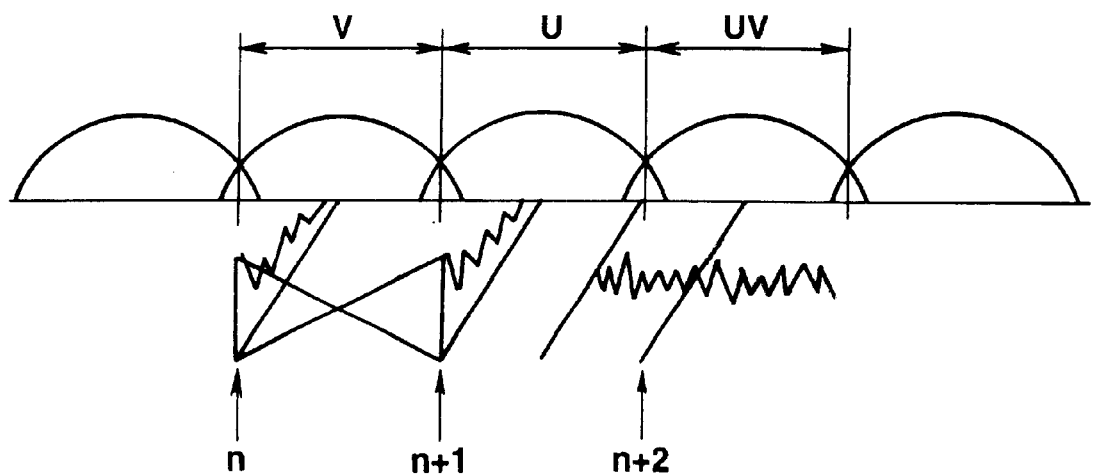
FIG. 25 illustrates the interpolating operation for the waveform or spectra components synthesized from frame to frame.
Figure 26:
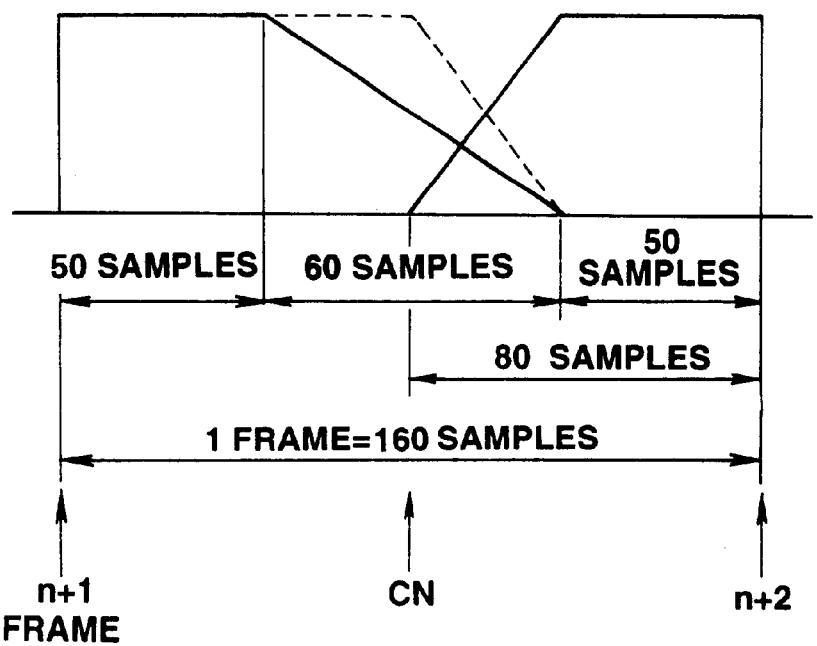
FIG. 26 illustrates an overlapping at a junction portion between the voiced (V) frame and the unvoiced (UV) frame.

In the voiced (V) portion, in which sinusoidal synthesis is performed by interpolation using the spectrum of the neighboring frames, all waveforms between the n'th and (n+1)st frames can be produced, as shown in FIG. 25. However, for the signal portion astride the V and UV portions, such as the (n+1)st frame and the (n+2)nd frame in FIG. 25, or for the portion astride the UV portion and the V portion, the UV portion encodes and decodes only data of±80 samples (a sum total of 160 samples is equal to one frame interval). The result is that windowing is carried out beyond a center point CN between neighboring frames on the V-side, while it is carried out as far as the center point CN on the UV side, for overlapping the junction portions, as shown in FIG. 26. The reverse procedure is used for the UV to V transient portion. The windowing on the V-side may also be as shown by a broken line in FIG. 26.

The noise synthesis and the noise addition at the voiced (V) portion is explained. These operations are performed by the noise synthesis circuit 216, weighted overlap-and-add circuit 217 and by the adder 218 of FIG. 4 by adding to the voiced portion of the LPC residual signal the noise which takes into account the following parameters in connection with the excitation of the voiced portion as the LPC synthesis filter input.

That is, the above parameters may be enumerated by the pitch lag Pch, spectral amplitude Am[i] of the voiced sound, maximum spectral amplitude in a frame Amax and the residual signal level Lev. The pitch lag Pch is the number of samples in a pitch period for a pre-set sampling frequency fs, such as fs=8 kHz, while i in the spectral amplitude Am[i] is an integer such that 0<i<I for the number of harmonics in the band of fs/2 equal to I=Pch/2.

Figure 27:
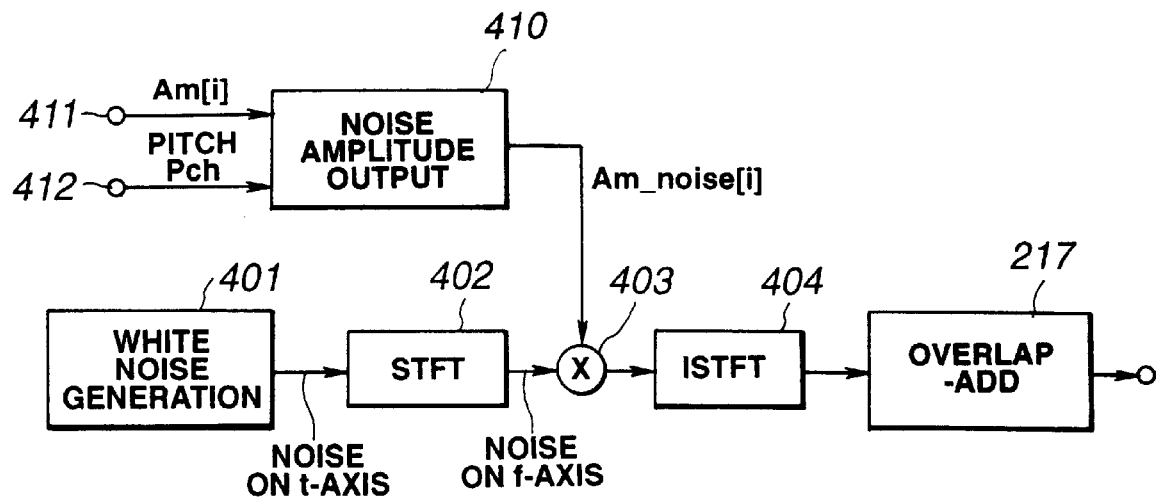
FIG. 27 illustrates noise addition processing at the time of synthesis of voiced speech.

The processing by this noise synthesis circuit 216 is carried out in much the same way as in synthesis of the unvoiced sound by, for example, multi-band encoding (MBE). FIG. 27 illustrates a specified embodiment of the noise synthesis circuit 216.

That is, referring to FIG. 27, a white noise generator 401 outputs the Gaussian noise which is then processed with the short-term Fourier transform (STFT) by an STFT processor 402 to produce a power spectrum of the noise on the frequency axis. The Gaussian noise is the time-domain white noise signal waveform windowed by an appropriate windowing function, such as the Hanning window, having a pre-set length, such as 256 samples. The power spectrum from the STFT processor 402 is sent for amplitude processing to a multiplier 403 so as to be multiplied with an output of the noise amplitude control circuit 410. An output of the amplifier 403 is sent to an inverse STFT (ISTFT) processor 404 where it is ISTFTed using the phase of the original white noise as the phase for conversion into a time-domain signal. An output of the ISTFT processor 404 is sent to a weighted overlap-add circuit 217.

In the embodiment of FIG. 27, the time-domain noise is generated from the white noise generator 401 and processed with orthogonal transform, such as STFT, for producing the frequency-domain noise. Alternatively, the frequency-domain noise may also be generated directly by the noise generator. By directly generating the frequency-domain noise, orthogonal transform processing operations such as for STFT or ISTFT, may be eliminated.

Specifically, a method of generating random numbers in a range of ±x and handling the generated random numbers as real and imaginary parts of the FFT spectrum, or a method of generating positive random numbers ranging from 0 to a maximum number (max) for handling them as the amplitude of the FFT spectrum and generating random numbers ranging $-\pi$ to $+\pi$ and handling these random numbers as the as the phase of the FFT spectrum, may be employed.

This renders it possible to eliminate the STFT processor 402 of FIG. 27 to simplify the structure or to reduce the processing volume.

Figure 28:
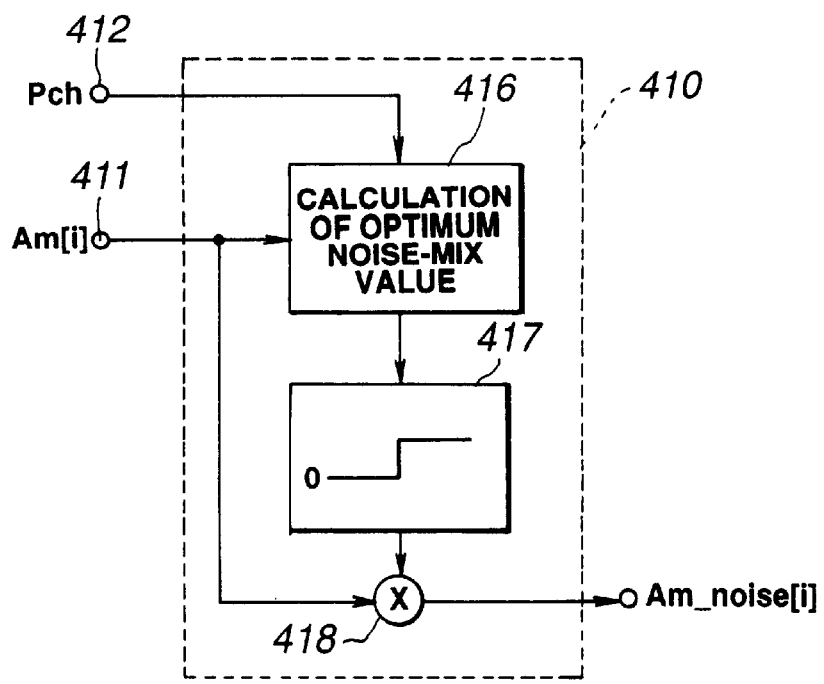
FIG. 28 illustrates an example of amplitude calculation of the noise added at the time of synthesis of voiced speech.

The noise amplitude control circuit 410 has a basic structure shown for example in FIG. 28 and finds the synthesized noise amplitude Am_noise[i] by controlling the multiplication coefficient at the multiplier 403 based on the spectral amplitude Am[i] of the voiced (V) sound supplied via a terminal 411 from the quantizer 212 of the spectral envelope of FIG. 4. That is, in FIG. 28, an output of an optimum noise_mix value calculation circuit 416, to which are entered the spectral amplitude Am[i] and the pitch lag Pch, is weighted by a noise weighting circuit 417, and the resulting output is sent to a multiplier 418 so as to be multiplied with a spectral amplitude Am[i] to produce a noise amplitude Am_noise[i].

As a first specified embodiment for noise synthesis and addition, a case in which the noise amplitude Am_noise[i] becomes a function of two of the above four parameters, namely the pitch lag Pch and the spectral amplitude Am[i], is now explained.

Among these functions $f_1$(Pch, Am[i]) are:

$f_1$(Pch, Am[$i$])=0 where 0<$i$<Noise_b×I), $f_1$(Pch, Am[$i$])=Am[$i$]×noise_mix where Noise_b×I≤$i$≤I, and noise_mix=K×Pch/2.0.

It is noted that the maximum value of noise_max is noise_mix_max at which it is clipped. As an example, K=0.02, noise_mix_max=0.3 and Noise_b=0.7, where Noise b is a constant which determines from which portion of the entire band this noise is to be added. In the present embodiment, the noise is added in a frequency range higher than 70%-position, that is, if fs=8 kHz, the noise is added in a range from 4000×0.7=2800 kHz as far as 4000 kHz.

As a second specified embodiment for noise synthesis and addition, in which the noise amplitude Am_noise[i] is a function $f_2$(Pch, Am[i], Amax) of three of the four parameters, namely the pitch lag Pch, spectral amplitude Am[i] and the maximum spectral amplitude Amax, is explained.

Among these functions $f_2$(Pch, Am[i], Amax) are:

$f_2$(Pch, Am[$i$], Amax)=0, where 0<$i$≤Noise_b×I), $f_1$(Pch, Am[$i$], Amax)=Am[$i$]×noise_mix where Noise_b×I≤$i$≤I, and noise_mix=K×Pch/2.0.

It is noted that the maximum value of noise_mix is noise_mix_max and, as an example, K=0.02, noise_mix_max=0.3 and Noise_b=0.7.

If Am[i]×noise_mix>A max×C×noise_mix, $f_2$(Pch, Am[i], Amax)=Amax×C×noise_mix, where the constant C is set to 0.3 (C=0.3). Since the level can be prohibited by this conditional equation from being excessively large, the above values of K and noise_mix_max can be increased further and the noise level can be increased further if the high-range level is higher.

As a third specified embodiment of the noise synthesis and addition, the above noise amplitude Am_noise[i] may be a function of all of the above four parameters, that is $f_3$(Pch, Am[i], Amax, Lev).

Specific examples of the function $f_3$(Pch, Am[i], Am[max], Lev) are basically similar to those of the above function $f_2$(Pch, Am[i], Amax). The residual signal level Lev is the root mean square (RMS) of the spectral amplitudes Am[i] or the signal level as measured on the time axis. The difference from the second embodiment is that the values of K and noise_mix_max are set so as to be functions of Lev. That is, if Lev is smaller or larger, the values of K, and noise_mix_max are set to larger and smaller values, respectively. Alternatively, the value of Lev may be set so as to be inversely proportionate to the values of K and noise_mix_max.

The post-filters 238$v$, 238$u$ will now be explained.

Figure 29:
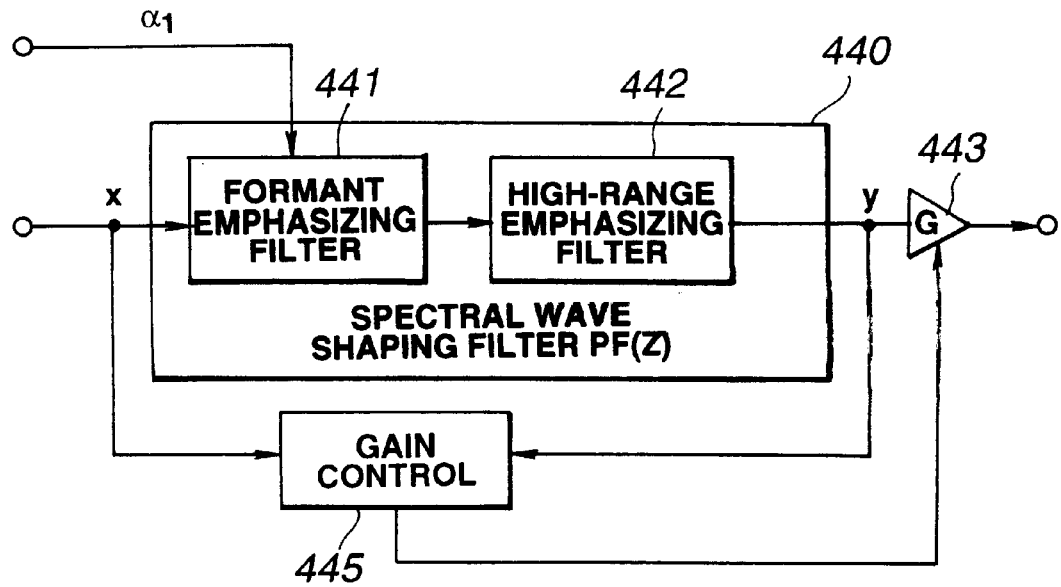
FIG. 29 illustrates an illustrative structure of a post filter.

FIG. 29 shows a post-filter that may be used as post-filters 238$u$, 238$v$ in the embodiment of FIG. 4. A spectrum shaping filter 440, as an essential portion of the post-filter, is made up of a formant emphasizing filter 441 and a high-range emphasizing filter 442. An output of the spectrum shaping filter 440 is sent to a gain adjustment circuit 443 adapted for correcting gain changes caused by spectrum shaping. The gain adjustment circuit 443 has its gain G determined by a gain control circuit 445 by comparing an input x to an output y of the spectrum shaping filter 440 for calculating gain changes used for calculating correction values.

If the coefficients of the denominators Hv(z) and Huv(z) of the LPC synthesis filter, that is ∥-parameters, are expressed as $\alpha_i$, the characteristics PF(z) of the spectrum shaping filter 440 may be expressed by:

$$PF(z) = \frac{\sum_{i=0}^{P} \alpha_i \beta^i z^{-i}}{\sum_{i=0}^{P} \alpha_i \gamma^i z^i} (1 - kz^{-1})$$

The fractional portion of this equation represents characteristics of the formant emphasizing filter, while the portion $(1-kz^{-1})$ represents characteristics of a high-range emphasizing filter. β, γ and k are constants, such that, for example, β=0.6, γ=0.8 and k=0.3.

The gain of the gain adjustment circuit 443 is given by:

$$G = \sqrt{\frac{\sum_{i=0}^{159} x^2(i)}{\sum_{i=0}^{159} y^2(i)}}$$

In the above equation, x(i) and y(i) represent an input and an output of the spectrum shaping filter 440, respectively.

Figure 30:
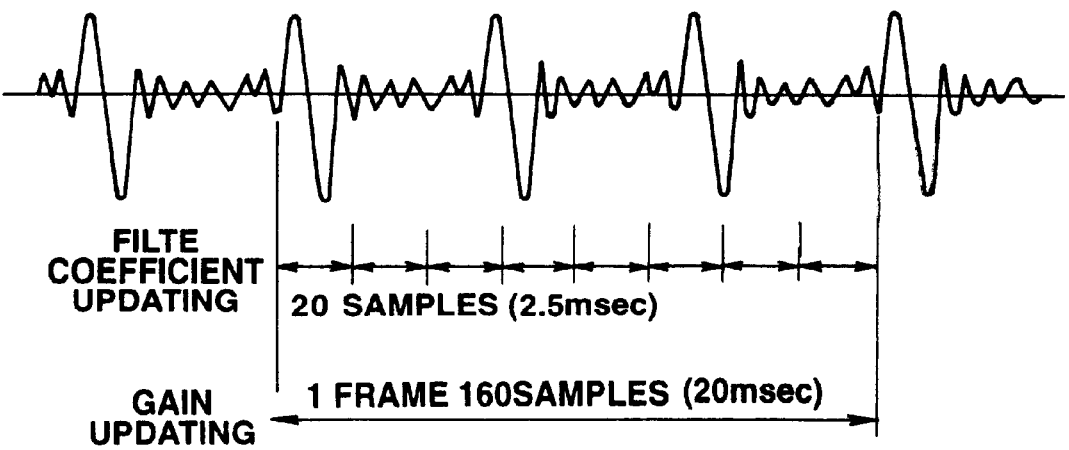
FIG. 30 illustrates the period of updating of the filter coefficients and the gain updating period of a post filter.

It is noted that, as shown in FIG. 30, while the coefficient updating period of the spectrum shaping filter 440 is 20 samples or 2.5 msec as is the updating period for the α-parameter which is the coefficient of the LPC synthesis filter, the updating period of the gain G of the gain adjustment circuit 443 is 160 samples or 20 msec.

By setting the coefficient updating period of the spectrum shaping filter 443 so as to be longer than that of the coefficient of the spectrum shaping filter 440 as the post-filter, it becomes possible to prevent ill effects otherwise caused by gain adjustment fluctuations.

That is, in a generic post filter, the coefficient updating period of the spectrum shaping filter is set so as to be equal to the gain updating period and, if the gain updating period is selected to be 20 samples and 2.5 msec, variations in the gain values are caused even in one pitch period, thus producing the click noise, as shown in FIG. 30. In the present embodiment, by setting the gain switching period so as to be longer, for example, equal to one frame or 160 samples or 20 msec, abrupt gain value changes may be prohibited from occurring. Conversely, if the updating period of the spectrum shaping filter coefficients is 160 samples or 20 msec, no smooth changes in filter characteristics can be produced, thus producing ill effects in the synthesized waveform. However, by setting the filter coefficient updating period to shorter values of 20 samples or 2.5 msec, it becomes possible to realize more effective post-filtering.

By way of gain junction processing between neighboring frames, the filter coefficient and the gain of the previous frame and those of the current frame are multiplied by triangular windows of $$W(i)=i/20 (0 \leq i \leq 20) \text{ and}$$

Figure 31:
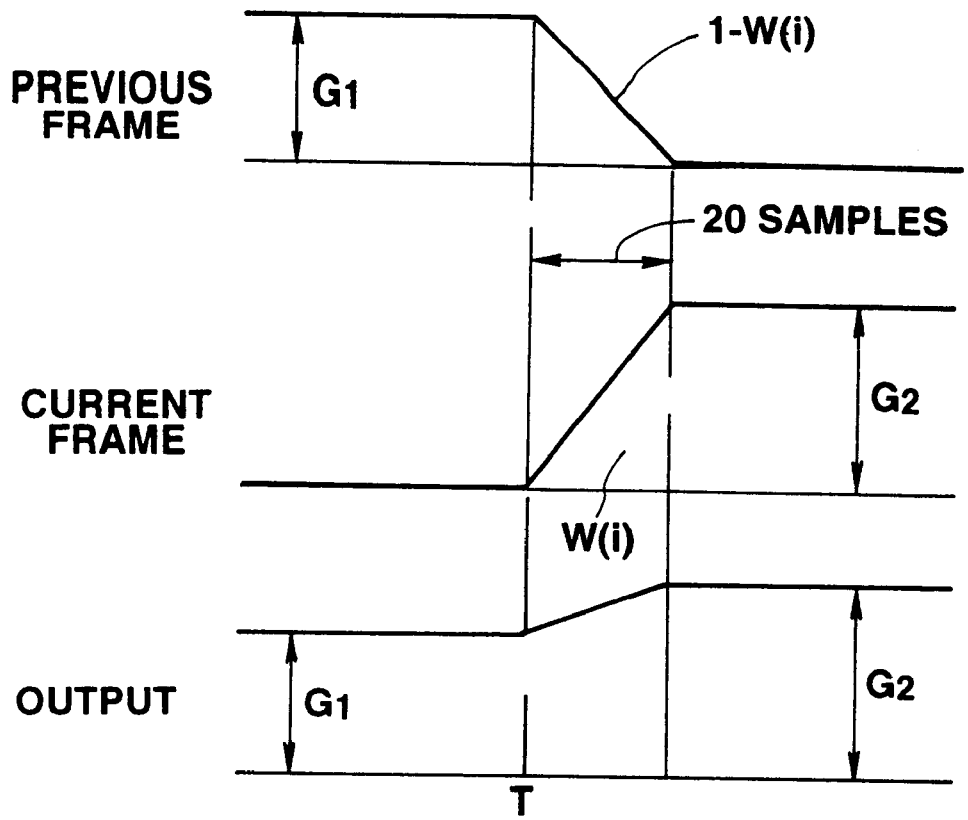
FIG. 31 illustrates the processing for merging at a frame boundary portion of the gain and filter coefficients of the post filter.

$1-W(i)$ where $0 \leq i \leq 20$ for fade-in and fade-out and the resulting products are summned together. FIG. 31 shows how the gain $G_1$ of the previous frame merges to the gain $G_1$ of the current frame. Specifically, the proportion of using the gain and the filter coefficients of the previous frame is decreased gradually, while that of using the gain and the filter coefficients of the current filter is increased gradually. The inner states of the filter for the current frame and that for the previous frame at a time point T of FIG. 31 are started from the same states, that is from the final states of the previous frame.

Figure 32:
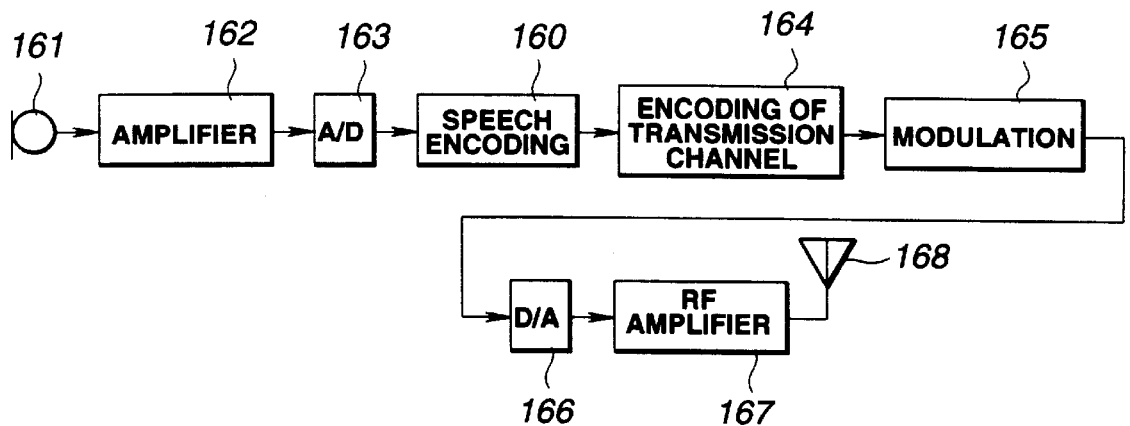
FIG. 32 is a block diagram showing a structure of a transmitting side of a portable terminal employing a speech signal encoding device embodying the present invention.
Figure 33:
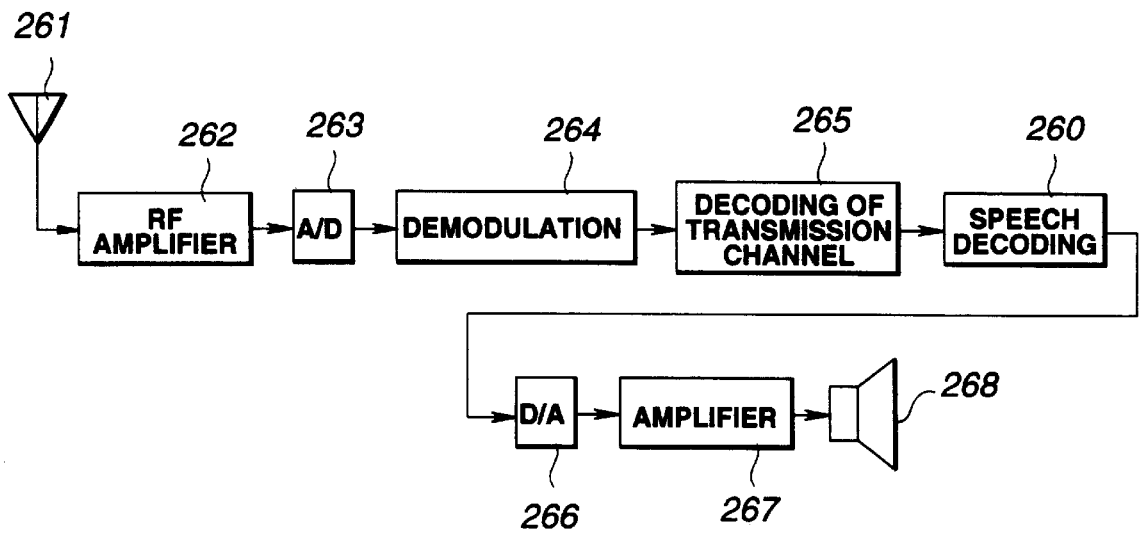
FIG. 33 is a block diagram showing a structure of a receiving side of a portable terminal employing a speech signal decoding device embodying the present invention.

The above-described signal encoding and signal decoding apparatus may be used as a speech codebook employed in, for example, a portable communication terminal or a portable telephone set shown in FIGS. 32 and 33.

FIG. 32 shows a transmitting side of a portable terminal employing a speech encoding unit 160 configured as shown in FIGS. 1 and 3. The speech signals collected by a microphone 161 are amplified by an amplifier 162 and converted by an analog/digital (A/D) converter 163 into digital signals which are sent to the speech encoding unit 160 configured as shown in FIGS. 1 and 3. The digital signals from the A/D converter 163 are supplied to the input terminal 101. The speech encoding unit 160 performs encoding as explained in connection with FIGS. 1 and 3. Output signals of output terminals of FIGS. 1 and 2 are sent as output signals of the speech encoding unit 160 to a transmission channel encoding unit 164 which then performs channel coding on the supplied signals. Output signals of the transmission channel encoding unit 164 are sent to a modulation circuit 165 for modulation and thence supplied to an antenna 168 via a digital/analog (D/A) converter 166 and an RF amplifier 167.

FIG. 33 shows a reception side of the portable terminal employing a speech decoding unit 260 configured as shown in FIGS. 2 and 4. The speech signals received by the antenna 261 of FIG. 33 are amplified in an RF amplifier 262 and sent via an analog/digital (A/D) converter 263 to a demodulation circuit 264, from which demodulated signal are sent to a transmission channel decoding unit 265. An output signal of the decoding unit 265 is supplied to a speech decoding unit 260 configured as shown in FIGS. 2 and 4. The speech decoding unit 260 decodes the signals in a manner as explained in connection with FIGS. 2 and 4. An output signal at an output terminal 201 of FIGS. 2 and 4 is sent as a signal of the speech decoding unit 260 to a digital/analog (D/A) converter 266. An analog speech signal from the D/A converter 266 is sent to a speaker 268.

The present invention is not limited to the above-described embodiments. For example, the construction of the speech analysis side (encoder) of FIGS. 1 and 3 or the speech synthesis side (decoder) of FIGS. 2 and 4, described above as hardware, may be realized by a software program using, for example, a digital signal processor (DSP). The synthesis filters 236, 237 or the post-filters 238v, 238u on the decoding side may be designed as a sole LPC synthesis filter or a sole post-filter without separation into those for the voiced speech or the unvoiced speech. The present invention is also not limited to transmission or recording/reproduction and may be applied to a variety of usages such as pitch conversion, speed conversion, synthesis of the computerized speech or noise suppression.

What is claimed is:

1. A vector quantization method in which an input vector is compared to code vectors stored in a plurality of codebooks for outputting an index of one of the code vectors in each of the codebooks, comprising:

a pre-selecting step for finding a degree of similarity between the input vector and all the code vectors stored in each of the plurality of codebooks and for pre-selecting a plurality of code vectors exhibiting a high degree of similarity from each of the plurality of codebooks in a fixed dimension, wherein the input vector is formed of a parameter on a frequency axis derived from a speech signal; and an ultimate selecting step of further selecting from the pre-selected plurality of code vectors a code vector for each codebook that has a minimum error from the input vector in a variable dimension.

2. The vector quantization method as claimed in claim 1, wherein said degree of similarity is one of:

an inner product of the input vector and said code vector, a weighted inner product of the input vector and said code vector, a value of said inner product divided by a norm of each code vector, a value of said inner product divided by a weighted norm of each code vector, a value of said weighted inner product divided by the norm of each code vector, and a value of said weighted inner product divided by the weighted norm of each code vector.

3. A speech encoding method in which an input speech signal is divided on a time axis in terms of pre-set encoding units and encoded in terms of the pre-set encoding units, comprising the steps of:

finding spectral components of harmonics by sinusoidal analysis of a signal derived from the input speech signal; and vector quantizing parameters derived from encoding unit-based spectral components of the harmonics as an input vector for encoding, wherein said step of vector quantizing includes:

a pre-selecting step for finding a degree of similarity between the input vector and all code vectors stored in each of a plurality of codebooks and for pre-selecting a plurality of code vectors exhibiting a high degree of similarity from each of the plurality of codebooks in a fixed dimension, wherein the input vector is formed of a parameter on a frequency axis derived from the input speech signal; and an ultimate selection step of further selecting from the pre-selected plurality of code vectors selected by said pre-selecting step, a code vector that has a minimum error from the input vector in a variable dimension.

4. The speech encoding method as claimed in claim 3, wherein said degree of similarity is one of:

an inner product of the input vector and said code vector, a weighted inner product of the input vector and said code vector, a value of said inner product divided by a norm of each code vector, a value of said inner product divided by a weighted norm of each code vector, a value of said weighted inner product divided by the norm of each code vector, and a value of said weighted inner product divided by the weighted norm of each code vector.

5. A speech encoding apparatus in which an input speech signal is divided on a time axis in terms of pre-set encoding units and encoded in terms of the pre-set encoding units, comprising:

prediction encoding means for finding short-term prediction residuals of the input speech signal; and sinusoidal analytic encoding means including:

vector quantization means form quantizing a parameter derived from spectral components of harmonics obtained sinusoidal analysis as an input vector, wherein said vector quantization means includes:

pre-selecting means for finding a degree of similarity between the input vector and all code vectors stored in each of a plurality of codebooks and for pre-selecting a plurality of code vectors exhibiting a high degree of similarity from each of the plurality of codebooks in a fixed dimension, and an ultimate selection means for further selecting from the pre-selected plurality of code vectors from each of the plurality to codebooks selected by said preselecting means, a code vector that has a minimum error thereof from the input vector in a variable dimension.

6. The speech encoding apparatus as claimed in claim 5, wherein said degree of similarity is one of:

an inner product of the input vector and said code vector, a weighted inner product of the input vector and said code vector, a value of said inner product divided by a norm of each code vector, a value of said inner product divided by a weighted norm of each code vector, a value of said weighted inner product divided by the norm of each code vector, and a value of said weighted inner product divided by the weighted norm of each code vector.

7. The speech encoding apparatus as claimed in claim 6, wherein as a weight of the norm, one of an inner product of the input vector and said code vector, and a weighted inner product of the input vector and said code vector, divided by one of the norm and the weighted norm of each code vector, is used.

* * * * *